United States Patent
Suka et al.

(10) Patent No.: US 9,086,628 B2
(45) Date of Patent: Jul. 21, 2015

(54) RESIST PROTECTIVE FILM-FORMING COMPOSITION AND PATTERNING PROCESS

(75) Inventors: Yuuki Suka, Joetsu (JP); Koji Hasegawa, Joetsu (JP); Yuji Harada, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 48 days.

(21) Appl. No.: 13/599,669

(22) Filed: Aug. 30, 2012

(65) Prior Publication Data
US 2013/0084517 A1 Apr. 4, 2013

(30) Foreign Application Priority Data

Oct. 4, 2011 (JP) ................................. 2011-219950

(51) Int. Cl.
*G03F 7/004* (2006.01)
*G03F 7/11* (2006.01)
*C08K 5/04* (2006.01)
*G03F 7/20* (2006.01)

(52) U.S. Cl.
CPC ... *G03F 7/11* (2013.01); *C08K 5/04* (2013.01); *G03F 7/0046* (2013.01); *G03F 7/2041* (2013.01)

(58) Field of Classification Search
None
See application file for complete search history.

(56) References Cited

U.S. PATENT DOCUMENTS

| | | | |
|---|---|---|---|
| 6,312,867 | B1 | 11/2001 | Kinsho et al. |
| 7,244,545 | B2 | 7/2007 | Takebe et al. |
| 7,531,287 | B2 | 5/2009 | Kanda et al. |
| 7,531,289 | B2 | 5/2009 | Kinsho et al. |
| 7,537,880 | B2 | 5/2009 | Harada et al. |
| 7,678,530 | B2 | 3/2010 | Hasegawa et al. |
| 7,759,440 | B2 | 7/2010 | Miyazawa et al. |
| 7,868,199 | B2 | 1/2011 | Hasegawa et al. |
| 7,968,268 | B2 | 6/2011 | Wang |
| 7,981,589 | B2 | 7/2011 | Hasegawa et al. |
| 2007/0275326 | A1* | 11/2007 | Hatakeyama et al. ..... 430/270.1 |
| 2007/0298355 | A1* | 12/2007 | Harada et al. ............. 430/396 |
| 2010/0112482 | A1* | 5/2010 | Watanabe et al. .......... 430/286.1 |
| 2010/0136486 | A1* | 6/2010 | Harada et al. ............. 430/296 |
| 2011/0151381 | A1 | 6/2011 | Hasegawa et al. |
| 2012/0077121 | A1* | 3/2012 | Hasegawa et al. ......... 430/270.1 |
| 2012/0148945 | A1* | 6/2012 | Hasegawa et al. ........ 430/5 |
| 2013/0034813 | A1* | 2/2013 | Ohsawa et al. ........... 430/281.1 |

FOREIGN PATENT DOCUMENTS

| | | |
|---|---|---|
| JP | 4-083399 A | 3/1992 |
| JP | 2000-336121 A | 12/2000 |
| JP | 2006-048029 A | 2/2006 |
| JP | 2006-152255 A | 6/2006 |
| JP | 2006-309245 A | 11/2006 |
| JP | 2007-182488 A | 7/2007 |
| JP | 2007-204385 A | 8/2007 |
| JP | 2007-284381 A | 11/2007 |
| JP | 2008-111103 A | 5/2008 |
| JP | 2009-029974 A | 2/2009 |
| JP | 2010-106138 A | 5/2010 |
| JP | 2011-132273 A | 7/2011 |
| JP | 2012-092086 A | 5/2012 |
| WO | 2005/042453 A1 | 5/2005 |

OTHER PUBLICATIONS

Owa S. et al, "Immersion lithography; its potential performance and issues", Proc. SPIE vol. 5040, pp. 724-733, Nikon Corporation, Saitama, Japan 360-8559, (2003).

Hirayama, T., "Resist and Cover Material Investigation for Immersion Lithography", 2nd Immersion Workshop, 8 pages, Tokyo Ohka Kogyo Co., Ltd., Jul. 11, 2003.

Ito, H. et al., "Aliphatic platforms for the design of 157 nm chemically amplified resists", Proc. SPIE vol. 4690, pp. 18-28, Kanagawa-ken, 221-8755, Japan, (2002).

Shirota, N. et al., "Development of non-topcoat resist polymers for 193-nm immersion lithography", Proc. of SPIE vol. 6519, pp. 651905-1-651905-11, Kanagawa-ken, 221-8755, Japan, (2007).

* cited by examiner

*Primary Examiner* — Anca Eoff
*Assistant Examiner* — Alyssa L Cepluch
(74) *Attorney, Agent, or Firm* — Westerman, Hattori, Daniels & Adrian, LLP

(57) ABSTRACT

A protective film-forming composition comprising a polymer comprising fluorinated alcohol units of the structure: —$C(CF_3)_2OR^1$ wherein $R^1$ is H or a monovalent hydrocarbon group and having a Mw of 1,000-500,000 is applied onto a resist film to form a protective film thereon. The protective film-forming composition has high water repellent and water slip performance. The protective film exhibits barrier properties to water and prevents any resist components from being leached out in water.

17 Claims, No Drawings

RESIST PROTECTIVE FILM-FORMING COMPOSITION AND PATTERNING PROCESS

CROSS-REFERENCE TO RELATED APPLICATION

This non-provisional application claims priority under 35U.S.C. §119(a) on Patent Application No. 2011-219950 filed in Japan on Oct. 4, 2011, the entire contents of which are hereby incorporated by reference.

TECHNICAL FIELD

This invention generally relates to a photolithography process for the microfabrication of semiconductor devices, and particularly to an immersion photolithography process involving directing ArF excimer laser radiation of 193 nm wavelength from a projection lens toward a substrate, with a liquid (e.g., water) intervening between the lens and the substrate. More particularly, it relates to a resist protective film-forming composition for forming a protective film on a resist film, and a process for forming a pattern using the same.

BACKGROUND ART

In the recent drive for higher integration and operating speeds in LSI devices, the pattern rule is made drastically finer. The background supporting such a rapid advance is a reduction of wavelength of the light source for exposure. A change-over took place from i-line (365 nm) of a mercury lamp to shorter wavelength KrF excimer laser (248 nm) and then to ArF excimer laser (193 nm). With the ArF excimer laser lithography, efforts are made to enable the fabrication of 65-nm node devices. The current research is made on the ArF immersion lithography in which ArF excimer laser is irradiated through water held between the projection lens and the wafer. A combination of a lens having NA of at least 1.2 with ultra-high resolution technology suggests a way to the 45-nm node (see Proc. SPIE, Vol. 5040, p 724, 2003).

The ArF immersion lithography has a possibility that water-soluble components in the resist film be leached in immersion water during exposure. As a result, the pattern may change its shape or even collapse (known as pattern collapse). It is also pointed out that water droplets remaining on the resist film after scanning, though in a minute volume, can induce defects. It was then proposed to provide a protective film on the resist film to prevent resist components from being leached out and water from causing to form defects, the process being referred to as "topcoat process." See 2nd Immersion Workshop: Resist and Cover Material Investigation for Immersion Lithography, 2003.

In the ArF immersion lithography using a topcoat, a protective coating material which is soluble in alkaline developer offers great cost and process merits because the protective film can be removed at the same time as development. Thus, great efforts have been devoted to develop water-insoluble resist protective coating materials based on alkali-soluble resins. See WO 2005/42453.

On the other hand, a process for preventing resist components from being leached out in water without a need for a protective coating material has also been developed, the process being referred to as "topcoatless process". See JP-A 2006-48029 and JP-A 2006-309245. In the topcoatless process, an alkali-soluble hydrophobic polymer is added to the resist material as a surfactant, whereupon the hydrophobic compound is segregated at the resist surface during resist film formation. The process is thus expected to achieve equivalent effects to the use of topcoat. Additionally, the topcoatless process is economically advantageous because steps of forming and removing the protective film are unnecessary.

In either of the topcoat and topcoatless processes, the ArF immersion lithography requires a scanning speed of about 300 to 700 mm/sec in order to gain higher throughputs. Recent efforts are made to further increase the scanning speed. In the event of such high-speed scanning, if the water repellency of the resist or protective film is insufficient, water droplets may be left on the film surface after scanning. Residual droplets may cause defects. To obviate such defects, it is necessary to improve the water repellency and water slip (in terms of receding contact angle) of the relevant coating film.

One known means for improving the water repellency and water slip of a resin is by introducing fluorine atoms into the polymer skeleton. For example, a copolymer of α-trifluoromethyl acrylate and norbornene derivative (Proc. SPIE Vol. 4690, p 18, 2002) and a fluorinated cyclic polymerization polymer having a fluorinated alcohol unit on side chain (Proc. SPIE Vol. 6519, p 651905 (2007)) exhibit good properties of water repellency and water slip. The latter polymer is further improved in water slip by protecting the fluorinated alcohol with acid labile groups.

Although the introduction of fluorine into the polymer skeleton brings remarkable improvements in water repellency and water slip, the introduction of extra fluorine can induce new defects known as "blob defects". Blob defects are likely to form during spin drying after development, particularly when the film has a high surface contact angle after development. One approach for obviating blob defects is by introducing highly hydrophilic substituent groups (e.g., carboxyl or sulfo groups) into a resin to reduce the surface contact angle after development. However, since these groups serve to noticeably reduce the water repellency and water slip of the resin, this approach is not compatible with high-speed scanning. There is a desire to have a material which can minimize blob defects while maintaining highly water repellent and water slip properties during immersion lithography.

The highly water repellent/water slippery materials discussed above are expected to be applied not only to the ArF immersion lithography, but also to the resist material for mask blanks. Resist materials for mask blanks are subject to long-term exposure in vacuum. It is pointed out that sensitivity variations or profile changes can occur as an amine component in the resist material is adsorbed to the resist film surface during the long-term exposure. It was then proposed to lay a protective film on a resist film for preventing adsorption of amine to the resist film.

CITATION LIST

Patent Document 1: WO 2005/42453

Patent Document 2: JP-A 2006-048029

Patent Document 3: JP-A 2006-309245

Non-Patent Document 1: Proc. SPIE Vol. 5040, p 724 (2003)

Non-Patent Document 2: 2nd Immersion Workshop: Resist and Cover Material Investigation for Immersion Lithography (2003)

Non-Patent Document 3: Proc. SPIE Vol. 4690, p 18 (2002)

Non-Patent Document 4: Proc. SPIE Vol. 6519, p 651905 (2007)

SUMMARY OF INVENTION

An object of the invention is to provide a resist protective film-forming composition which exhibits water repellency and water slip and allows a resist pattern of good profile to be formed with minimal development defects, especially suited in the immersion lithography, and a pattern forming process using the composition. The polymer used in the protective film-forming composition is highly transparent to radiation with wavelength of up to 200 nm. Various properties of the polymer including water repellency, water slip, fat solubility, acid lability, and hydrolysis may be adjusted by a choice of polymer structure. The polymer can be prepared from reactants which are readily available and easy to handle.

The inventors have found that when a polymer having a fluorinated alcohol of specific structure, specifically a partial structure $—C(CF_3)_2OR^1$ (wherein $R^1$ is defined below), that is, recurring units of formula (1) is used to formulate a resist protective film-forming composition, the composition forms a film which has sufficient water repellency and water slip. Further a resist protective film-forming composition comprising a polymer having the recurring units of formula (1) combined with recurring units of formulae (2a) to (2m) allows a resist pattern of good profile to be formed with minimal development defects.

Accordingly, the present invention provides a resist protective film-forming composition and a pattern forming process, as defined below.

[1] A resist protective film-forming composition comprising a polymer comprising recurring units of the general formula (1) and having a weight average molecular weight of 1,000 to 500,000.

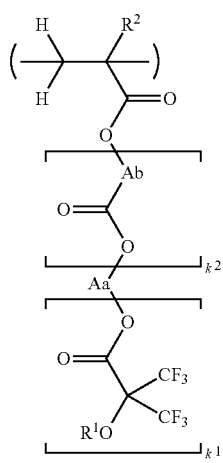

(1)

Herein $R^1$ is hydrogen or a straight, branched or cyclic $C_1$-$C_{20}$ monovalent hydrocarbon group in which a constituent moiety $—CH_2—$ may be replaced by $—O—$ or $—C(=O)—$, $R^2$ is hydrogen, fluorine, methyl or trifluoromethyl, Aa is a straight, branched or cyclic $C_1$-$C_{20}$ hydrocarbon or fluorinated hydrocarbon group having a valence of $k^1+1$, Ab is a straight, branched or cyclic $C_1$-$C_6$ divalent hydrocarbon group, $k^1$ is an integer of 1 to 3, and $k^2$ is 0 or 1.

[2] The composition of [1] wherein the polymer comprises recurring units of formula (1) and recurring units of one or more type selected from the general formulae (2a) to (2m).

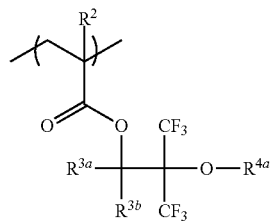

(2a)

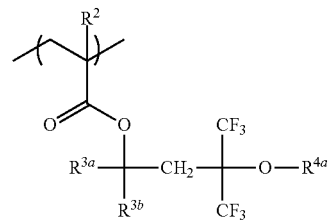

(2b)

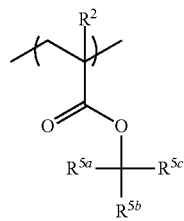

(2c)

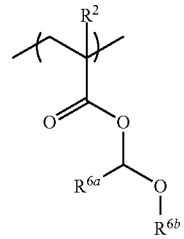

(2d)

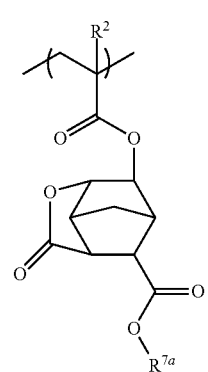

(2e)

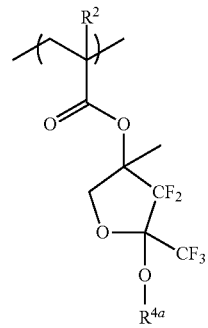

(2f)

(2g)
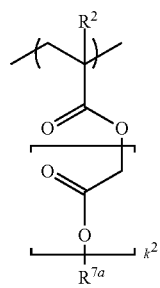

(2h)
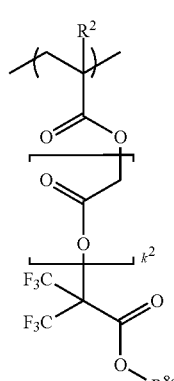

(2i)
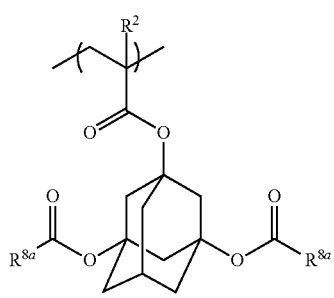

(2j)
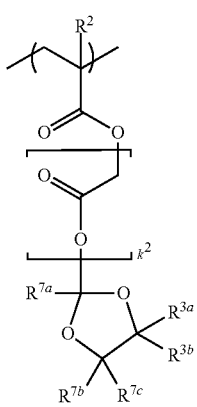

(2k)
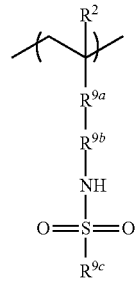

(2l)
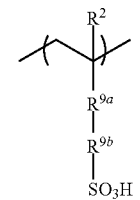

(2m)
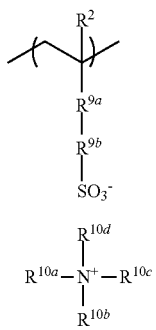

Herein $R^2$ is as defined above, $R^{3a}$ and $R^{3b}$ are each independently hydrogen or a straight, branched or cyclic $C_1$-$C_{15}$ monovalent hydrocarbon group, $R^{3a}$ and $R^{3b}$ may bond together to form a non-aromatic ring of 3 to 8 carbon atoms with the carbon atom to which they are attached, $R^{4a}$ is hydrogen, a straight, branched or cyclic $C_1$-$C_{15}$ monovalent hydrocarbon or fluorinated hydrocarbon group, or an acid labile group, in the case of hydrocarbon group, a constituent moiety —$CH_2$— may be replaced by —O— or —C(=O)—, $R^{5a}$, $R^{5b}$ and $R^{5c}$ are each independently hydrogen, or a straight, branched or cyclic $C_1$-$C_{15}$ monovalent hydrocarbon or fluorinated hydrocarbon group, $R^{5a}$ and $R^{5b}$, $R^{5a}$ and $R^{5c}$, or $R^{5b}$ and $R^{5c}$ may bond together to form a non-aromatic ring of 3 to 8 carbon atoms with the carbon atom to which they are attached, $R^{6a}$ is hydrogen, or a straight, branched or cyclic $C_1$-$C_{15}$ monovalent hydrocarbon group, $R^{6b}$ is a straight, branched or cyclic $C_1$-$C_{15}$ monovalent hydrocarbon group, $R^{6a}$ and $R^{6b}$ may bond together to form a non-aromatic ring of 3 to 8 carbon atoms with the carbon atom to which they are attached, $R^{7a}$, $R^{7b}$ and $R^{7c}$ are each independently a straight, branched or cyclic $C_1$-$C_{15}$ monovalent fluorinated hydrocarbon group, $R^{8a}$ is a straight, branched or cyclic $C_1$-$C_{15}$ monovalent hydrocarbon or fluorinated hydrocarbon group, $R^{9a}$ is a single bond, a straight, branched or cyclic $C_1$-$C_{15}$ alkylene group, —C(=O)—O— or —C(=O)—NH—, $R^{9b}$ is a single bond or a straight, branched or cyclic $C_1$-$C_{15}$ alkylene group, $R^{9c}$ is a straight, branched or cyclic $C_1$-$C_{15}$ monovalent fluorinated hydrocarbon group, $R^{10a}$ to $R^{10d}$ are each independently hydrogen, a straight, branched or cyclic $C_1$-$C_{12}$ alkyl, alkenyl, oxoalkyl or oxoalkenyl group, $C_6$-$C_{20}$ aryl group, or $C_7$-$C_{12}$ aralkyl or aryloxoalkyl group, in which groups some or all hydrogen atoms may be substituted by alkoxy radicals, or which group may contain a nitrogen atom, ether, ester, hydroxyl or carboxyl radical, $R^{10a}$ and $R^{10b}$, or $R^{10a}$, $R^{10b}$ and $R^{10c}$ may bond together to form a $C_5$-$C_{10}$ ring with the nitrogen atom to which they are attached, and $R^{10a}$ and $R^{10b}$, or $R^{10a}$, $R^{10b}$ and $R^{10c}$ each are an alkylene group when they form a ring with the nitrogen atom, and $k^2$ is 0 or 1.

[3] The composition of [1] or [2], further comprising a solvent.

[4] The composition of any one of [1] to [3] wherein the solvent comprises an ether compound of 8 to 12 carbon atoms.

[5] The composition of any one of [1] to [4] wherein the solvent comprises an ether compound selected from among di-n-butyl ether, di-sec-butyl ether, di-tert-butyl ether, diisobutyl ether, di-n-pentyl ether, di-sec-pentyl ether, diisopentyl ether, and di-n-hexyl ether and mixtures thereof.

[6] The composition of [5] wherein the solvent is a mixture of the ether compound and an alcohol compound,
the alcohol compound being selected from among 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, and cyclohexanol and mixtures thereof.

[7] A pattern forming process comprising the steps of (1) applying a resist composition onto a substrate to form a resist film, (2) forming a protective film on the resist film using the protective film-forming composition of any one of [1] to [6], (3) heat treating and exposing the coated substrate to high-energy radiation through a photomask, and (4) developing in a developer.

[8] A pattern forming process comprising the steps of (1) applying a resist composition onto a substrate to form a resist film, (2) forming a protective film on the resist film using the protective film-forming composition of any one of [1] to [6], (3) heat treating and exposing the coated substrate to high-energy radiation from a projection lens through a photomask while holding a liquid between the substrate and the projection lens, and (4) developing in a developer.

[9] The process of [8] wherein the liquid is water.

[10] The process of any one of [7] to [9] wherein the high-energy radiation has a wavelength in the range of 180 to 250 nm.

[11] The process of any one of [7] to [10] wherein the developing step (4) includes developing in an alkaline developer to form a resist pattern in the resist film and to remove the protective film on the resist film.

[12] A lithography process for forming a pattern, comprising the steps of forming a protective film on a photoresist layer disposed on a mask blank using the protective film-forming composition of any one of [1] to [6], exposing the layer structure in vacuum to electron beam, and developing.

Advantageous Effects of Invention

A polymer comprising recurring units of a fluorinated alcohol of specific structure, specifically a partial structure —$C(CF_3)_2OR^1$ is used to formulate a resist protective film-forming composition, which is highly transparent to radiation with wavelength of up to 200 nm. Various properties of the polymer including water repellency, water slip, fat solubility, acid lability, and hydrolysis may be adjusted by a choice of polymer structure. The polymer can be prepared from reactants which are readily available and easy to handle. The resist protective film-forming composition has a greater receding contact angle enough to inhibit leaching-out of resist components and allows the immersion lithography to be conducted in a satisfactory manner to form a resist pattern of good profile with few development defects.

DESCRIPTION OF PREFERRED EMBODIMENTS

The singular forms "a", "an" and "the" include plural referents unless the context clearly dictates otherwise. The notation (Cn-Cm) means a group containing from n to m carbon atoms per group. The abbreviation PAG stands for photoacid generator, PEB for post-exposure bake, EB for electron beam, and EUV for extreme ultraviolet.

Polymer

The polymer or high-molecular-weight compound used in the resist protective film-forming composition is characterized by comprising recurring units of the general formula (1).

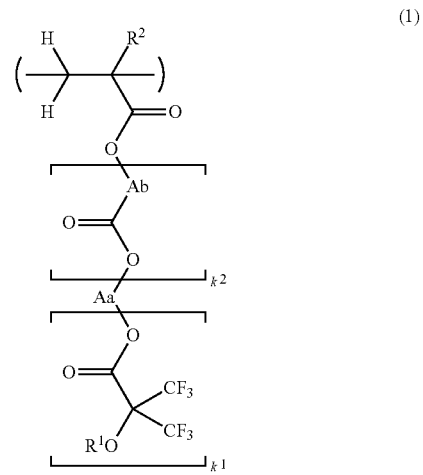

Herein $R^1$ is hydrogen or a straight, branched or cyclic $C_1$-$C_{20}$ monovalent hydrocarbon group in which a constituent moiety —$CH_2$— may be replaced by —O— or —C(=O)—, $R^2$ is hydrogen, fluorine, methyl or trifluoromethyl, Aa is a straight, branched or cyclic $C_1$-$C_{20}$ hydrocarbon or fluorinated hydrocarbon group having a valence of $k^1$+1, Ab is a straight, branched or cyclic $C_1$-$C_6$ divalent hydrocarbon group, $k^1$ is an integer of 1 to 3, and $k^2$ is 0 or 1.

In formula (1), the monovalent hydrocarbon groups represented by $R^1$ include groups for protecting an alcoholic hydroxyl group, specifically groups having the general formula (R1-1) and (R1-2), tertiary alkyl groups of 4 to 15 carbon atoms, trialkylsilyl groups in which each alkyl moiety has 1 to 5 carbon atoms, oxoalkyl groups of 4 to 15 carbon atoms, and acyl groups of 1 to 10 carbon atoms.

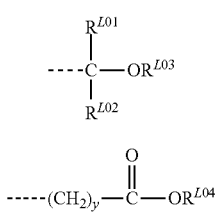

(R1-1)

(R1-2)

Herein and throughout the specification, the broken line designates a valence bond. $R^{L01}$ and $R^{L02}$ are each independently hydrogen or a straight, branched or cyclic alkyl group of 1 to 18 carbon atoms, preferably 1 to 10 carbon atoms. Examples include methyl, ethyl, propyl, isopropyl, n-butyl, sec-butyl, tert-butyl, cyclopentyl, cyclohexyl, 2-ethylhexyl, n-octyl, norbornyl, tricyclodecanyl, tetracyclododecanyl, and adamantyl. $R^{L03}$ is a monovalent hydrocarbon group of 1 to 18 carbon atoms, preferably 1 to 10 carbon atoms, which may contain a heteroatom such as oxygen, examples of which include straight, branched or cyclic alkyl groups and substituted forms of such alkyl groups in which some hydrogen atoms are replaced by hydroxyl, alkoxy, oxo, amino, alkylamino or the like. Examples of the substituted alkyl groups are as shown below.

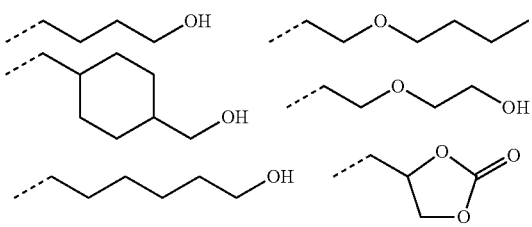

A pair of $R^{L01}$ and $R^{L02}$, $R^{L01}$ and $R^{L03}$, or $R^{L02}$ and $R^{L03}$ may bond together to form a ring with carbon and oxygen atoms to which they are attached. Each of ring-forming $R^{L01}$, $R^{L02}$ and $R^{L03}$ is a straight or branched alkylene group of 1 to 18 carbon atoms, preferably 1 to 10 carbon atoms when they form a ring.

In formula (R1-2), $R^{L04}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (R1-1). The subscript y is an integer of 0 to 6.

Suitable groups of $R^1$ and $R^{L04}$ are illustrated below. Exemplary tertiary alkyl groups include tert-butyl, tert-amyl, 1,1-diethylpropyl, 2-cyclopentylpropan-2-yl, 2-cyclohexylpropan-2-yl, 2-(bicyclo[2.2.1]heptan-2-yl)propan-2-yl, 2-(adamantan-1-yl)propan-2-yl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2-adamantyl, 2-ethyl-2-adamantyl, and the like. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl. Examples of the acyl group include formyl, acetyl, ethylcarbonyl, pivaloyl, methoxycarbonyl, ethoxycarbonyl, tert-butoxycarbonyl, trifluoroacetyl, and trichloroacetyl.

Of the protective groups of formula (R1-1), the straight or branched groups are exemplified by the following.

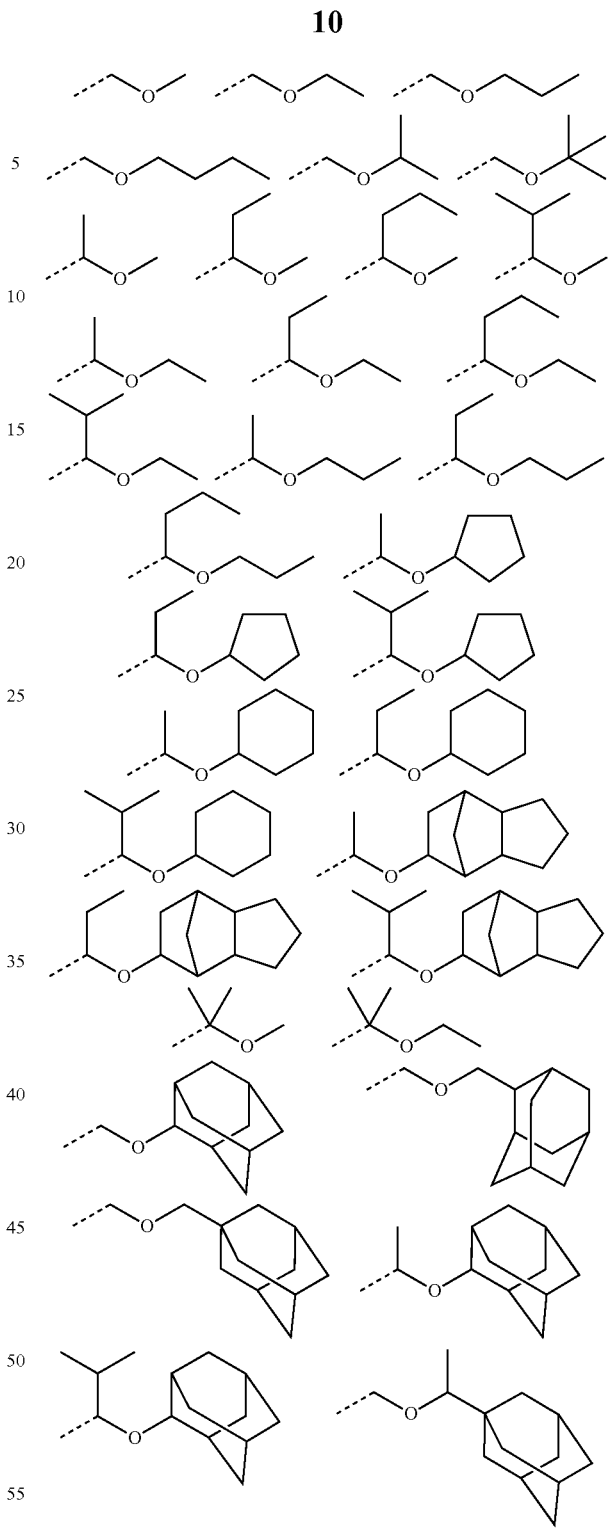

Of the protective groups of formula (R1-1), the cyclic ones are, for example, tetrahydrofuran-2-yl, 2-methyltetrahydrofuran-2-yl, tetrahydropyran-2-yl, and 2-methyltetrahydropyran-2-yl.

Examples of the protective groups of formula (R1-2) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl.

Referring back to formula (1), Aa is a straight, branched or cyclic $C_1$-$C_{20}$ hydrocarbon or fluorinated hydrocarbon group having a valence of $k^1+1$. Examples of the $C_1$-$C_{20}$ hydrocarbon group are shown below.

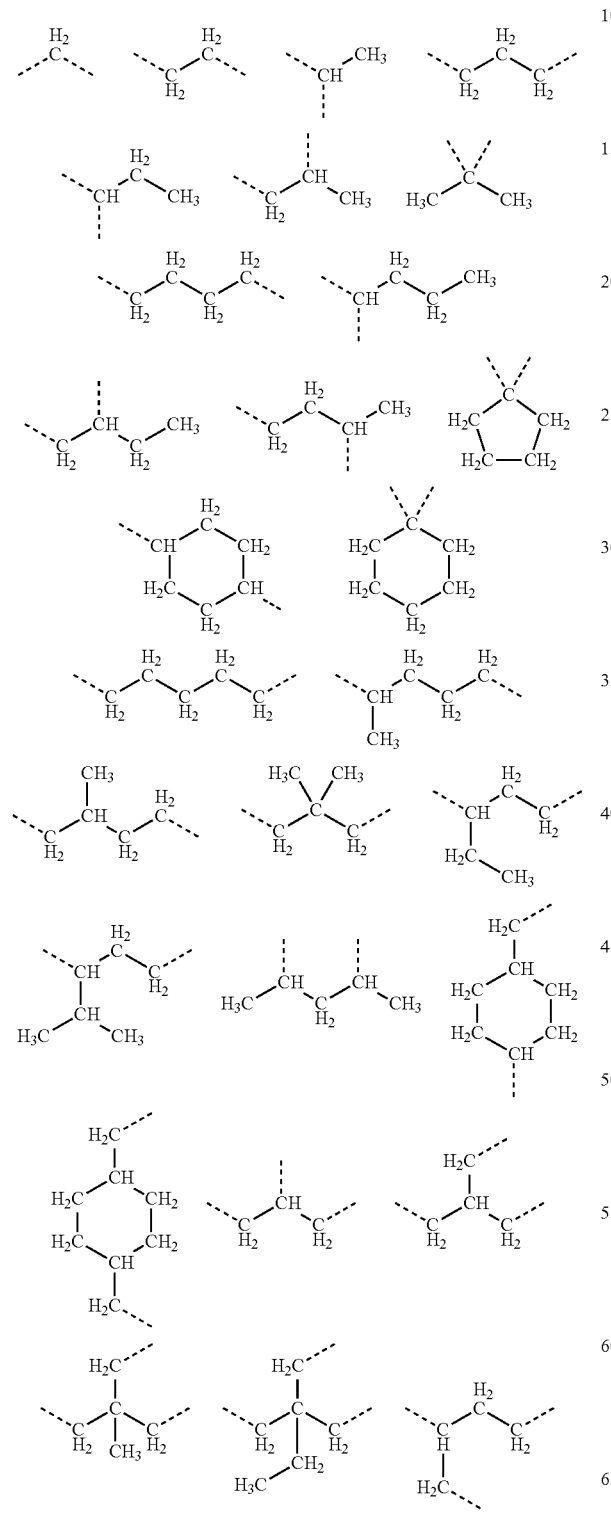

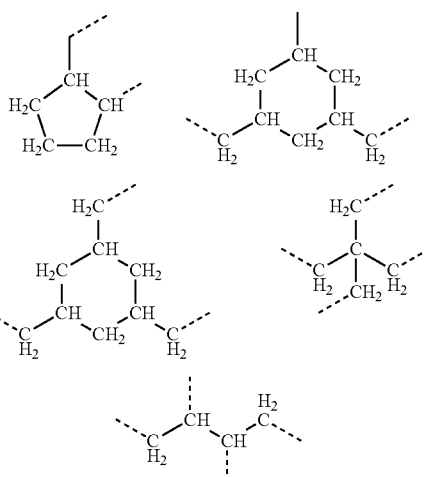

Examples of the $C_1$-$C_{20}$ fluorinated hydrocarbon group include fluorinated forms of the foregoing in which some or all hydrogen atoms are replaced by fluorine atoms.

Ab is a straight, branched or cyclic $C_1$-$C_6$ divalent hydrocarbon group, typically alkylene, examples of which are shown below.

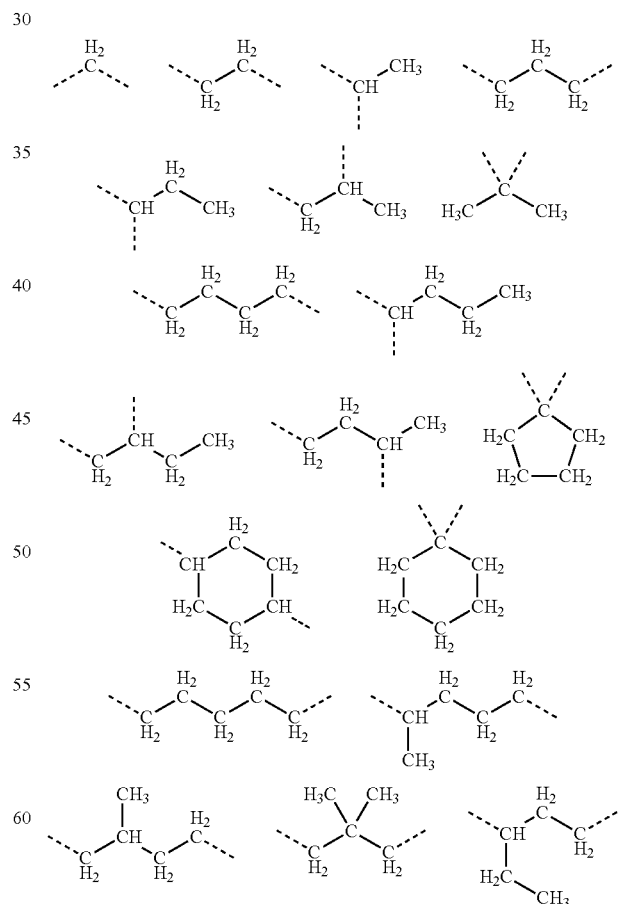

Illustrative, non-limiting examples of the recurring units having formula (1) are shown below.

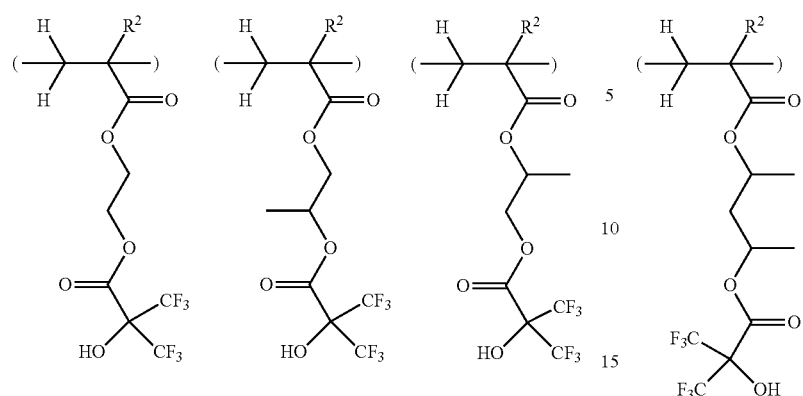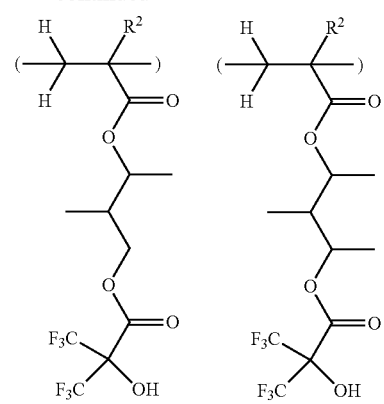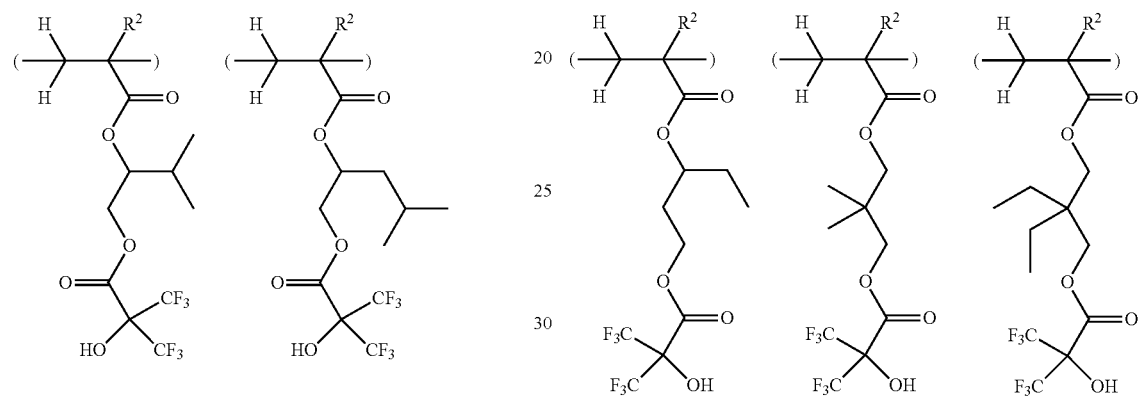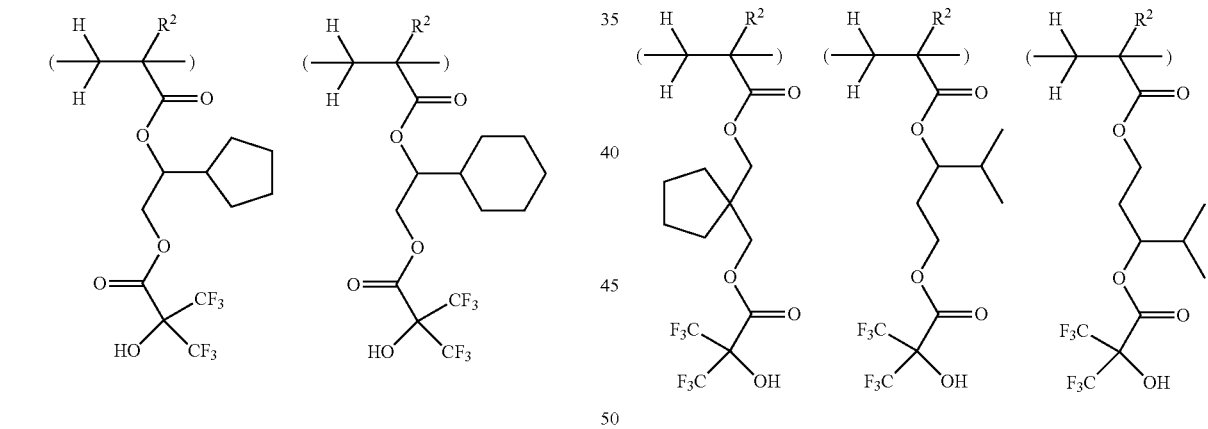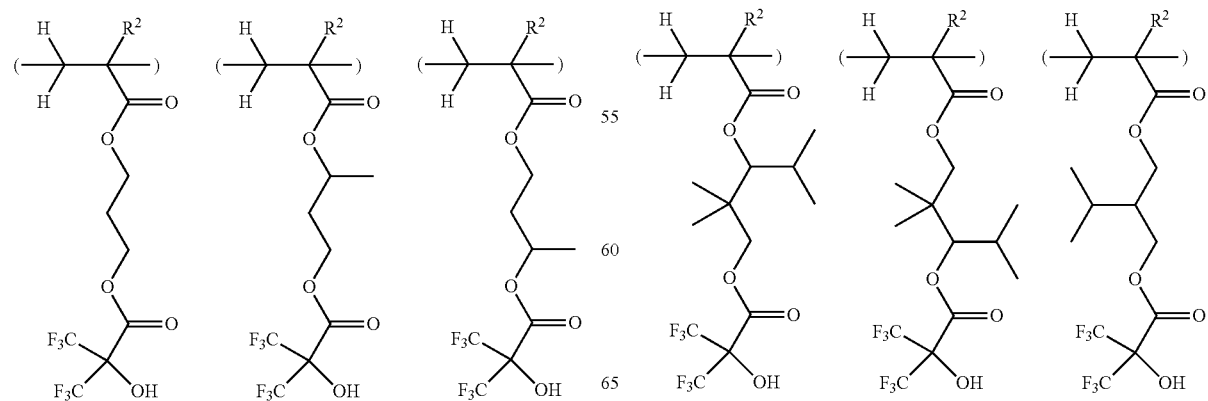

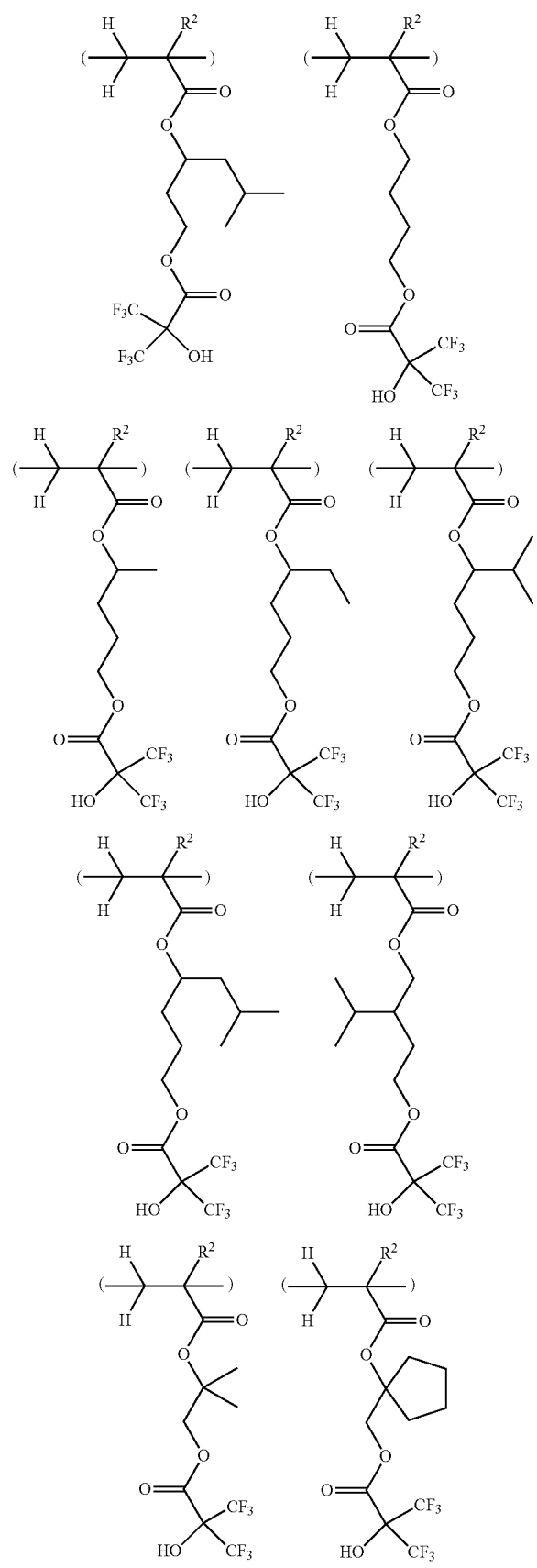
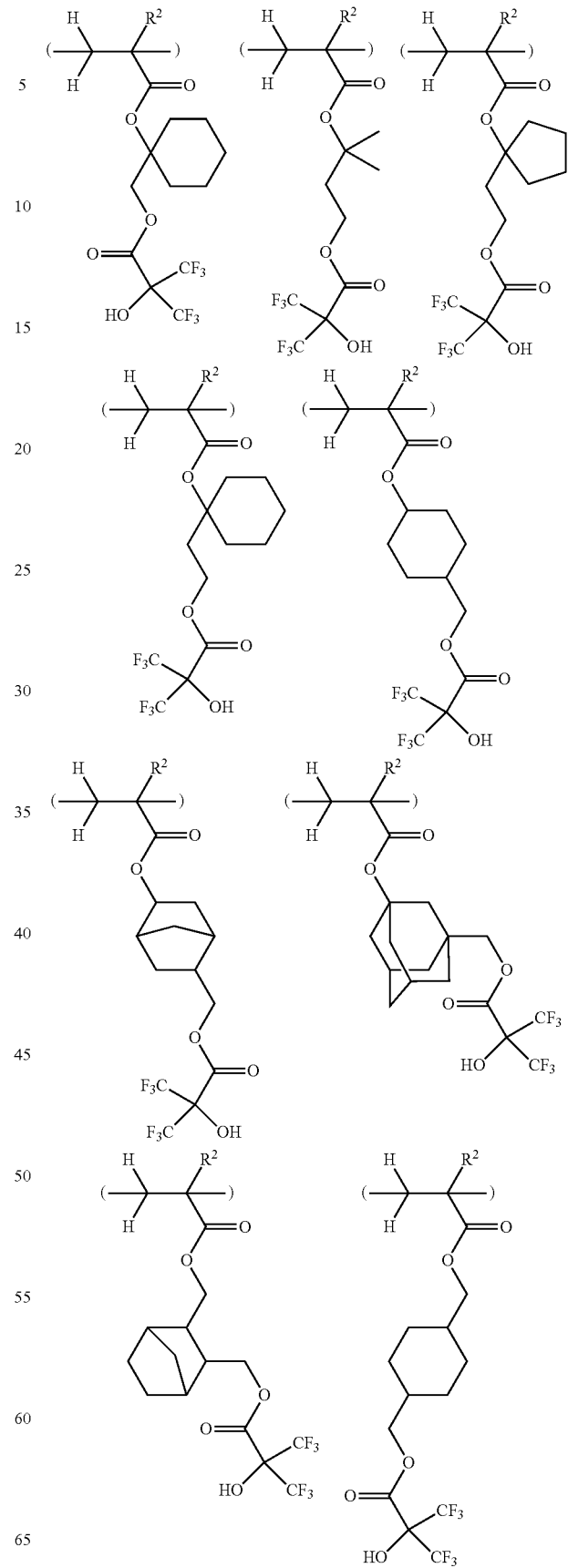

17
-continued
18
-continued
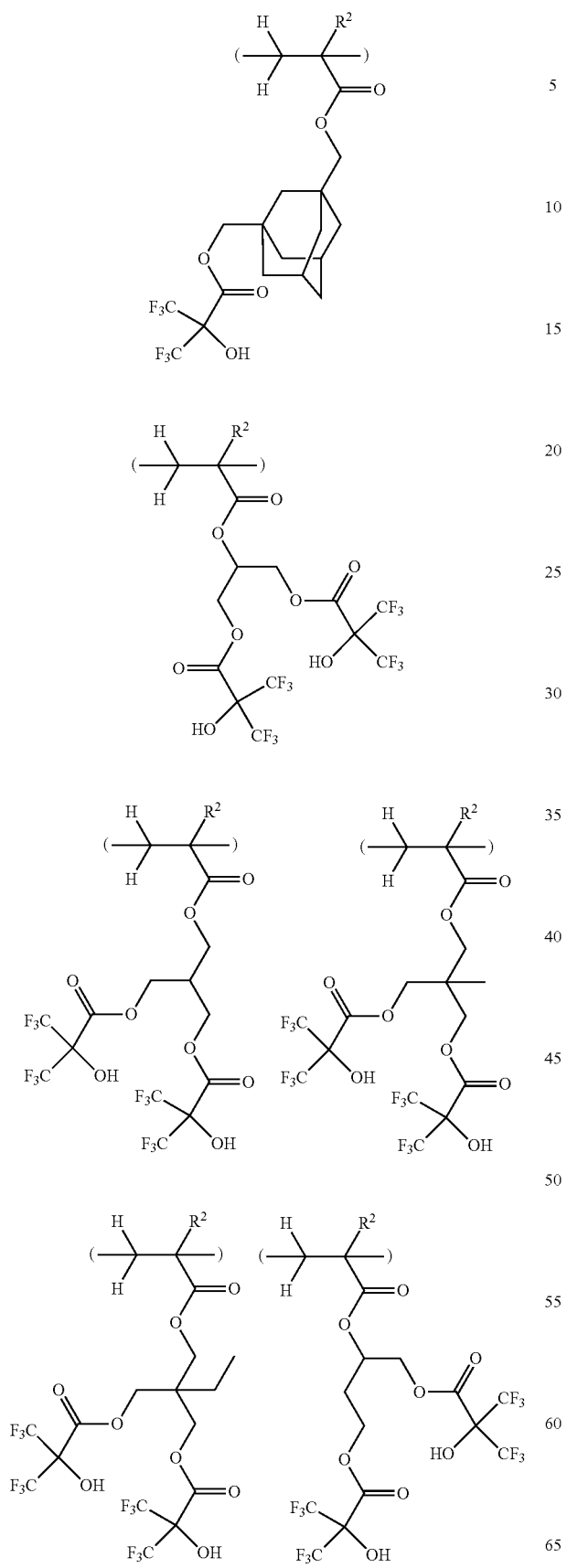
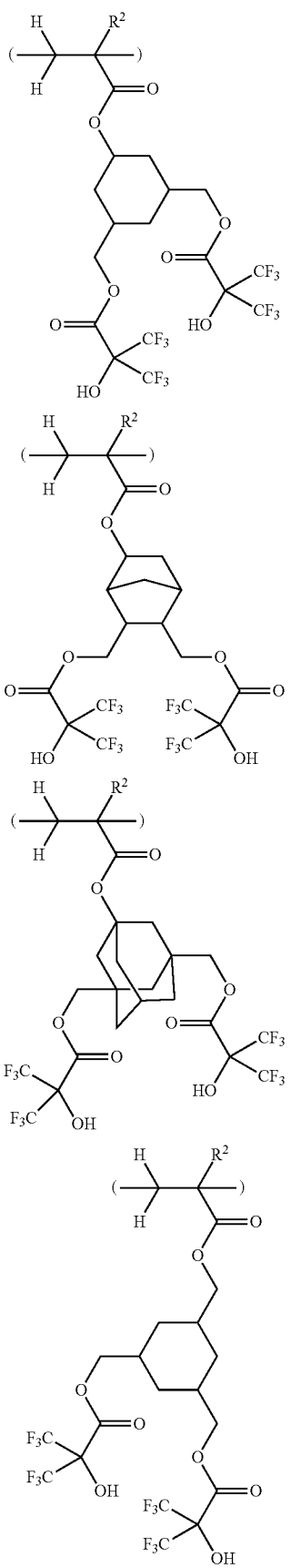

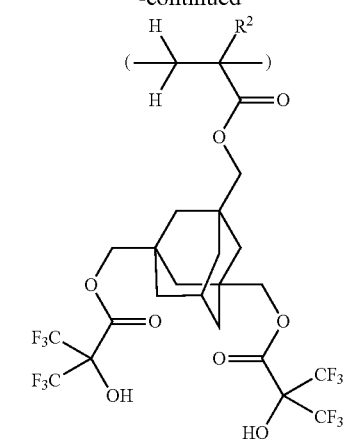
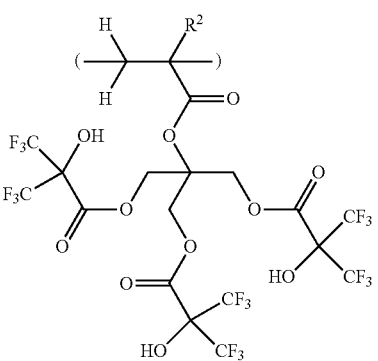
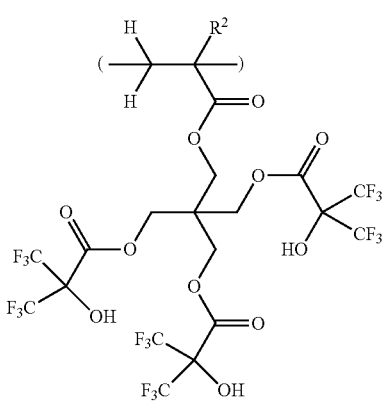
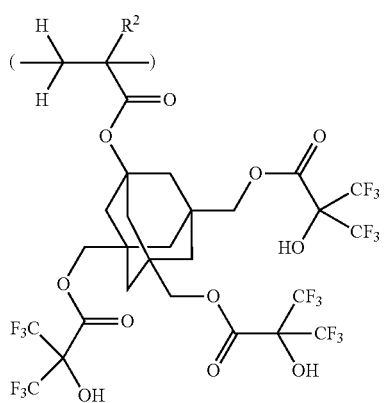
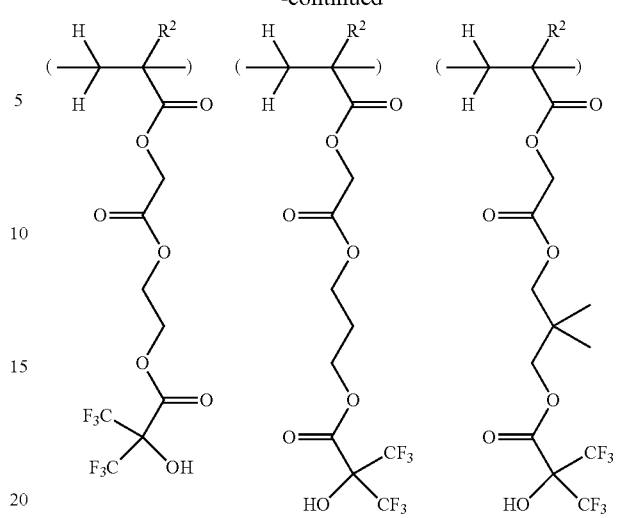
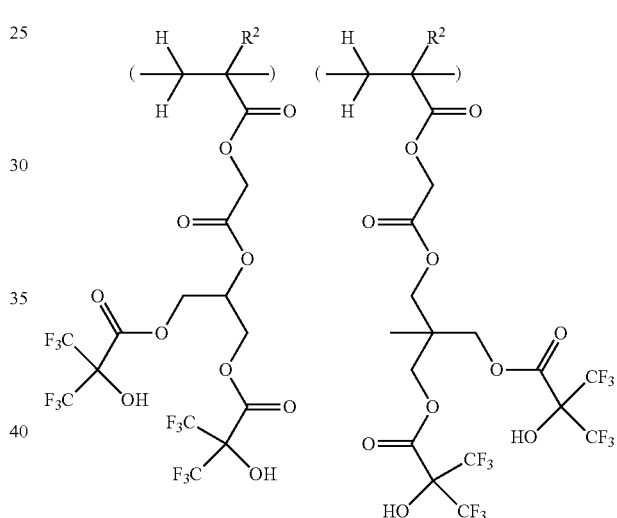
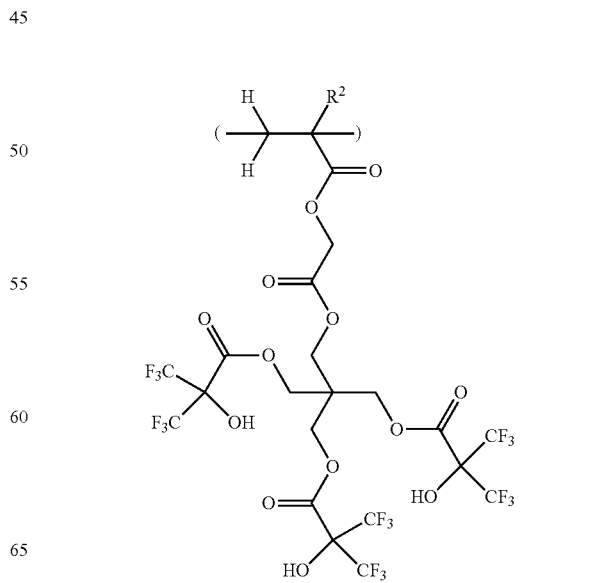

21
-continued
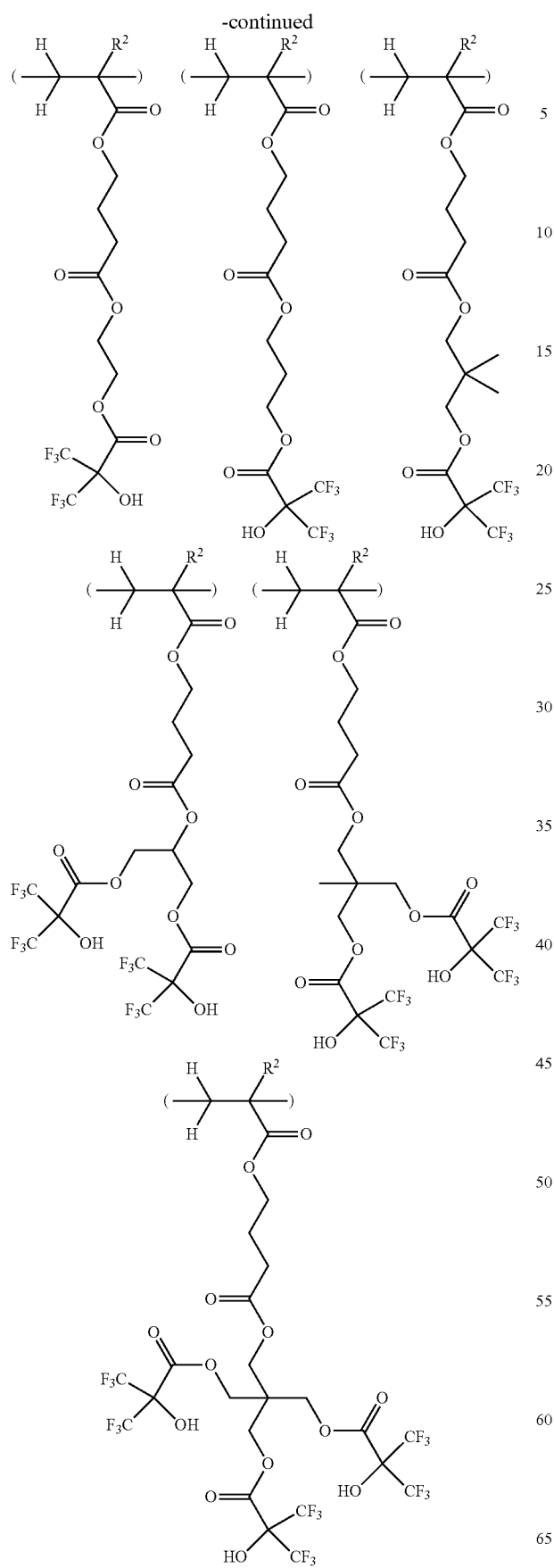
22
-continued
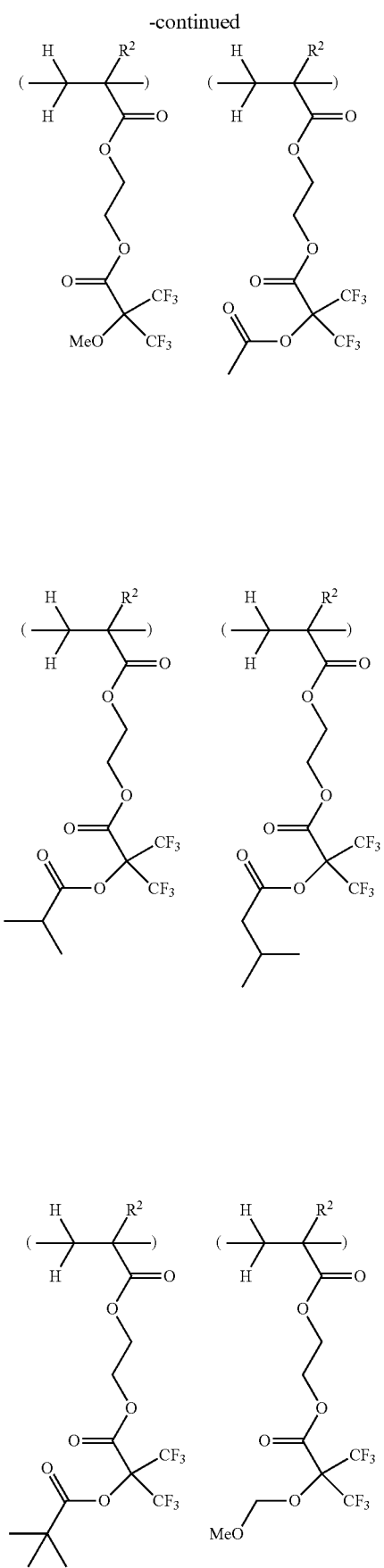

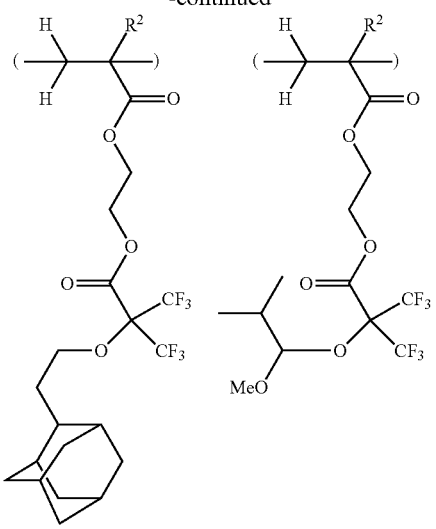
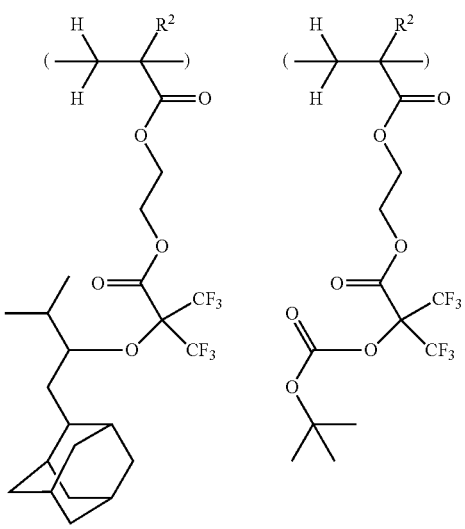
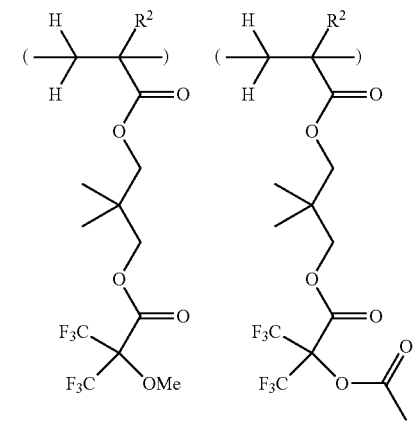
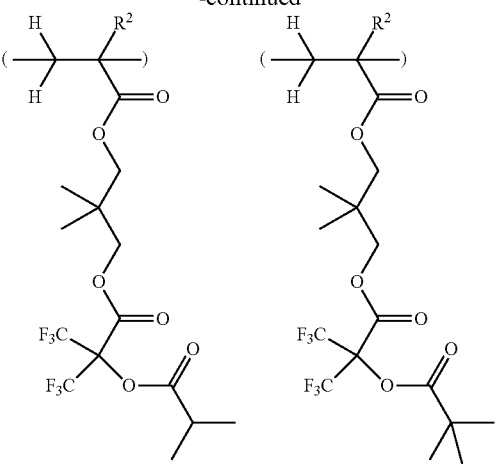
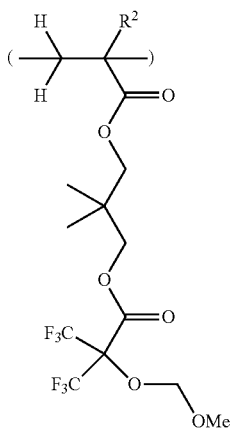
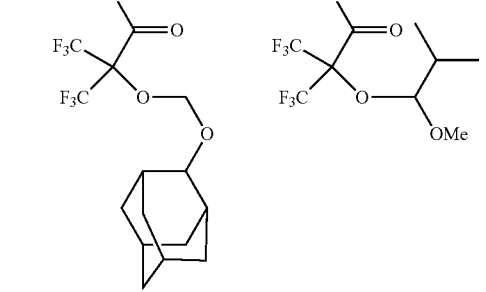

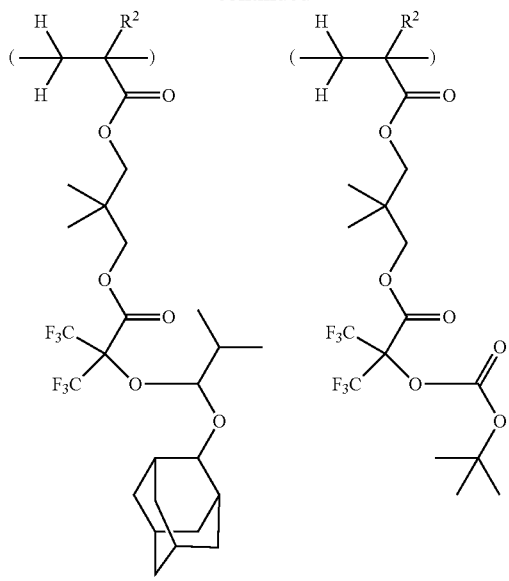
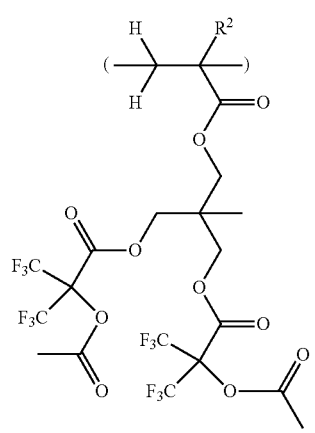
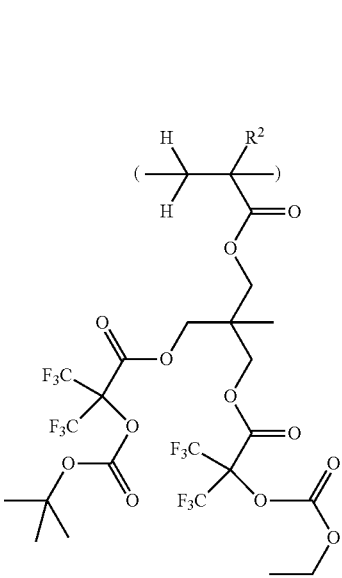
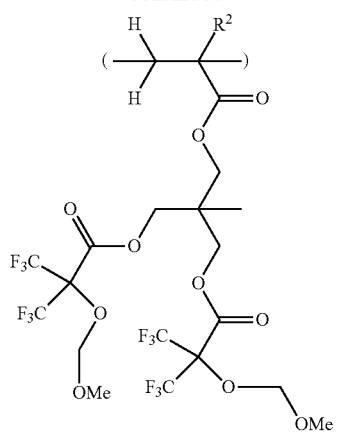

Herein $R^2$ is as defined above, and Me is methyl.

In addition to the recurring units of formula (1), the polymer may further comprise recurring units of one or multiple types selected from the general formulae (2a) to (2m). Using the polymer having additional recurring units incorporated, the protective film-forming composition is more improved in water repellency, water slip, alkaline dissolution, and contact angle after development.

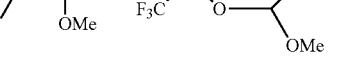

(2a)

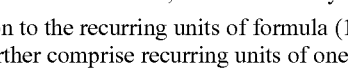

(2b)

-continued
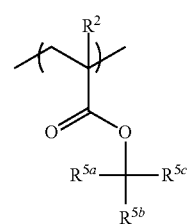
(2c)
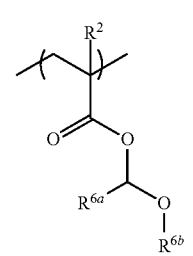
(2d)
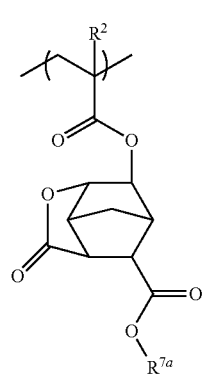
(2e)
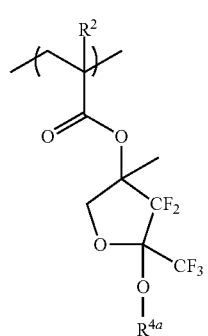
(2f)
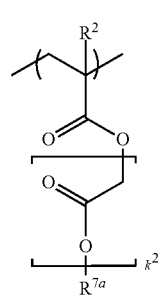
(2g)
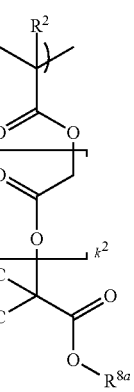
(2h)
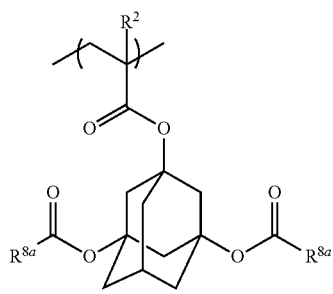
(2i)
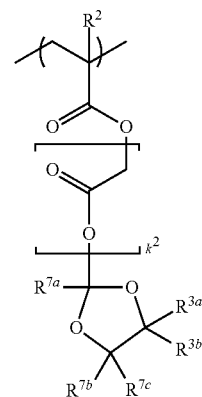
(2j)
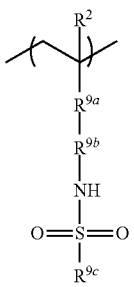
(2k)
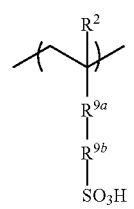
(2l)

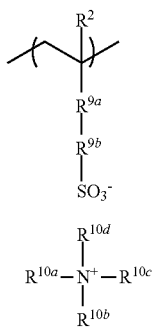

(2m)

Herein $R^2$ is as defined above. $R^{3a}$ and $R^{3b}$ are each independently hydrogen or a straight, branched or cyclic $C_1$-$C_{15}$ monovalent hydrocarbon group, or $R^{3a}$ and $R^{3b}$ may bond together to form a non-aromatic ring of 3 to 8 carbon atoms with the carbon atom to which they are attached. $R^{4a}$ is hydrogen, a straight, branched or cyclic $C_1$-$C_{15}$ monovalent hydrocarbon or fluorinated hydrocarbon group in which a constituent moiety —$CH_2$— may be replaced by —O— or —C(=O)—, or an acid labile group. $R^{5a}$, $R^{5b}$ and $R^{5c}$ are each independently hydrogen, or a straight, branched or cyclic $C_1$-$C_{15}$ monovalent hydrocarbon or fluorinated hydrocarbon group, or $R^{5a}$ and $R^{5b}$, $R^{5a}$ and $R^{5c}$, or $R^{5b}$ and $R^{5c}$ may bond together to form a non-aromatic ring of 3 to 8 carbon atoms with the carbon atom to which they are attached. $R^{6a}$ is hydrogen, or a straight, branched or cyclic $C_1$-$C_{15}$ monovalent hydrocarbon group, $R^{6b}$ is a straight, branched or cyclic $C_1$-$C_{15}$ monovalent hydrocarbon group, or $R^{6a}$ and $R^{6b}$ may bond together to form a non-aromatic ring of 3 to 8 carbon atoms with the carbon atom to which they are attached. $R^{7a}$, $R^{7b}$ and $R^{7c}$ are each independently a straight, branched or cyclic $C_1$-$C_{15}$ monovalent fluorinated hydrocarbon group. $R^{8a}$ is a straight, branched or cyclic $C_1$-$C_{15}$ monovalent hydrocarbon or fluorinated hydrocarbon group. $R^{9a}$ is a single bond, a straight, branched or cyclic $C_1$-$C_{15}$ alkylene group, —C(=O)—O— or —C(=O)—NH—. $R^{9b}$ is a single bond or a straight, branched or cyclic $C_1$-$C_{15}$ alkylene group. $R^{9c}$ is a straight, branched or cyclic $C_1$-$C_{15}$ monovalent fluorinated hydrocarbon group. $R^{10a}$ to $R^{10d}$ are each independently hydrogen, a straight, branched or cyclic $C_1$-$C_{12}$ alkyl, alkenyl, oxoalkyl or oxoalkenyl group, $C_6$-$C_{20}$ aryl group, or $C_7$-$C_{12}$ aralkyl or aryloxoalkyl group, in which groups some or all hydrogen atoms may be substituted by alkoxy radicals, or which group may contain a nitrogen atom, ether, ester, hydroxyl or carboxyl radical, or $R^{10a}$ and $R^{10b}$, or $R^{10a}$, $R^{10b}$ and $R^{10c}$ may bond together to form a $C_5$-$C_{10}$ ring with the nitrogen atom to which they are attached, and $R^{10a}$ and $R^{10b}$, or $R^{10a}$, $R^{10b}$ and $R^{10c}$ each are an alkylene group when they form a ring with the nitrogen atom, and $k^2$ is 0 or 1.

With respect to $R^{3a}$, $R^{3b}$, $R^{4a}$, $R^{5a}$, $R^{5b}$, $R^{5c}$, $R^{6a}$, $R^{6b}$, and $R^{8a}$, suitable straight, branched or cyclic $C_1$-$C_{15}$ monovalent hydrocarbon groups include methyl, ethyl, n-propyl, isopropyl, n-butyl, sec-butyl, tert-butyl, tert-amyl, n-pentyl, n-hexyl, n-heptyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl, cyclohexylbutyl, and adamantyl. A pair of $R^{3a}$ and $R^{3b}$, $R^{5a}$ and $R^{5b}$, $R^{5a}$ and $R^{5c}$, $R^{5b}$ and $R^{5c}$, or $R^{6a}$ and $R^{6b}$ may bond together to form a $C_3$-$C_8$ non-aromatic ring with the carbon atom to which they are attached. In the event of cyclization, each R is an alkylene group corresponding to the foregoing alkyl groups with one hydrogen atom eliminated therefrom, and exemplary rings are cyclopentyl and cyclohexyl.

$R^{4a}$, $R^{5a}$, $R^{5b}$, $R^{5c}$, $R^{7a}$, $R^{7b}$, $R^{7c}$, $R^{8a}$, and $R^{9c}$ stand for straight, branched or cyclic $C_1$-$C_{15}$ monovalent fluorinated hydrocarbon groups, specifically fluoroalkyl groups which are typically substituted forms of the foregoing alkyl groups in which some or all hydrogen atoms are substituted by fluorine atoms. Examples include, but are not limited to, trifluoromethyl, 2,2,2-trifluoroethyl, 3,3,3-trifluoro-1-propyl, 3,3,3-trifluoro-2-propyl, 2,2,3,3-tetrafluoropropyl, 1,1,1,3,3,3-hexafluoroisopropyl, 2,2,3,3,4,4,4-heptafluorobutyl, 2,2,3,3,4,4,5,5-octafluoropentyl, 2,2,3,3,4,4,5,5,6,6,7,7-dodecafluoroheptyl, 2-(perfluorobutyl)ethyl, 2-(perfluorohexyl)ethyl, 2-(perfluorooctyl)ethyl, 2-(perfluorodecyl)ethyl, and 3,3,4,4,5,5,6,6,6-nonafluorohexyl.

Of the groups of $R^{9a}$ and $R^{9b}$, suitable straight, branched or cyclic $C_1$-$C_{15}$ alkylene groups include the above-illustrated alkyl groups with one hydrogen atom withdrawn. The ammonium salt (cation moiety) formed by $R^{10a}$, $R^{10b}$, $R^{10c}$ and $R^{10d}$ is obtained from neutralization reaction of the corresponding amine compound. Suitable amine compounds include primary, secondary and tertiary aliphatic amines, mixed amines, aromatic amines, heterocyclic amines, nitrogen-containing compounds with carboxyl group, nitrogen-containing compounds with sulfonyl group, nitrogen-containing compounds with hydroxyl group, nitrogen-containing compounds with hydroxyphenyl group, amides, imides, and carbamates. Examples of amine compounds are described in JP-A 2008-111103, paragraphs [0146] to [0164] (U.S. Pat. No. 7,537,880).

The acid labile group represented by $R^{4a}$ may be selected from a variety of such groups. Examples of the acid labile group are groups of the following general formulae (L1) to (L4), tertiary alkyl groups of 4 to 20 carbon atoms, preferably 4 to 15 carbon atoms, trialkylsilyl groups in which each alkyl moiety has 1 to 6 carbon atoms, and oxoalkyl groups of 4 to 20 carbon atoms.

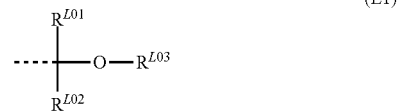

(L1)

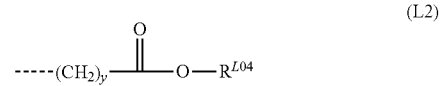

(L2)

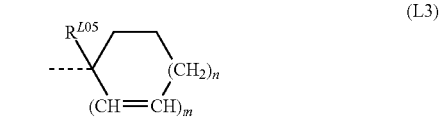

(L3)

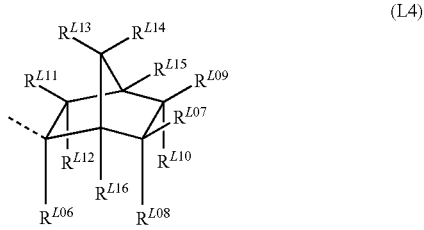

(L4)

Herein $R^{L01}$ and $R^{L02}$ are each independently hydrogen or a straight, branched or cyclic alkyl group of 1 to 18 carbon atoms, preferably 1 to 10 carbon atoms. $R^{L03}$ is a monovalent hydrocarbon group of 1 to 18 carbon atoms, preferably 1 to 10 carbon atoms, which may contain a heteroatom such as oxygen, examples of which include straight, branched or cyclic alkyl groups and substituted forms of such alkyl groups in which some hydrogen atoms are replaced by hydroxyl, alkoxy, oxo, amino, alkylamino or the like. $R^{L04}$ is a tertiary alkyl group of 4 to 20 carbon atoms, preferably 4 to 15 carbon atoms, a trialkylsilyl group in which each alkyl moiety has 1 to 6 carbon atoms, an oxoalkyl group of 4 to 20 carbon atoms, or a group of formula (L1). $R^{L05}$ is an optionally substituted, straight, branched or cyclic $C_1$-$C_{10}$ alkyl group or an optionally substituted $C_6$-$C_{20}$ aryl group. $R^{L06}$ is an optionally substituted, straight, branched or cyclic $C_1$-$C_{10}$ alkyl group or an optionally substituted $C_6$-$C_{20}$ aryl group. $R^{L07}$ to $R^{L16}$ independently represent hydrogen or optionally substituted monovalent hydrocarbon groups of 1 to 15 carbon atoms. Letter y is an integer of 0 to 6, m is equal to 0 or 1, n is equal to 0, 1, 2 or 3, and 2 m+n is equal to 2 or 3. The broken line denotes a valence bond.

Although the groups $R^{L01}$ to $R^{L04}$ in formulae (L1) and (L2) are as exemplified in conjunction with formulae (R1-1) and (R1-2), they are described again.

In formula (L1), exemplary groups of $R^{L01}$ and $R^{L02}$ include methyl, ethyl, propyl, isopropyl, n-butyl, sec-butyl, tert-butyl, cyclopentyl, cyclohexyl, 2-ethylhexyl, n-octyl, and adamantyl. $R^{L03}$ is a monovalent hydrocarbon group of 1 to 18 carbon atoms, preferably 1 to 10 carbon atoms, which may contain a heteroatom such as oxygen, examples of which include straight, branched or cyclic alkyl groups and substituted forms of such alkyl groups in which some hydrogen atoms are replaced by hydroxyl, alkoxy, oxo, amino, alkylamino or the like. Illustrative examples of the straight, branched or cyclic alkyl groups are as exemplified above for $R^{L01}$ and $R^{L02}$, and examples of the substituted alkyl groups are as shown below.

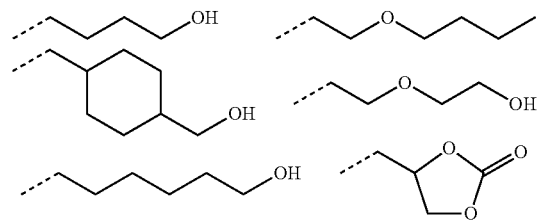

A pair of $R^{L01}$ and $R^{L02}$, $R^{L01}$ and $R^{L03}$, or $R^{L02}$ and $R^{L03}$ may bond together to form a ring with carbon and oxygen atoms to which they are attached. Each of ring-forming $R^{L01}$, $R^{L02}$ and $R^{L03}$ is a straight or branched alkylene group of 1 to 18 carbon atoms, preferably 1 to 10 carbon atoms when they form a ring.

In formula (L2), exemplary tertiary alkyl groups of $R^{L04}$ are tert-butyl, tert-amyl, 1,1-diethylpropyl, 2-cyclopentylpropan-2-yl, 2-cyclohexylpropan-2-yl, 2-(bicyclo[2.2.1]heptan-2-yl)propan-2-yl, 2-(adamantan-1-yl)propan-2-yl, 1-ethylcyclopentyl, 1-butylcyclopentyl, 1-ethylcyclohexyl, 1-butylcyclohexyl, 1-ethyl-2-cyclopentenyl, 1-ethyl-2-cyclohexenyl, 2-methyl-2-adamantyl, 2-ethyl-2-adamantyl, and the like. Exemplary trialkylsilyl groups are trimethylsilyl, triethylsilyl, and dimethyl-tert-butylsilyl. Exemplary oxoalkyl groups are 3-oxocyclohexyl, 4-methyl-2-oxooxan-4-yl, and 5-methyl-2-oxooxolan-5-yl.

In formula (L3), examples of the optionally substituted $C_1$-$C_{10}$ alkyl groups of $R^{L05}$ include straight, branched or cyclic alkyl groups such as methyl, ethyl, propyl, isopropyl, n-butyl, sec-butyl, tert-butyl, tert-amyl, n-pentyl, n-hexyl, cyclopentyl, cyclohexyl, and bicyclo[2.2.1]heptyl, and substituted forms of such groups in which some hydrogen atoms are replaced by hydroxyl, alkoxy, carboxyl, alkoxycarbonyl, oxo, amino, alkylamino, cyano, mercapto, alkylthio, sulfo or other groups or in which a methylene moiety is replaced by an oxygen or sulfur atom. Examples of optionally substituted $C_6$-$C_{20}$ aryl groups include phenyl, methylphenyl, naphthyl, anthryl, phenanthryl, and pyrenyl.

In formula (L4), examples of optionally substituted, straight, branched or cyclic $C_1$-$C_{10}$ alkyl groups and optionally substituted $C_6$-$C_{20}$ aryl groups of $R^{L06}$ are the same as exemplified for $R^{L05}$. Exemplary $C_1$-$C_{15}$ monovalent hydrocarbon groups of $R^{L07}$ to $R^{L16}$ include straight, branched or cyclic alkyl groups such as methyl, ethyl, propyl, isopropyl, n-butyl, sec-butyl, tert-butyl, tert-amyl, n-pentyl, n-hexyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl and cyclohexylbutyl, and substituted forms of these groups in which some hydrogen atoms are replaced by hydroxyl, alkoxy, carboxyl, alkoxycarbonyl, oxo, amino, alkylamino, cyano, mercapto, alkylthio, sulfo or other groups. Alternatively, two of $R^{L07}$ to $R^{L16}$ may bond together to form a ring with the carbon atom(s) to which they are attached (for example, a pair of $R^{L07}$ and $R^{L08}$, $R^{L07}$ and $R^{L09}$, $R^{L07}$ and $R^{L10}$, $R^{L08}$ and $R^{L10}$, $R^{L09}$ and $R^{L10}$, $R^{L11}$ and $R^{L12}$, or $R^{L13}$ and $R^{L14}$ form a ring). Each of $R^{L07}$ to $R^{L16}$ represents a $C_1$-$C_{15}$ divalent hydrocarbon group, typically alkylene, when they form a ring, examples of which are those exemplified above for the monovalent hydrocarbon groups, with one hydrogen atom being eliminated. Two of $R^{L07}$ to $R^{L16}$ which are attached to vicinal carbon atoms may bond together directly to form a double bond (for example, a pair of $R^{L07}$ and $R^{L09}$, $R^{L09}$ and $R^{L15}$, $R^{L13}$ and $R^{L15}$, or $R^{L14}$ and $R^{L15}$).

Of the acid labile groups of formula (L1), the straight and branched ones are exemplified by the following groups.

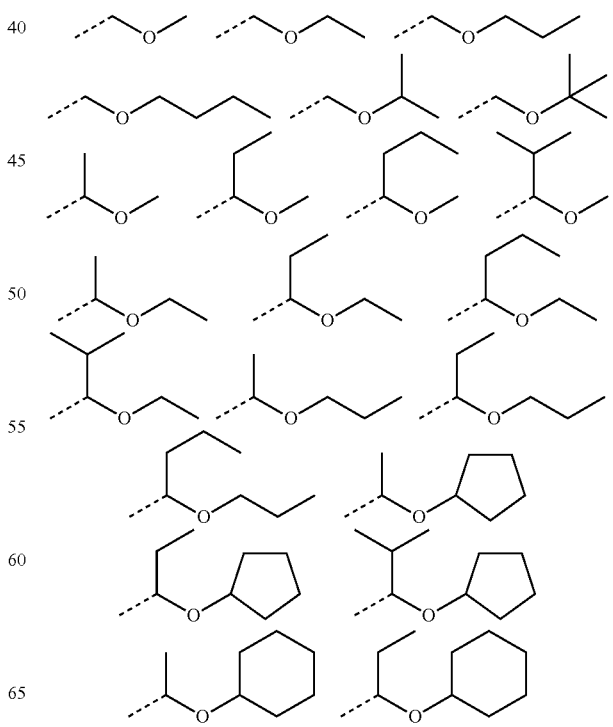

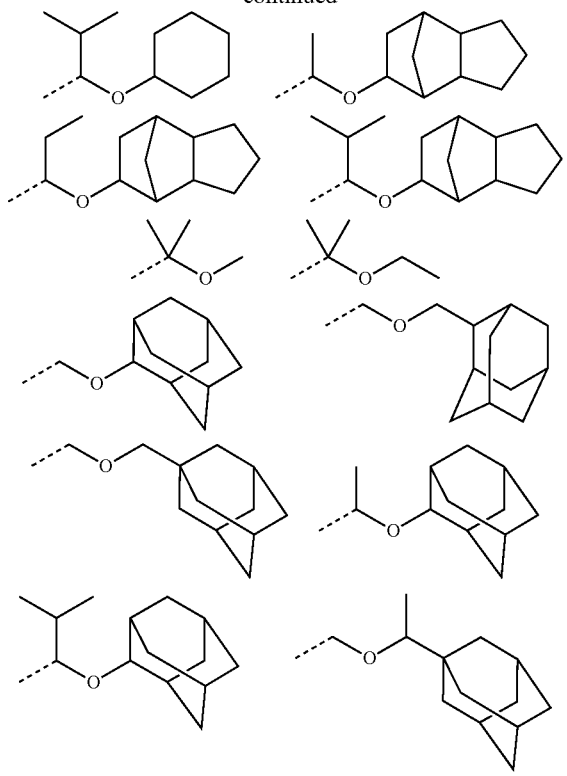

Of the acid labile groups of formula (L1), the cyclic ones are, for example, tetrahydrofuran-2-yl, 2-methyltetrahydrofuran-2-yl, tetrahydropyran-2-yl, and 2-methyltetrahydropyran-2-yl.

Examples of the acid labile groups of formula (L2) include tert-butoxycarbonyl, tert-butoxycarbonylmethyl, tert-amyloxycarbonyl, tert-amyloxycarbonylmethyl, 1,1-diethylpropyloxycarbonyl, 1,1-diethylpropyloxycarbonylmethyl, 1-ethylcyclopentyloxycarbonyl, 1-ethylcyclopentyloxycarbonylmethyl, 1-ethyl-2-cyclopentenyloxycarbonyl, 1-ethyl-2-cyclopentenyloxycarbonylmethyl, 1-ethoxyethoxycarbonylmethyl, 2-tetrahydropyranyloxycarbonylmethyl, and 2-tetrahydrofuranyloxycarbonylmethyl.

Examples of the acid labile groups of formula (L3) include 1-methylcyclopentyl, 1-ethylcyclopentyl, 1-n-propylcyclopentyl, 1-isopropylcyclopentyl, 1-n-butylcyclopentyl, 1-sec-butylcyclopentyl, 1-cyclohexylcyclopentyl, 1-(4-methoxy-n-butyl)cyclopentyl, 1-(bicyclo[2.2.1]heptan-2-yl)cyclopentyl, 1-(7-oxabicyclo[2.2.1]heptan-2-yl)cyclopentyl, 1-methylcyclohexyl, 1-ethylcyclohexyl, 3-methyl-1-cyclopenten-3-yl, 3-ethyl-1-cyclopenten-3-yl, 3-methyl-1-cyclohexen-3-yl, and 3-ethyl-1-cyclohexen-3-yl.

Of the acid labile groups of formula (L4), those groups of the following formulae (L4-1) to (L4-4) are preferred.

(L4-1)

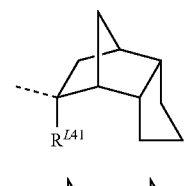

(L4-2)

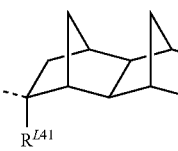

(L4-3)

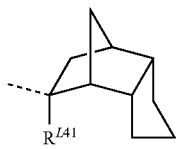

(L4-4)

In formulas (L4-1) to (L4-4), the broken line denotes a bonding site and direction. $R^{L41}$ is each independently a monovalent hydrocarbon group, typically a straight, branched or cyclic $C_1$-$C_{10}$ alkyl group, such as methyl, ethyl, propyl, isopropyl, n-butyl, sec-butyl, tert-butyl, tert-amyl, n-pentyl, n-hexyl, cyclopentyl and cyclohexyl.

For formulas (L4-1) to (L4-4), there can exist enantiomers and diastereomers. Each of formulae (L4-1) to (L4-4) collectively represents all such stereoisomers. Such stereoisomers may be used alone or in admixture.

For example, the general formula (L4-3) represents one or a mixture of two selected from groups having the following general formulas (L4-3-1) and (L4-3-2).

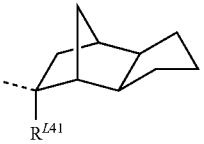

(L4-3-1)

(L4-3-2)

Note that $R^{L41}$ is as defined above.

Similarly, the general formula (L4-4) represents one or a mixture of two or more selected from groups having the following general formulas (L4-4-1) to (L4-4-4).

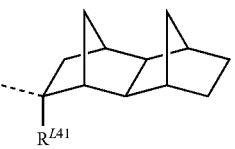

(L4-4-1)

(L4-4-2)
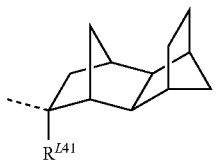

(L4-4-3)
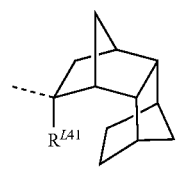

(L4-4-4)
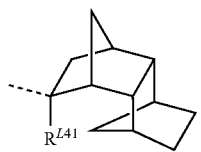

Note that $R^{L41}$ is as defined above.

Each of formulas (L4-1) to (L4-4), (L4-3-1) and (L4-3-2), and (L4-4-1) to (L4-4-4) collectively represents an enantiomer thereof and a mixture of enantiomers.

It is noted that in the above formulas (L4-1) to (L4-4), (L4-3-1) and (L4-3-2), and (L4-4-1) to (L4-4-4), the bond direction is on the exo side relative to the bicyclo[2.2.1]heptane ring, which ensures high reactivity for acid catalyzed elimination reaction (see JP-A 2000-336121). In preparing these monomers having a tertiary exo-alkyl group of bicyclo[2.2.1]heptane structure as a substituent group, there may be contained monomers substituted with an endo-alkyl group as represented by the following formulas (L4-1-endo) to (L4-4-endo). For good reactivity, an exo proportion of at least 50 mol % is preferred, with an exo proportion of at least 80 mol % being more preferred.

(L4-1-endo)
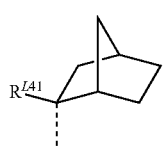

(L4-2-endo)
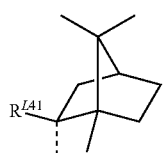

(L4-3-endo)
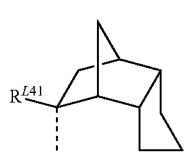

(L4-4-endo)
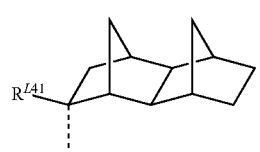

Note that $R^{L41}$ is as defined above.

Illustrative examples of the acid labile group of formula (L4) are given below.

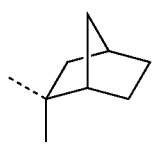 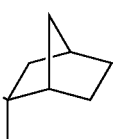 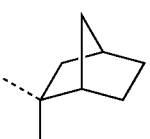
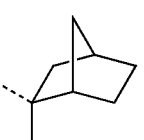 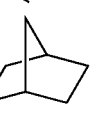 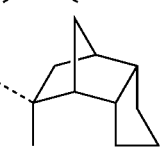
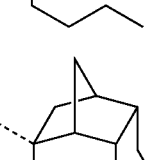  
  
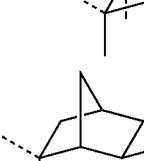 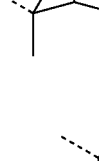 
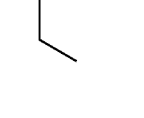 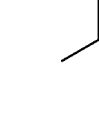

Examples of the tertiary $C_4$-$C_{20}$ alkyl groups, trialkylsilyl groups in which each alkyl moiety has 1 to 6 carbon atoms, and $C_4$-$C_{20}$ oxoalkyl groups, represented by $R^{4a}$, are as exemplified for $R^{L04}$ and the like.

Illustrative examples of the recurring units having formulae (2a) to (2m) are given below, but not limited thereto. Note that $R^2$ is as defined above.

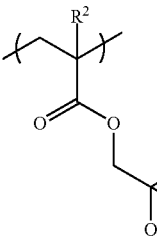 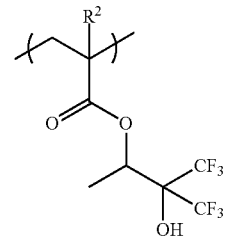

-continued
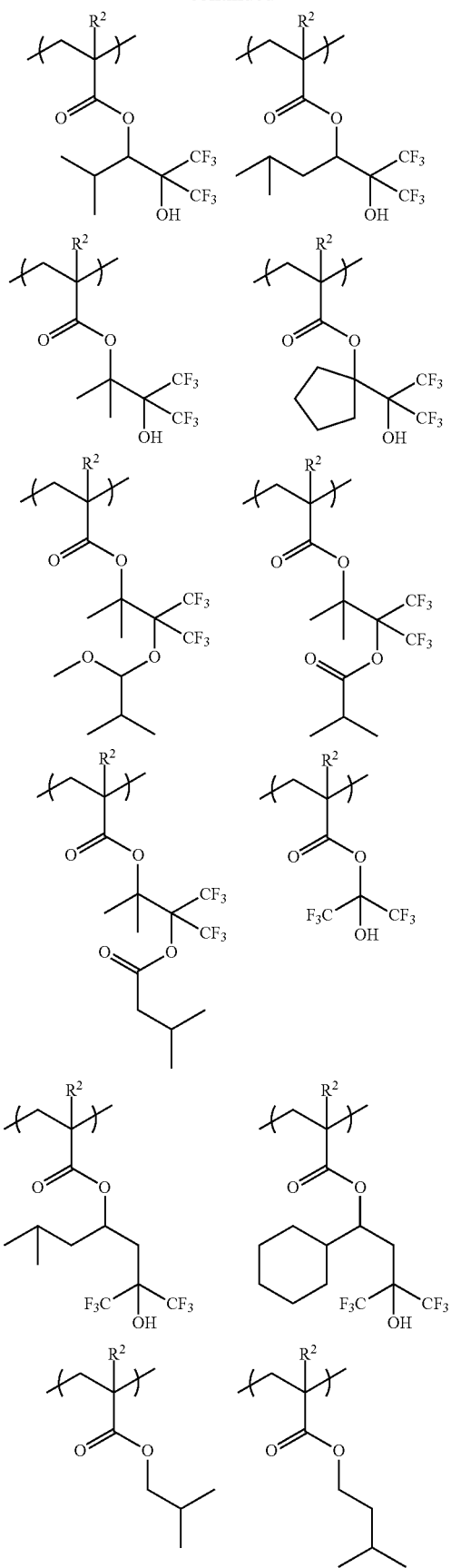
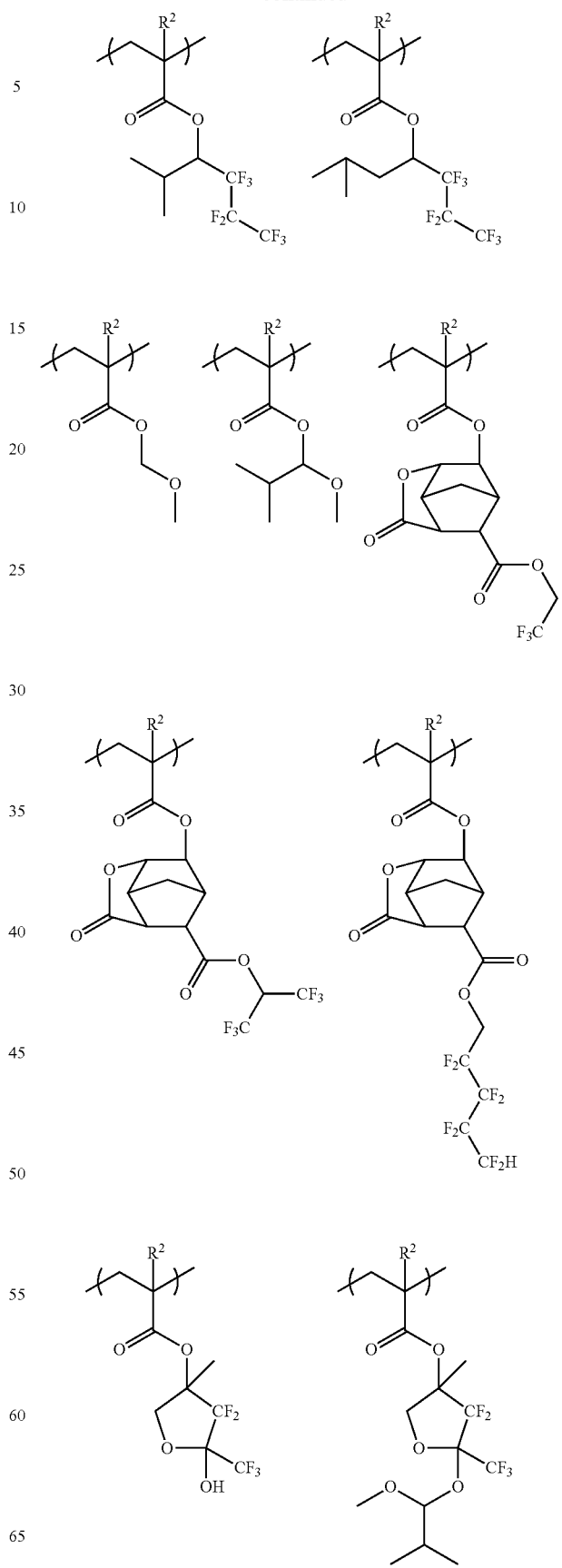

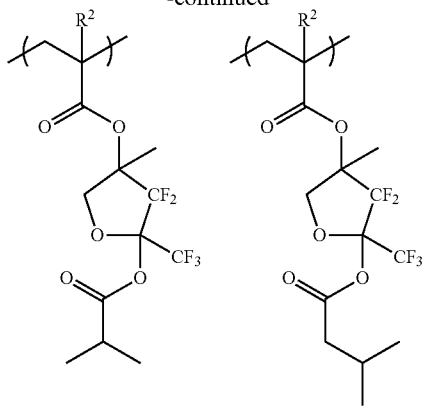
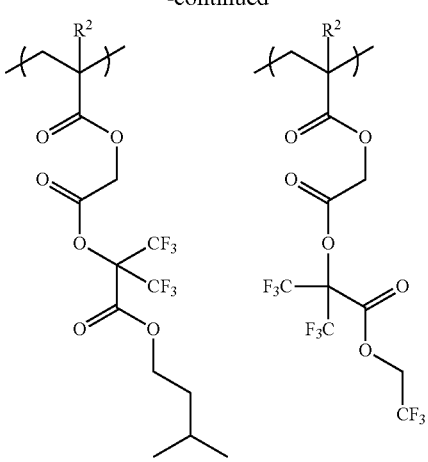
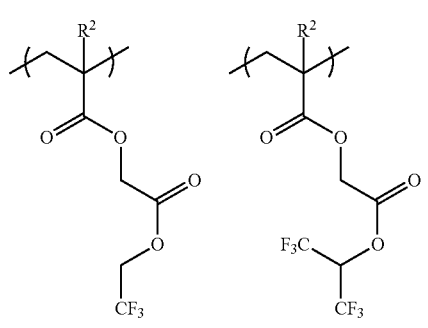
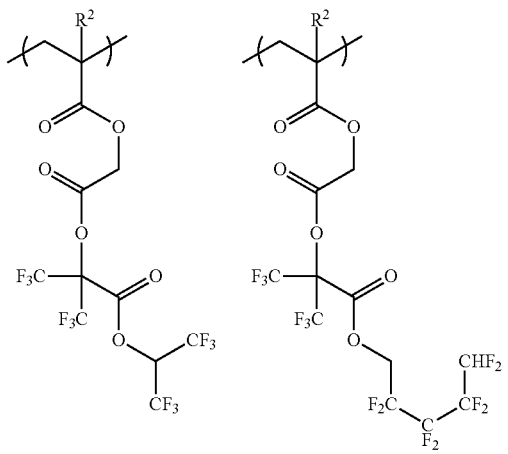
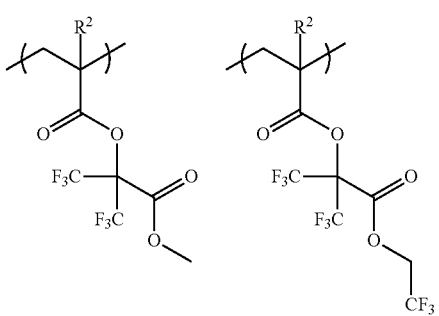
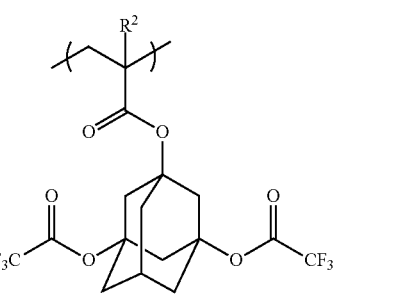
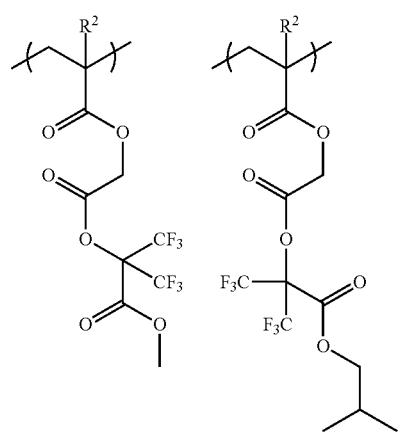
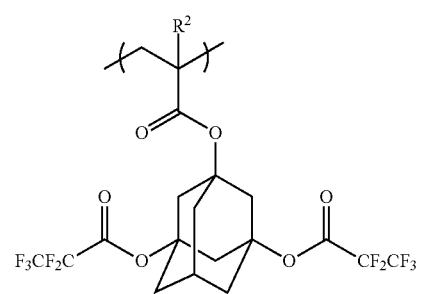

-continued

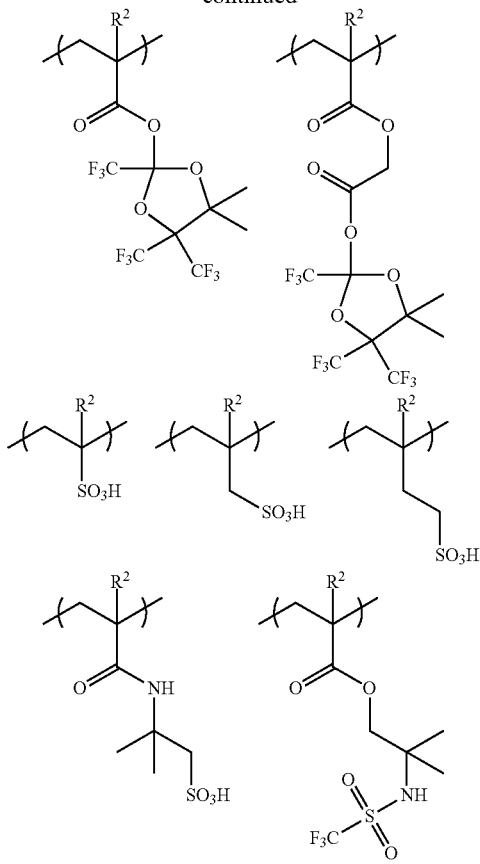

In the polymer used herein, the recurring units of formula (21) may be present in the form including some recurring units in which the sulfo group is neutralized with a basic compound, that is, recurring units of formula (2m).

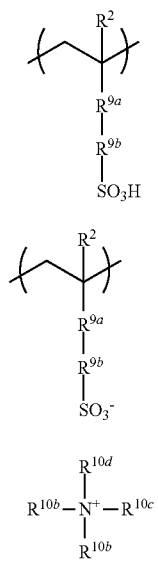

Herein $R^2$ is hydrogen or methyl. $R^{9a}$ is a single bond, a straight, branched or cyclic $C_1$-$C_{15}$ alkylene group, —C(=O)—O— or —C(=O)—NH—. $R^{9b}$ is a single bond or a straight, branched or cyclic $C_1$-$C_{15}$ alkylene group. $R^{10a}$ to $R^{10d}$ are each independently hydrogen, a straight, branched or cyclic $C_1$-$C_{12}$ alkyl, alkenyl, oxoalkyl or oxoalkenyl group, $C_6$-$C_{20}$ aryl group, or $C_7$-$C_{12}$ aralkyl or aryloxoalkyl group. In the groups of $R^{10a}$ to $R^{10d}$, some or all hydrogen atoms may be substituted by alkoxy radicals, or there may be contained a nitrogen atom, ether, ester, hydroxyl or carboxyl radical. $R^{10a}$ and $R^{10b}$, or $R^{10a}$, $R^{10b}$ and $R^{10c}$ may bond together to form a $C_5$-$C_{10}$ ring with the nitrogen atom to which they are attached, and $R^{10a}$ and $R^{10b}$, or $R^{10a}$, $R^{10b}$ and $R^{10c}$ are an alkylene group when they form a ring with the nitrogen atom.

Illustrative, non-limiting examples of the recurring unit of formula (2m) are given below.

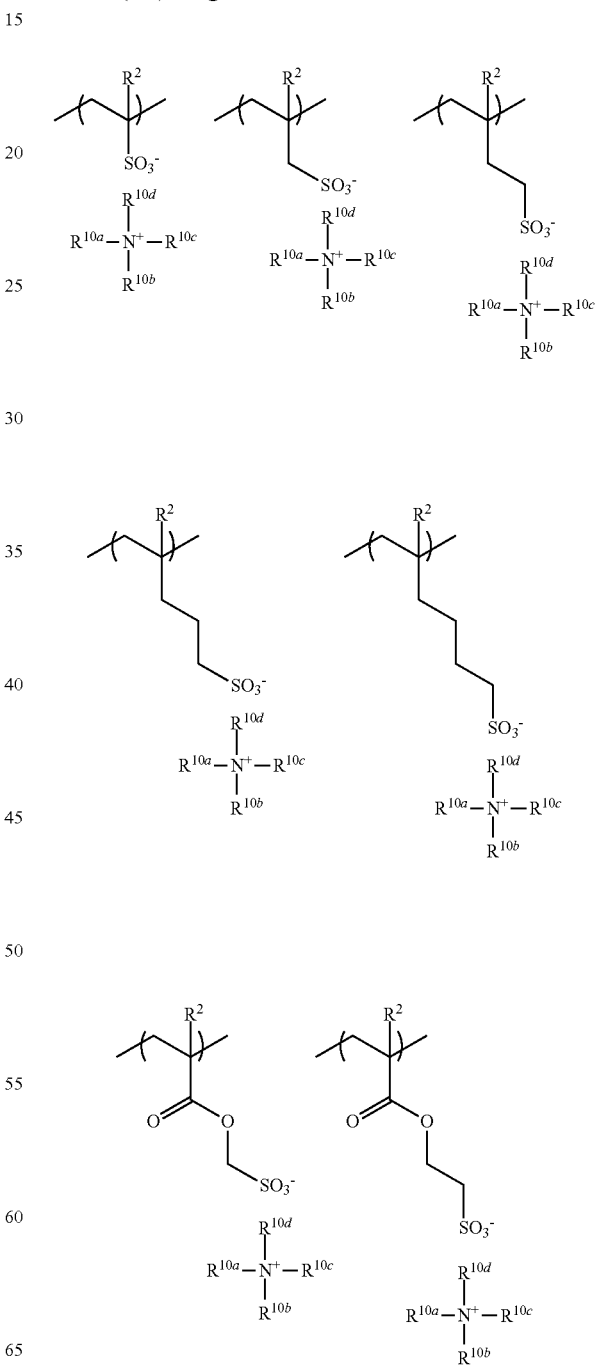

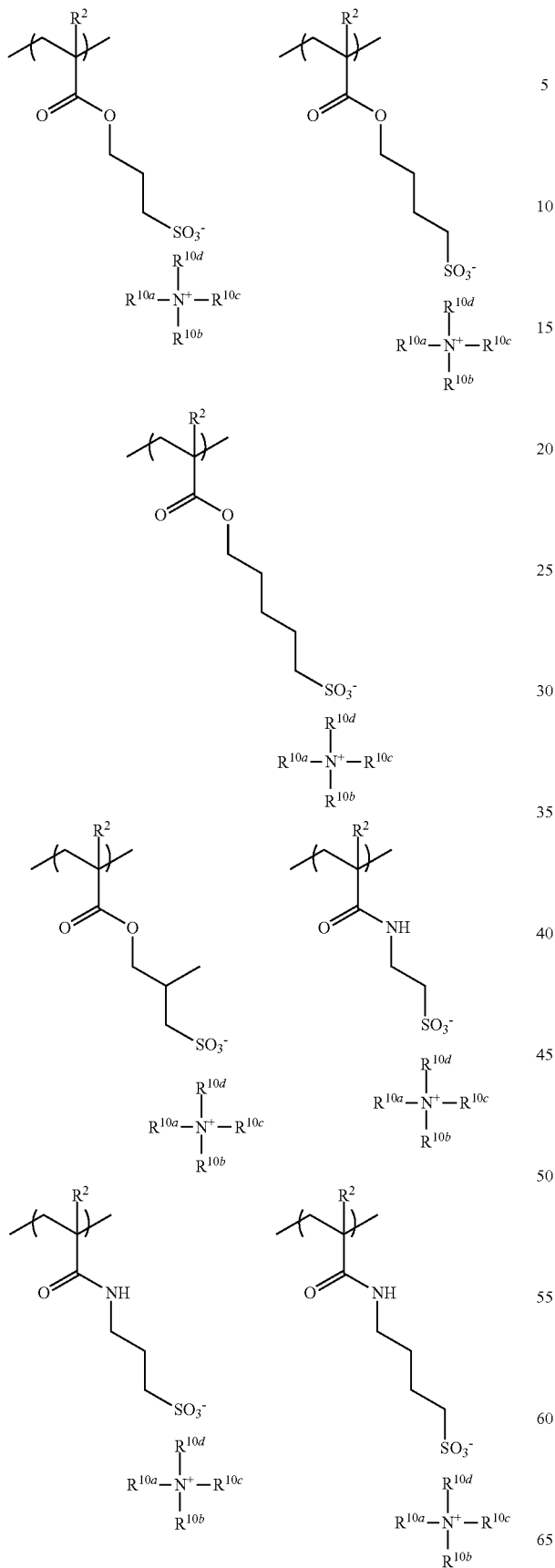

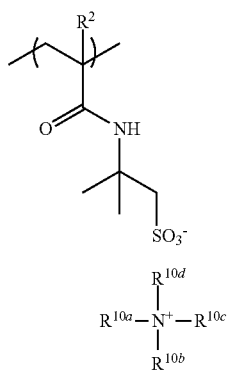

Note that $R^2$, $R^{10a}$ to $R^{10d}$ are as defined above.

Although the polymer comprising recurring units of formula (1) in combination with recurring units of formulae (2a) to (2m) exerts satisfactory performance, recurring units of one or multiple types selected from formulae (3a) to (3e), (4a) to (4e), and (5a) to (5c) may be further incorporated therein for the purposes of imparting further water repellency and water slip, and controlling alkaline solubility and developer affinity.

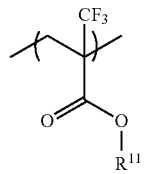

(3a)

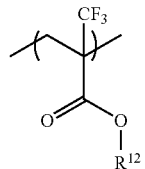

(3b)

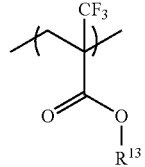

(3c)

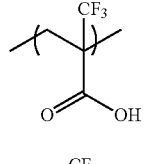

(3d)

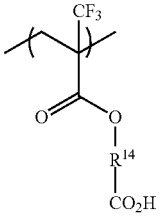

(3e)

-continued (4a) 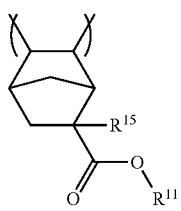

(4b) 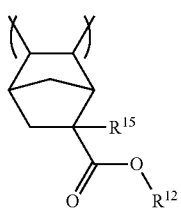

(4c) 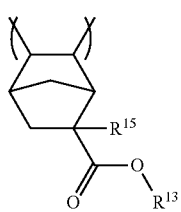

(4d) 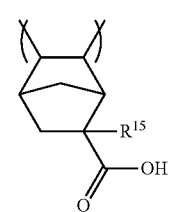

(4e) 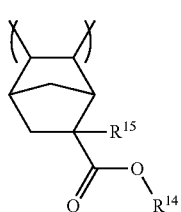

(5a) 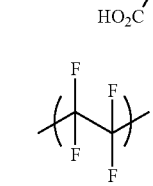

(5b) 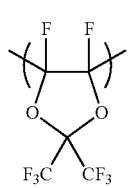

(5c) 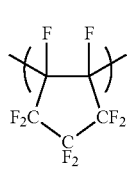

Herein $R^{11}$ is a $C_1$-$C_{15}$ monovalent hydrocarbon or fluorinated hydrocarbon group, $R^{12}$ is an adhesive group, $R^{13}$ is an acid labile group, $R^{14}$ is a single bond or divalent $C_1$-$C_{15}$ organic group, and $R^{15}$ is hydrogen, methyl or trifluoromethyl.

Examples of the $C_1$-$C_{15}$ monovalent hydrocarbon and fluorinated hydrocarbon groups represented by $R^{11}$ are the same as $R^{4a}$.

The adhesive group represented by $R^{12}$ may be selected from a variety of such groups, typically those groups shown below.

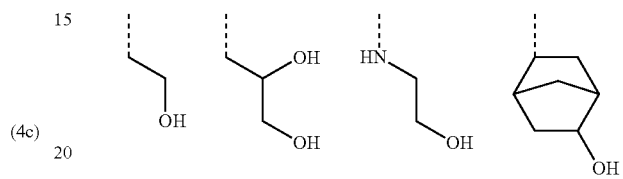

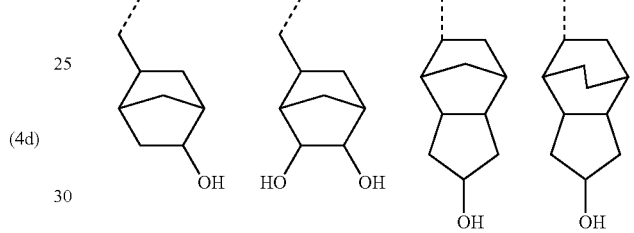

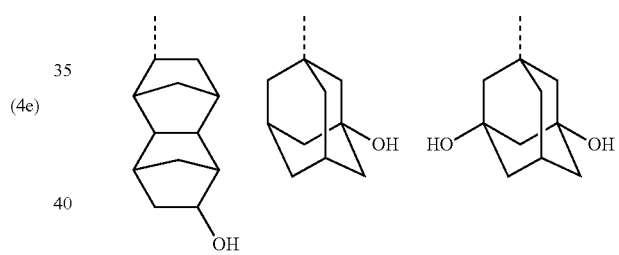

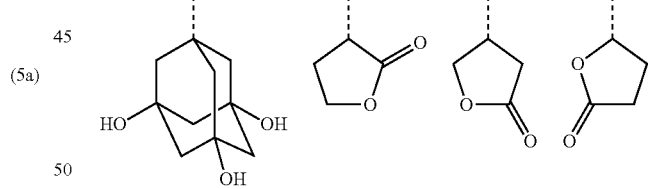

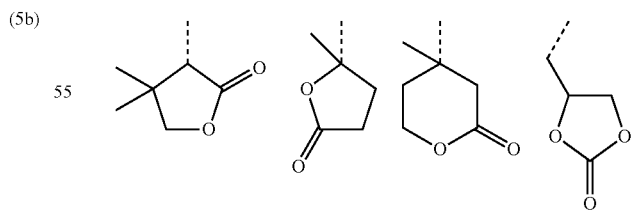

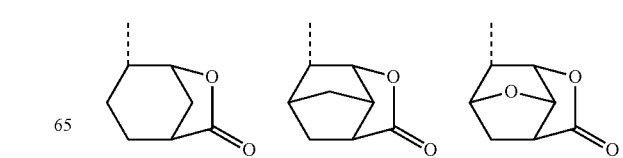

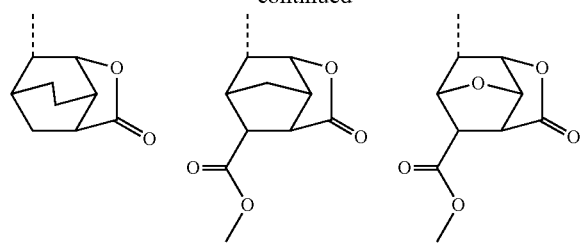
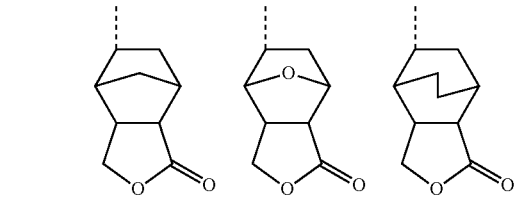
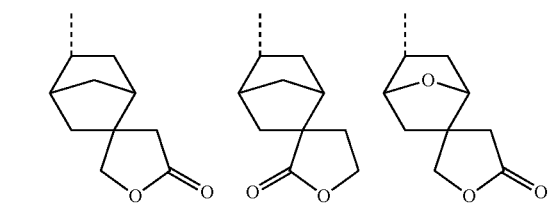
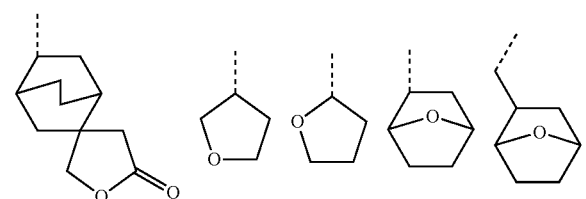
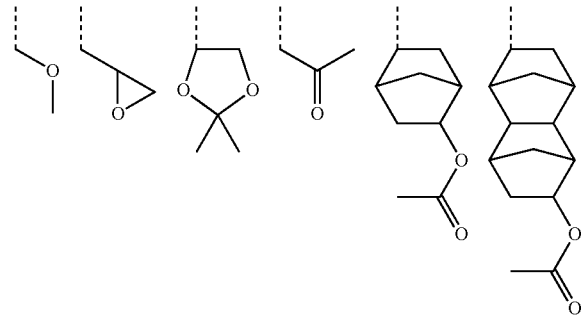
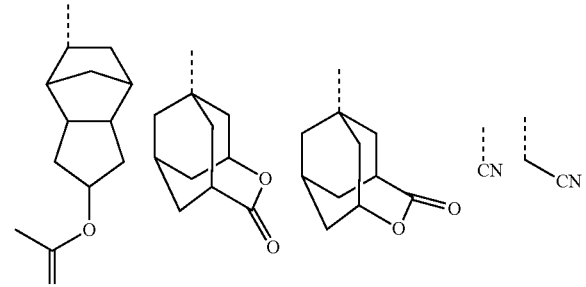
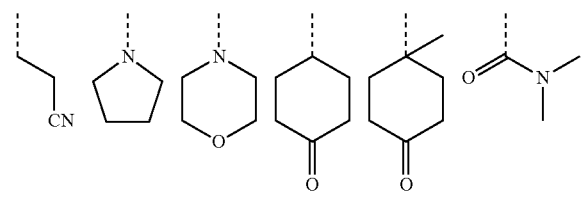

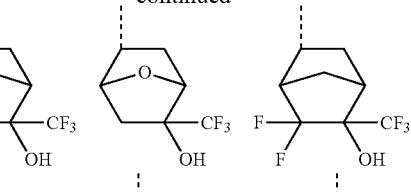
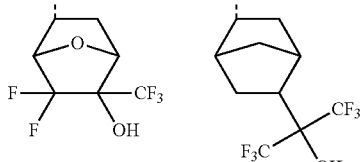
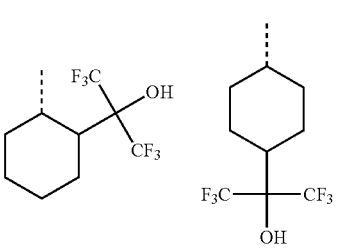
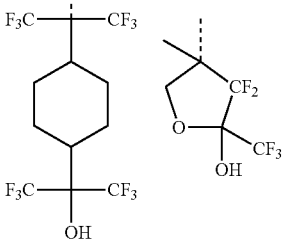

Herein, the broken line designates a valence bond.

The acid labile group represented by $R^{13}$ may be selected from those groups illustrated for $R^{4a}$.

Suitable divalent $C_1$-$C_{15}$ organic groups represented by $R^{14}$ include the above-exemplified monovalent hydrocarbon groups, with one hydrogen atom eliminated (e.g., methylene and ethylene). Also useful are groups of the following formulae.

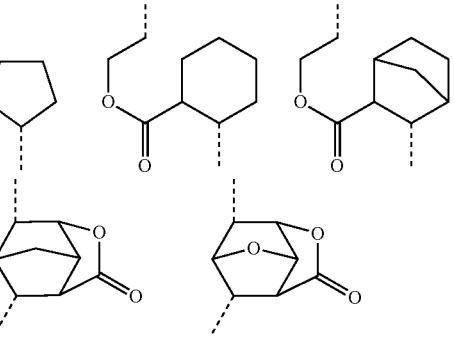

Herein, the broken line designates a valence bond.

Monomer Synthesis

The polymer used herein may be obtained by polymerizing monomers corresponding to recurring units of formula (1) and optional recurring units of formulae (2a) to (2m), (3a) to (3e), (4a) to (4e), and (5a) to (5c). Monomers corresponding to recurring units of formula (1) may be synthesized, for example, by the method of JP-A 2012-092086. Monomers corresponding to recurring units of formulae (2a) to (2m), (3a) to (3e), (4a) to (4e), and (5a) to (5c) may be synthesized, for example, by the methods of JP 4083399, JP-A 2010-106138, JP-A 2007-204385, JP-A 2009-29974, JP-A 2007-182488, JP-A 2006-152255, JP-A 2011-132273, and JP-A 2007-284381. Also commercially available such monomers may be used.

Polymer Synthesis

The polymer may be synthesized by general polymerization processes including radical polymerization using initiators such as 2,2'-azobisisobutyronitrile (AIBN), and ionic (or anionic) polymerization using alkyl lithium or the like. The polymerization may be carried out by its standard technique. Preferably the polymer is synthesized by radical polymerization while the polymerization conditions may be determined in accordance with the type and amount of initiator, temperature, pressure, concentration, solvent, additives, and the like.

Examples of the radical polymerization initiator used herein include azo compounds such as 2,2'-azobisisobutyronitrile (AIBN), 2,2'-azobis(4-methoxy-2,4-dimethylvaleronitrile), 2,2'-azobis(2,4-dimethylvaleronitrile), 2,2'-azobis(2,4,4-trimethylpentane), and dimethyl 2,2'-azobis(isobutyrate); peroxides such as tert-butylperoxypivalate, lauroyl peroxide, benzoyl peroxide, and tert-butylperoxylaurate; water-soluble polymerization initiators such as potassium persulfate; and redox initiators comprising a peroxide (e.g., potassium persulfate or hydrogen peroxide) combined with a reducing agent (e.g., sodium sulfite). Although the amount of polymerization initiator used may vary with its type and other polymerization conditions, it is generally used in an amount of 0.001 to 10 mol %, and preferably 0.01 to 6 mol % based on the total moles of monomers to be polymerized.

During the synthesis of the polymer, any known chain transfer agent such as dodecyl mercaptan or 2-mercaptoethanol may be added for molecular weight control purpose. The amount of chain transfer agent added is preferably 0.01 to 10 mol % based on the total moles of monomers to be polymerized.

The polymer may be synthesized by combining suitable monomers selected from polymerizable monomers corresponding to recurring units of formulae (1), (2a) to (2m), (3a) to (3e), (4a) to (4e), and (5a) to (5c), adding an initiator and chain transfer agent to the monomer mixture, and effecting polymerization.

In the polymer wherein U1 stands for a total molar number of a monomer corresponding to units of formula (1), U2 stands for a total molar number of monomers corresponding to units of formulae (2a) to (2m), and U3 stands for a total molar number of monomers corresponding to units of formulae (3a) to (3e), (4a) to (4e), and (5a) to (5c), with the proviso that U1+U2+U3=U (=100 mol %), values of U1, U2, and U3 are preferably determined so as to meet:

0<U1/U≤1, more preferably 0.1≤U1/U≤0.9, even more preferably 0.1≤U1/U≤0.8,

0≤U2/U<1, more preferably 0.1≤U2/U≤0.9, even more preferably 0.1≤U2/U≤0.9, and

0≤U3/U<1, more preferably 0≤U3/U≤0.4, even more preferably 0≤U3/U≤0.2.

For polymerization, a solvent may be used if desired. Preferred is the solvent which does not interfere with the desired polymerization reaction. Typical solvents used herein include esters such as ethyl acetate, n-butyl acetate, and γ-butyrolactone; ketones such as acetone, methyl ethyl ketone, and methyl isobutyl ketone; aliphatic or aromatic hydrocarbons such as toluene, xylene and cyclohexane; alcohols such as isopropyl alcohol and ethylene glycol monomethyl ether; and ether solvents such as diethyl ether, dioxane, and tetrahydrofuran, which may be used alone or in admixture. Although the amount of solvent used may vary with the desired degree of polymerization (or molecular weight), the amount of initiator added, and other polymerization conditions such as temperature, it is generally used in such an amount as to provide a concentration of 0.1 to 95% by weight, preferably 5 to 90% by weight of monomers to be polymerized.

Although the temperature of the polymerization reaction may vary with the identity of polymerization initiator or the boiling point of solvent, it is preferably in the range of 20 to 200° C., and more preferably 50 to 140° C. Any desired reactor or vessel may be used for the polymerization reaction.

From the solution or dispersion of the polymer thus synthesized, the organic solvent or water serving as the reaction medium is removed by any well-known techniques. Suitable techniques include, for example, re-precipitation followed by filtration, and heat distillation under vacuum.

Desirably the polymer has a weight average molecular weight (Mw) of 1,000 to 500,000, and especially 2,000 to 30,000, as determined versus polystyrene standards by gel permeation chromatography (GPC). This is because a polymer with too low a Mw may readily dissolve in water and be miscible with a resist material whereas a polymer with too high a Mw may have such drawbacks as difficult film formation by spin coating, low alkali solubility, and development defects.

In the polymer, $R^{4a}$ and $R^{13}$ may be introduced by post-protection reaction. Specifically, a monomer wherein $R^{4a}$ or $R^{13}$ is hydrogen is previously polymerized to synthesize a precursor polymer. Post-protection reaction is effected on the precursor polymer for substituting groups $R^{4a}$ or $R^{13}$ for some or all hydroxyl groups on the precursor polymer as shown below.

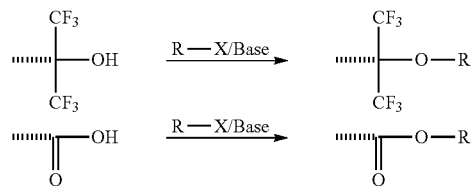

Herein R stands for $R^{4a}$ or $R^{13}$, and X is chlorine, bromine or iodine.

The desired polymer is obtainable via post-protection reaction by reacting the precursor polymer with a base in an amount of 1 to 2 equivalents relative to the desired degree of substitution of hydroxyl groups, and then with R-X in an amount of 1 to 2 equivalents relative to the base.

The post-protection reaction may be effected in a solvent, which is selected from hydrocarbons such as benzene and toluene, and ethers such as dibutyl ether, diethylene glycol diethyl ether, diethylene glycol dimethyl ether, tetrahydrofuran and 1,4-dioxane, alone or in admixture. Suitable bases used herein include, but are not limited to, sodium hydride, n-butyl lithium, lithium diisopropylamide, triethylamine, and pyridine.

In the polymer used herein, the ammonium salt in the recurring unit of formula (2m) may be obtained from neutralization reaction of a sulfo group with a corresponding amine or ion exchange reaction of a sulfo group with an ammonium salt of the following general formula.

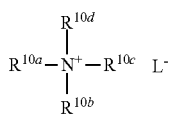

Herein $R^{10a}$ to $R^{10d}$ are as defined above, and $L^-$ is $OH^-$, $Cl^-$, $Br^-$, $I^-$, $RbCO_2^-$, or $NO_3^-$.

When the recurring units of formula (2m) are introduced into the polymer used herein, the neutralization reaction or ion exchange reaction mentioned above may be carried out either at the monomer stage or subsequent to polymer synthesis. In the latter case where the reaction is carried out subsequent to polymer synthesis, if the amount of amine added is small, the amine salt is not uniformly formed within the polymer units, which may cause local bridge defects during pattern formation. To avoid such inconvenience, it is preferred that the neutralization reaction or ion exchange reaction mentioned above be carried out at the monomer stage and the resulting monomer having a uniform distribution of sulfonic acid amine salt be used in polymerization.

For the recurring units of formula (2m) in the polymer, the degree of neutralization of sulfo with amine throughout the polymer may be a low amine equivalent with remaining sulfonic acid residues, or inversely an amine excess. When the protective film-forming composition is combined with photoresist, the presence of sulfonic acid residues is effective for preventing bridges between resist pattern features after development, and the excess amine is effective for rendering the resist pattern more rectangular. With these considerations, the amounts of sulfo group and amine may be adjusted as appropriate while observing the resist pattern after development.

Protective Film-Forming Composition

The polymer comprising recurring units of formula (1) is used to formulate a resist protective film-forming composition. In the composition, the recurring units of formula (1) exert excellent properties of water repellency and water slip. When a polymer comprising recurring units of formula (1) in combination with recurring units of formulae (2a) to (2m) is used, the protective film-forming composition offers the additional advantages of minimal development defects and good pattern profile.

In a preferred embodiment of the resist protective film-forming composition, a polymer comprising recurring units of formulae (1), (2a) to (2m), (3a) to (3e), (4a) to (4e), and (5a) to (5c) is used. In combination with the inventive polymer, another polymer may be used for the purposes of altering mechanical and thermal properties, alkali solubility, water repellency, water slip, and other properties of the film. The range of the other polymer which can be combined is not particularly limited, and the inventive polymer may be mixed with any of other polymers well known for the protective film application in any desired range.

Most often, the polymer is dissolved in a suitable solvent to form a solution which is ready for use as the resist protective film-forming composition. For film formation by spin coating technique, the solvent is preferably used in such amounts to provide a concentration of 0.1 to 20% by weight, more preferably 0.5 to 10% by weight of the polymer.

The solvent used herein is not particularly limited although those solvents which do not dissolve resist layers are preferably used. Suitable solvents which do not dissolve resist layers include nonpolar solvents, for example, higher alcohols of at least 4 carbon atoms, toluene, xylene, anisole, hexane, cyclohexane, decane and ethers. Of these, ether compounds of 8 to 12 carbon atoms and higher alcohols of at least 4 carbon atoms are most desirable. Exemplary of the ether compounds are di-n-butyl ether, di-sec-butyl ether, di-tert-butyl ether, diisobutyl ether, di-n-pentyl ether, di-sec-pentyl ether, diisopentyl ether, and di-n-hexyl ether. Exemplary of the alcohols are 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, and cyclohexanol. These solvents may be used alone or in admixture.

Fluorinated solvents are also preferred because resist layers are not dissolvable therein. Examples include, but are not limited to, 2-fluoroanisole, 3-fluoroanisole, 4-fluoroanisole, 2,3-difluoroanisole, 2,4-difluoroanisole, 2,5-difluoroanisole, 5,8-difluoro-1,4-benzodioxane, 2,3-difluorobenzyl alcohol, 1,3-difluoro-2-propanol, 2',4'-difluoropropiophenone, 2,4-difluorotoluene, trifluoroacetaldehyde ethyl hemiacetal, trifluoroacetamide, trifluoroethanol, 2,2,2-trifluoroethyl butyrate, ethyl heptafluorobutyrate, ethyl heptafluorobutylacetate, ethyl hexafluoroglutarylmethyl, ethyl 3-hydroxy-4,4,4-trifluorobutyrate, ethyl 2-methyl-4,4,4-trifluoroacetoacetate, ethyl pentafluorobenzoate, ethyl pentafluoropropionate, ethyl pentafluoropropynylacetate, ethyl perfluorooctanoate, ethyl 4,4,4-trifluoroacetoacetate, ethyl 4,4,4-trifluorobutyrate, ethyl 4,4,4-trifluorocrotonate, ethyl trifluorosulfonate, ethyl 3-(trifluoromethyl)butyrate, ethyl trifluoropyruvate, S-ethyl trifluoroacetate, fluorocyclohexane, 2,2,3,3,4,4,4-heptafluoro-1-butanol, 1,1,1,2,2,3,3-heptafluoro-7,7-dimethyl-4,6-octanedione, 1,1,1,3,5,5,5-heptafluoropentane-2,4-dione, 3,3,4,4,5,5,5-heptafluoro-2-pentanol, 3,3,4,4,5,5,5-heptafluoro-2-pentanone, isopropyl 4,4,4-trifluoroacetoacetate, methyl perfluorodecanoate, methyl perfluoro(2-methyl-3-oxahexanoate), methyl perfluorononanoate, methyl perfluorooctanoate, methyl 2,3,3,3-tetrafluoropropionate, methyl trifluoroacetoacetate, 1,1,1,2,2,6,6,6-octafluoro-2,4-hexanedione, 2,2,3,3,4,4,5,5-octafluoro-1-pentanol, 1H,1H,2H,2H-perfluoro-1-decanol, perfluoro(2,5-dimethyl-3,6-dioxane anionic) acid methyl ester, 2H-perfluoro-5-methyl-3,6-dioxanonane, 1H,1H,2H,3H,3H-perfluorononane-1,2-diol, 1H,1H,9H-perfluoro-1-nonanol, 1H,1H-perfluorooctanol, 1H,1H,2H,2H-perfluorooctanol, 2H-perfluoro-5,8,11,14-tetramethyl-3,6,9,12,15-pentaoxa-octadecane, perfluorotributylamine, perfluorotrihexylamine, methyl perfluoro-2,5,8-trimethyl-3,6,9-trioxadodecanoate, perfluorotripentylamine, perfluorotripropylamine, 1H,1H,2H,3H,3H-perfluoroundecane-1,2-diol, trifluorobutanol, 1,1,1-trifluoro-5-methyl-2,4-hexanedione, 1,1,1-trifluoro-2-propanol, 3,3,3-trifluoro-1-propanol, 1,1,1-trifluoro-2-propyl acetate, perfluorobutyltetrahydrofuran, perfluorodecalin, perfluoro(1,2-dimethylcyclohexane), perfluoro(1,3-dimethylcyclohexane), propylene glycol trifluoromethyl ether acetate, propylene glycol methyl ether trifluoromethyl acetate, butyl trifluoromethylacetate, methyl 3-trifluoromethoxypropionate, perfluorocyclohexanone, propylene glycol trifluoromethyl ether, butyl trifluoroacetate, 1,1,1-trifluoro-5,5-dimethyl-2,4-hexanedione, 1,1,1,3,3,3-hexafluoro-2-propanol, 1,1,1,3,3,3-hexafluoro-2-methyl-2-propanol, 2,2,3,4,4,4-hexafluoro-1-butanol, 2-trifluoromethyl-2-propanol, 2,2,3,3-tetrafluoro-1-propanol, 3,3,3-trifluoro-1-propanol, and 4,4,4-trifluoro-1-butanol, which may be used alone or in admixture.

In the protective film-forming composition, a basic compound may be added for improving some properties, for example, for correcting the pattern profile. When the polymer used in the protective film-forming composition has an acidic hydroxyl group in its recurring units, there is a possibility that part of the quencher in the resist film will migrate to the protective film. If such quencher migration occurs, the resist layer has a lower quencher concentration at its outermost surface, leading to a film thickness loss of the resist pattern after development. As an effective means for avoiding migration of the quencher, a basic compound is previously added to the protective film-forming composition for thereby preventing any degradation of pattern profile.

Suitable basic compounds are organic nitrogen-containing compounds which may be used alone or in admixture. Exemplary organic nitrogen-containing compounds include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, amide derivatives, imide derivatives, and carbamate derivatives. Examples are described in JP-A 2008-111103, paragraphs [0149] to [0163]. Preferably the basic compound is used in an amount of 0.001 to 2 parts, more preferably 0.01 to 1 parts by weight per 100 parts by weight of the polymer.

Patterning Process

A further embodiment of the invention is a pattern forming process comprising the steps of (1) forming a photoresist film on a substrate, (2) forming a protective film on the photoresist film using the protective film-forming composition defined above, (3) exposing the resist film, and (4) developing in a developer.

The step (2) of forming a protective film is described. The protective film-forming composition in solution form is spin coated onto a prebaked photoresist film and prebaked on a hot plate at 50 to 150° C. for 1 to 10 minutes, preferably at 70 to 140° C. for 1 to 5 minutes to form a resist protective film, preferably having a thickness of 10 to 500 nm.

In conjunction with spin coating, the amount of the protective film-forming composition dispensed can be reduced if the resist film is wetted at its surface with a solvent and then coated with the protective film-forming composition. The means of wetting the resist surface may be spin coating, vapor priming or the like, with the spin coating being often employed. The solvent used herein may be selected from the aforementioned higher alcohols, ether solvents and fluorochemical solvents in which the resist film is not dissolvable.

In the exposure step, a mask having the desired pattern is placed over the photoresist film, and the film exposed through the mask to an electron beam or to high-energy radiation such as deep-UV, excimer laser or x-ray in a dose of 1 to 200 mJ/cm$^2$, and preferably 10 to 100 mJ/cm$^2$. The high-energy radiation used herein preferably has a wavelength in the range of 180 to 250 nm. The exposure step favors the immersion lithography involving exposing the resist film to light from a projection lens, with a liquid interposed between the resist protective film and the projection lens. The lithography used herein is not particularly limited, and dry lithography in air or nitrogen atmosphere is acceptable. Exposure in vacuum using EB or EUV is also acceptable. In the case of the immersion lithography, a light source producing an exposure wavelength in the range of 180 to 250 nm is preferred, and water is preferred as the liquid between the protective film and the lens.

In the immersion lithography, whether or not the wafer edge and rear side are cleaned and the cleaning technique are important in preventing flowing of water to the wafer rear side and leaching from the substrate. For example, after spin coating, the resist protective film-forming composition is baked at a temperature of 40 to 130° C. for 10 to 300 seconds for evaporating off the solvent. In the case of resist layer formation and dry lithography, edge cleaning is performed during the spin coating. In the case of immersion lithography, however, such edge cleaning is undesirable because water may be left on the hydrophilic substrate surface at the edge. It is then recommended to omit edge cleaning during the spin coating of the resist protective film.

Exposure is followed by post-exposure bake (PEB) on a hot plate at 60 to 150° C. for 1 to 5 minutes, preferably at 80 to 140° C. for 1 to 3 minutes. Sometimes water is left on the protective film prior to PEB. If PEB is performed in the presence of residual water, water can penetrate through the protective film to suck up the acid in the resist, impeding pattern formation. Such inconvenience must be avoided by fully removing the water on the protective film prior to PEB. The water on the protective coating should be dried or recovered by suitable means, for example, spin drying, purging of the protective coating surface with dry air or nitrogen, or optimizing the water recovery nozzle configuration on a stage or water recovery process. Additionally, the design and utilization of a material having high water repellency and water slip, typically the protective film-forming composition of the invention, offers the advantage of efficient water removal.

After PEB, development is carried out using as the developer an aqueous alkaline solution, such as a 0.1 to 5 wt %, preferably 2 to 3 wt %, aqueous solution of tetramethylammonium hydroxide (TMAH), this being done by a conventional method such as dip, puddle, or spray development for a period of 10 to 300 seconds, and preferably 0.5 to 2 minutes. A typical developer is a 2.38 wt % TMAH aqueous solution. These steps result in the formation of the desired pattern on the substrate. Where the resist protective film-forming composition is used, the protective film-forming composition itself exhibits alkaline solubility so that the protective film can be stripped at the same time as development.

Where a pattern is formed using the protective film-forming composition, the resist material of which the underlying resist layer is made is not particularly limited. The resist type may be either positive or negative working and also either a monolayer resist of conventional hydrocarbon or a bilayer (or multilayer) resist containing silicon atoms or the like.

For KrF lithography resist materials, the preferred base resins are polyhydroxystyrene or polyhydroxystyrene-(meth) acrylate copolymers in which some or all hydrogen atoms of hydroxyl or carboxyl groups are replaced by acid labile groups.

For ArF lithography resist materials, the preferred base resin has an aromatic-free structure. Illustrative polymers include (meth)acrylic derivative copolymers, norbornene derivative/maleic anhydride alternating copolymers, norbornene derivative/maleic anhydride/(meth)acrylic derivative copolymers, tetracyclododecene derivative/maleic anhydride alternating copolymers, tetracyclododecene derivative/maleic anhydride/(meth)acrylic derivative copolymers, norbornene derivative/maleimide alternating copolymers, norbornene derivative/maleimide/(meth)acrylic derivative copolymers, tetracyclododecene derivative/maleimide derivative alternating copolymers, tetracyclododecene derivative/maleimide derivative/(meth)acrylic derivative copolymers, polynorbornene derivatives, and ring-opening metathesis polymerization (ROMP) polymers, and a combination of any.

A polymer comprising recurring units containing aromatic ring could not be used initially as the ArF lithography resist since it has absorption at wavelength 193 nm. As the resist film becomes thinner, the influence of absorption is mitigated, indicating the potential of such a polymer being applied to the ArF lithography. Also, since the reflection of oblique incident light from the substrate increases when a projection lens has a NA in excess of 1, it is proposed to positively utilize the absorptive aromatic ring for suppressing reflection from the substrate. Polymers useful in this case include copolymers of hydroxyvinylnaphthalene, methacrylates containing naphthalene and naphthol structures on side chains, fluorinated hydroxystyrene, fluoroalkylhydroxystyrene, fluorinated styrene, fluoroalkylstyrene, hexafluoroisopropanolstyrene, and hexafluoroisopropanolindene.

A further aspect of the invention provides a pattern forming process involving the steps of forming a photoresist layer on a mask blank, forming a protective film on the photoresist layer from the resist protective film-forming composition defined above, effecting EB exposure in vacuum, and development.

Namely, the resist protective film-forming composition is applicable to the pattern forming process for mask blanks. Specifically, a photoresist is coated on a mask blank substrate of $SiO_2$, Cr, CrO, CrN, MoSi or the like before the protective coating composition is applied to form a protective coating on the resist film. By further forming a SOG film and an organic undercoat film between the photoresist and the blank substrate, there is provided a three-layer structure which is also acceptable herein. Once the protective coating film is formed, the structure is exposed to EB in vacuum using an EB image-writing system. The exposure is followed by post-exposure baking (PEB) and development in an alkaline developer for 10 to 300 seconds.

For the resist material used with mask blanks, novolac resins and hydroxystyrene are often used as the base resin. Those resins in which alkali-soluble hydroxyl groups are substituted with acid labile groups are used for positive resists while these resins in combination with crosslinking agents are used for negative resists. Base polymers which can be used herein include copolymers of hydroxystyrene with one or more of (meth)acrylic derivatives, styrene, vinyl naphthalene, vinyl anthracene, vinyl pyrene, hydroxyvinyl naphthalene, hydroxyvinyl anthracene, indene, hydroxyindene, acenaphthylene, norbornadiene, coumarone, and chromone.

EXAMPLE

Examples are given below by way of illustration and not by way of limitation. Mw and Mn are weight and number average molecular weights, respectively, as measured by GPC versus polystyrene standards, and Mw/Mn is a polydispersity index. Me stands for methyl.

Monomer Synthesis

Monomers are polymerized into a polymer for use in a resist protective film-forming composition. A polymerizable monomer corresponding to the recurring unit of formula (1) as an essential component is synthesized by the method of JP-A 2012-092086. Monomers corresponding to recurring units of formulae (2a) to (2m), (3a) to (3e), (4a) to (4e), and (5a) to (5c) may be synthesized, for example, by the methods of JP 4083399, JP-A 2010-106138, JP-A 2007-204385, JP-A 2009-29974, JP-A 2007-182488, JP-A 2006-152255, JP-A 2011-132273, and JP-A 2007-284381. Also commercially available such monomers may be used.

Reference Example 1

Fluorinated monomers were synthesized according to the following formulation.

Reference Example 1-1

Synthesis of Monomer 1

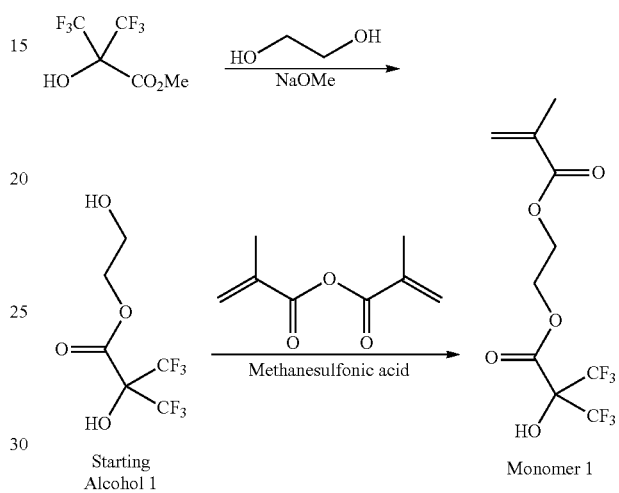

Starting Alcohol 1

Monomer 1

Reference Example 1-1-1

Synthesis of Starting Alcohol 1

A flask equipped with a distillation column was charged with 20.0 g of methyl 3,3,3-trifluoro-2-hydroxy-2-(trifluoromethyl)propionate, 16.5 g of ethylene glycol, 50 mL of benzene, and 0.9 g of sodium methoxide (28 wt % methanol solution). In a nitrogen atmosphere, the reaction mixture was heated under reflux for 6 hours while methanol formed during reaction was sequentially distilled off. This was followed by ordinary aqueous work-up, solvent removal by distillation, and purification by distillation, obtaining 17.2 g of Starting Alcohol 1 (yield 76%).

Boiling point: 64° C./170 Pa

Reference Example 1-1-2

Synthesis of Monomer 1

To 3.30 g of Starting Alcohol 1 were added 1.92 g of methacrylic anhydride, 10 mL of toluene, and 0.05 g of methanesulfonic acid. In a nitrogen atmosphere, the reaction mixture was heated and stirred at 50° C. for 10 hours. This was followed by ordinary aqueous work-up, solvent removal by distillation, and purification by distillation, obtaining 3.40 g of Monomer 1 (yield 81%).

Boiling point: 51° C./17 Pa

IR (thin film): ν=3392, 2967, 1766, 1722, 1639, 1456, 1375, 1317, 1299, 1241, 1162, 1056, 1025, 1010, 977 cm$^{-1}$ $^1$H-NMR (600 MHz in DMSO-$d_6$): δ=1.84 (3H, m), 4.34 (2H, m), 4.62 (2H, m), 5.69 (1H, m), 5.99 (1H, m), 9.23 (1H, s) ppm $^{19}$F-NMR (565 MHz in DMSO-$d_6$): δ=−75.03 (6F, s) ppm

Reference Example 1-2

Synthesis of Monomer 2

Monomer 2 was synthesized by the same procedure as Reference Example 1-1-2 aside from using acrylic anhydride instead of methacrylic anhydride. Two step yield 58%.

Reference Example 1-3

Synthesis of Monomer 3

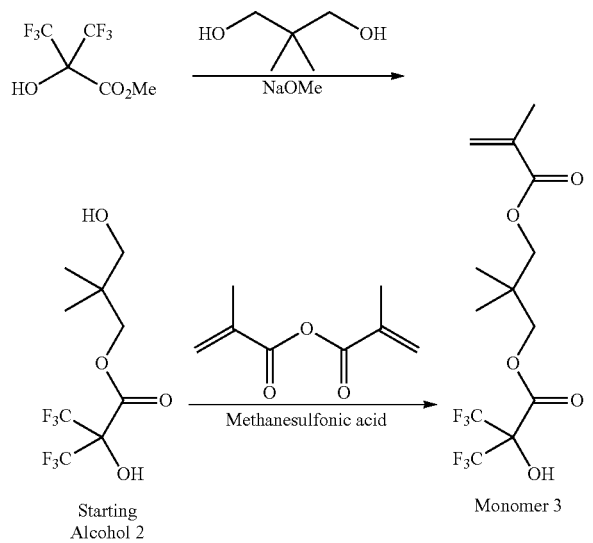

Reference Example 1-3-1

Synthesis of Starting Alcohol 2

Starting Alcohol 2 was synthesized by the same procedure as Reference Example 1-1-1 aside from using neopentyl glycol instead of ethylene glycol. Yield 72%.

IR (thin film): ν=3546, 3515, 3164, 2978, 2950, 2889, 1764, 1480, 1379, 1328, 1256, 1225, 1162, 1040, 1014, 998, 978 cm$^{-1}$ $^1$H-NMR (600 MHz in DMSO-d$^6$): δ=0.84 (6H, s), 3.17 (2H, s), 4.10 (2H, s), 4.70 (1H, s), 9.11 (1H, s) ppm $^{19}$F-NMR (565 MHz in DMSO-d$_6$): δ=−75.06 (6F, s) ppm

Reference Example 1-3-2

Synthesis of Monomer 3

Monomer 3 was synthesized by the same procedure as Reference Example 1-1-2 aside from using Starting Alcohol 2 instead of Starting Alcohol 1. Yield 92%.

Boiling point: 69° C./12 Pa

IR (thin film): ν=3460, 3385, 2973, 1765, 1716, 1639, 1477, 1457, 1376, 1322, 1241, 1225, 1162, 1012, 977, 946 cm$^{-1}$ $^1$H-NMR (600 MHz in DMSO-d$_6$): δ=0.95 (6H, s), 1.86 (3H, s), 3.89 (2H, s), 4.19 (2H, s), 5.67 (1H, m), 6.03 (1H, m), 9.21 (1H, s) ppm $^{19}$F-NMR (565 MHz in DMSO-d$_6$): δ=−75.14 (6F, s) ppm

Reference Example 1-4

Synthesis of Monomer 4

Monomer 4 was synthesized by the same procedure as Reference Example 1-1-2 aside from using Starting Alcohol 2 instead of Starting Alcohol 1 and acrylic anhydride instead of methacrylic anhydride. Two-step yield 59%.

Reference Example 1-5

Synthesis of Monomer 5

Monomer 5 was synthesized by the same procedure as Reference Example 1-1-2 aside from using Starting Alcohol 2 instead of Starting Alcohol 1 and α-trifluoromethylacrylic anhydride instead of methacrylic anhydride. Two-step yield 48%.

Reference Example 1-6

Synthesis of Monomer 6

Monomer 6 was synthesized by the same procedure as Reference Examples 1-1-1 and 1-1-2 aside from using 4-methylpentane-1,3-diol instead of ethylene glycol. Two-step yield 38%.

Boiling point: 85-86° C./28 Pa

IR (thin film): ν=3459, 2972, 1760, 1716, 1638, 1469, 1373, 1324, 1241, 1224, 1009, 977 cm$^{-1}$ $^1$H-NMR (600 MHz in DMSO-d$_6$): δ=0.87 (6H, t), 1.87 (3H, s), 1.90-2.03 (3H, m), 4.24-4.31 (1H, m), 4.33-4.37 (1H, m), 4.78-4.82 (1H, m), 5.66 (1H, m), 6.03 (1H, m), 9.13 (1H, s) ppm $^{19}$F-NMR (565 MHz in DMSO-d$_6$): δ=−75.09 (6F, s) ppm

Reference Example 1-7

Synthesis of Monomer 7

Monomer 7 was synthesized by the same procedure as Reference Examples 1-1-1 and 1-1-2 aside from using 3-methylbutane-1,3-diol instead of ethylene glycol. Two-step yield 42%.

Reference Example 1-8

Synthesis of Monomer 8

Monomer 8 was synthesized by the same procedure as Reference Examples 1-1-1 and 1-1-2 aside from using neopentyl glycol instead of ethylene glycol. Two-step yield 37%.

IR (thin film): ν=3461, 3334, 2995, 1763, 1711, 1640, 1474, 1317, 1303, 1246, 1220, 1163, 1016, 975 cm$^{-1}$ $^1$H-NMR (600 MHz in DMSO-d$_6$): δ=1.04 (3H, s), 1.86 (3H, s), 4.02 (2H, s), 4.31 (4H, s), 5.69 (1H, m), 6.06 (1H, m), 9.30 (2H, s) ppm $^{19}$F-NMR (565 MHz in DMSO-d$_6$): δ=−75.28 (12F, s) ppm

Reference Example 1-9

Synthesis of Monomer 9

Monomer 9 was synthesized by the same procedure as Reference Examples 1-1-1 and 1-1-2 aside from using neopentyl glycol instead of ethylene glycol and acrylic anhydride instead of methacrylic anhydride. Two-step yield 34%.

Reference Example 1-10

Synthesis of Monomer 10

Monomer 10 was synthesized by the same procedure as Reference Examples 1-1-1 and 1-1-2 aside from using glycerol instead of ethylene glycol. Two-step yield 39%.

Boiling point: 97-98° C./11 Pa

IR (thin film): ν=3469, 2972, 1766, 1722, 1638, 1455, 1382, 1314, 1227, 1161, 1013, 978 cm$^{-1}$ $^1$H-NMR (600 MHz in DMSO-$d_6$): δ=1.81 (3H, s), 4.55-4.68 (4H, m), 5.39-5.43 (1H, m), 5.70 (1H, m), 5.97 (1H, m), 9.30 (2H, s) ppm $^{19}$F-NMR (565 MHz in DMSO-$d_6$): δ=−75.20 (12F, s) ppm

Reference Example 1-11

Synthesis of Monomer 11

Monomer 11 was synthesized by the same procedure as Reference Examples 1-1-1 and 1-1-2 aside from using 2,2-difluoro-4-methylbutane-1,3-diol instead of ethylene glycol. Two-step yield 31%.

Reference Example 1-12

Synthesis of Monomer 12

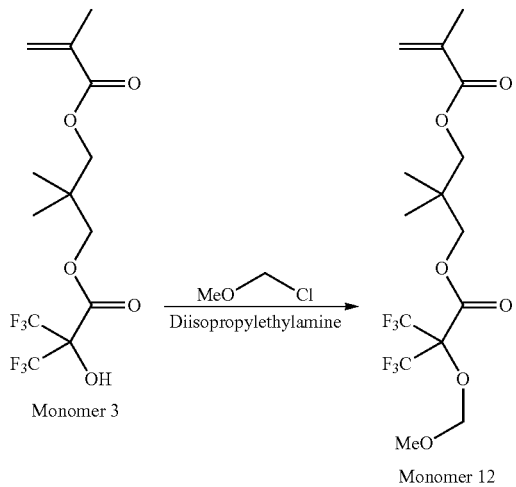

At a temperature below 20° C., 9.7 g of chloromethyl methyl ether was added dropwise to a mixture of 36.6 g of Monomer 3, 16.2 g of diisopropylethylamine, and 70.0 g of acetonitrile. The mixture was stirred at the temperature for 3 hours. This was followed by ordinary aqueous work-up, solvent removal by distillation, and purification by distillation, obtaining 39.8 g of Monomer 12 (yield 97%).

Boiling point: 78-79° C./12 Pa

IR (thin film): ν=2970, 2935, 1766, 1723, 1639, 1477, 1402, 1374, 1296, 1257, 1229, 1161, 1074, 1028, 994, 935 cm$^{-1}$ $^1$H-NMR (600 MHz in DMSO-$d_6$): δ=0.97 (6H, s), 1.86 (3H, s), 3.38 (3H, s), 3.89 (2H, s), 4.20 (2H, s), 5.04 (2H, s), 5.67 (1H, m), 6.03 (1H, m) ppm $^{19}$F-NMR (565 MHz in DMSO-$d_6$): δ=−72.49 (6F, s) ppm

Reference Example 1-13

Synthesis of Monomer 13

Monomer 13 was synthesized by the same procedure as Reference Example 1-12 aside from using isobutyric acid chloride instead of chloromethyl methyl ether. Yield 96%.

Boiling point: 90-91° C./11 Pa

IR (thin film): ν=2979, 1773, 1724, 1639, 1472, 1401, 1374, 1260, 1235, 1163, 1117, 1086, 1041, 999, 943 cm$^{-1}$ $^1$H-NMR (600 MHz in DMSO-$d_6$): δ=0.95 (6H, s), 1.14 (6H, d), 1.86 (3H, s), 2.86 (1H, sept), 3.85 (2H, s), 4.17 (2H, s), 5.67 (1H, m), 6.03 (1H, m) ppm $^{19}$F-NMR (565 MHz in DMSO-$d_6$): δ=−71.57 (6F, s) ppm

Reference Example 1-14

Synthesis of Monomer 14

Monomer 14 was synthesized by the same procedure as Reference Example 1-12 aside from using Monomer 8 instead of Monomer 3. Yield 96%.

Boiling point: 116-117° C./9 Pa

IR (thin film): ν=2970, 2837, 1769, 1726, 1640, 1474, 1453, 1404, 1380, 1295, 1255, 1229, 1159, 1145, 1074, 1029, 994, 934 cm$^{-1}$ $^1$H-NMR (600 MHz in DMSO-$d_6$): δ=1.05 (3H, s), 1.87 (3H, s), 3.38 (6H, s), 4.01 (2H, s), 4.31-4.36 (4H, m), 5.05 (4H, s), 5.70 (1H, m), 6.07 (1H, m) ppm $^{19}$F-NMR (565 MHz in DMSO-$d_6$): δ=−72.58 (12F, s) ppm

Reference Example 1-15

Synthesis of Monomer 15

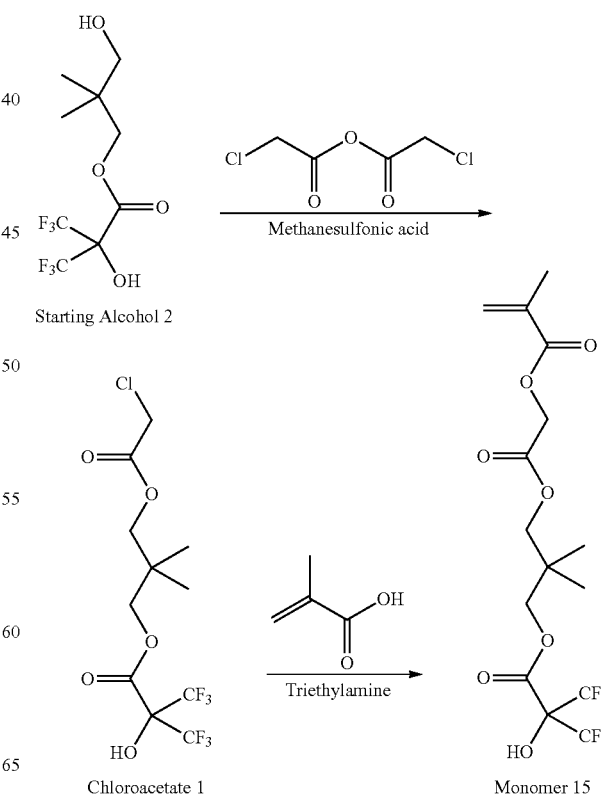

Reference Example 1-15-1

Synthesis of Chloroacetate 1

Chloroacetate 1 was synthesized by the same procedure as Reference Example 1-1-2 aside from using Starting Alcohol 2 instead of Starting Alcohol 1 and chloroacetic anhydride instead of methacrylic anhydride. Yield 88%.

Reference Example 1-15-2

Synthesis of Monomer 15

At a temperature below 25° C., a mixture of 137 g of triethylamine and 100 g of dimethylformamide was added dropwise to a mixture of 129 g of methacrylic acid, 139 g of Chloroacetate 1 (Reference Example 1-15-1), 22.0 g of sodium iodide and 400 g of dimethylformamide. The mixture was stirred at the temperature for 8 hours. Below 30° C., 300 g of 10 wt % hydrochloric acid was added. This was followed by ordinary work-up and vacuum distillation, obtaining 132 g of the target compound (yield 84%).

Monomers 1 to 15 of Reference Examples are identified below by their structural formulae.

Monomer 1

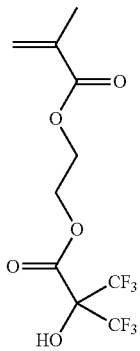

Monomer 2

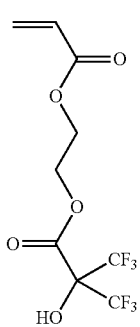

Monomer 3

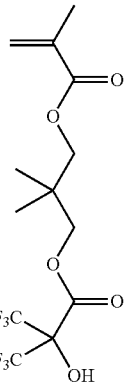

Monomer 4

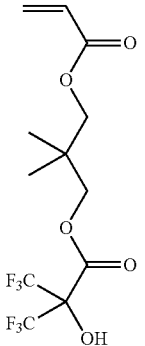

Monomer 5

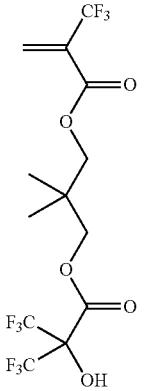

Monomer 6

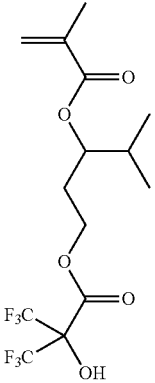

Monomer 7
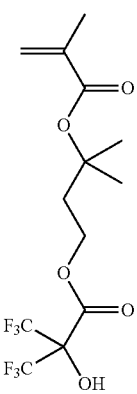
Monomer 8
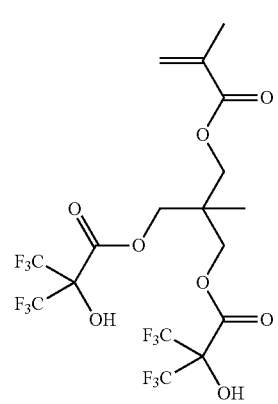
Monomer 9
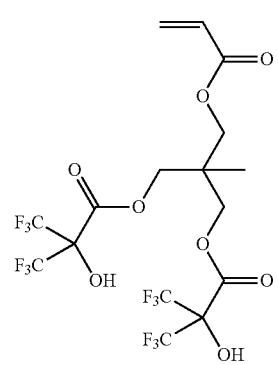
Monomer 10
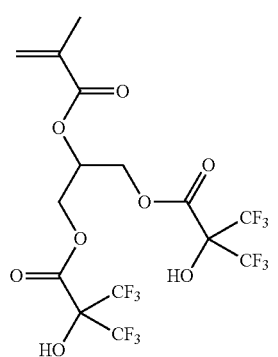
Monomer 11
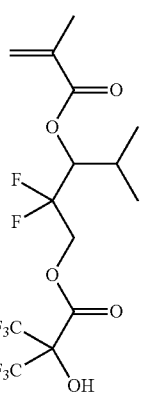
Monomer 12
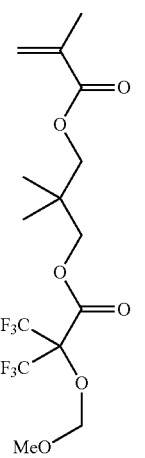
Monomer 13
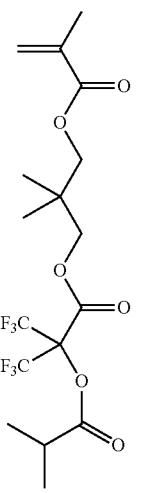

Monomer 14

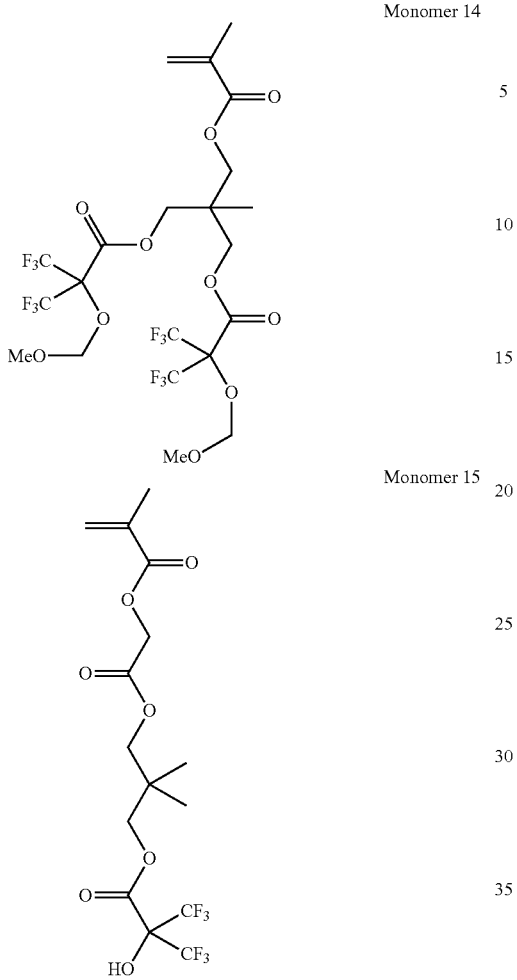

Monomer 15

Polymer Synthesis

Polymers were synthesized according to the following formulation.

Synthesis Example 1-1

Synthesis of Polymer 1

In a nitrogen atmosphere, a flask was charged with 15.0 g of ethylene glycol methacrylate [3,3,3-trifluoro-2-hydroxy-2-(trifluoromethyl)propionate], 0.48 g of dimethyl 2,2'-azobis(isobutyrate), and 15.0 g of toluene/methyl ethyl ketone mixture (mix ratio 9/1) to form a monomer solution at a temperature of 20-25° C. In a nitrogen atmosphere, another flask was charged with 7.50 g of methyl ethyl ketone, which was heated at 80° C. with stirring. The monomer solution was added dropwise thereto over 4 hours. After the completion of dropwise addition, the polymerization solution was stirred for a further 2 hours while maintaining the temperature of 80° C. At the end of maturing, the solution was cooled to room temperature. The polymerization solution was added dropwise to 150 g of hexane whereupon a copolymer precipitated. The copolymer was collected by filtration, washed with 90 g of hexane, and separated as a white solid. The white solid was vacuum dried at 50° C. for 20 hours, yielding the target polymer, designated Polymer 1, in white powder solid form. Amount 14.0 g, yield 85%.

Polymer 1

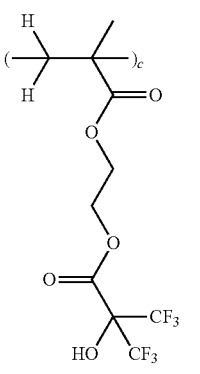

($c = 1.00$, Mw = 11,100)

Synthesis Examples 1-2 to 1-26 and Comparative Synthesis Examples 1-1 to 1-3

Synthesis of Polymers 2 to 26 and Comparative Polymers 1 to 3

Polymers 2 to 26 and Comparative Polymers 1 to 3 were synthesized as in Synthesis Example 1-1 aside from changing the amount and type of monomers. It is noted that the values of c, d, e and f are molar ratios of monomer units.

Polymer 2

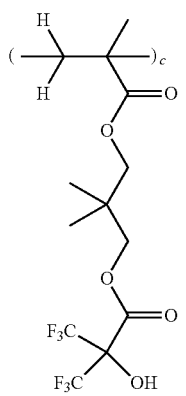

($c = 1.00$, Mw = 11,300)

Polymer 3

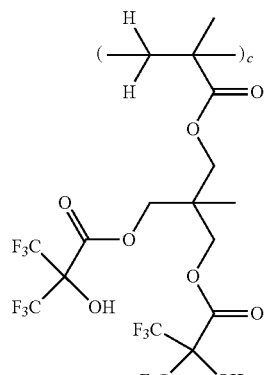

($c = 1.00$, Mw = 12,300)

Polymer 4
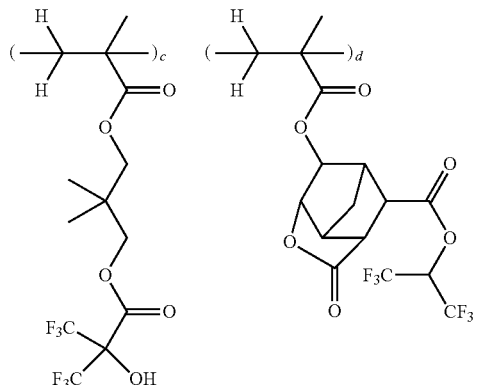
(c = 0.80, d = 0.20, Mw = 10,100)
Polymer 7
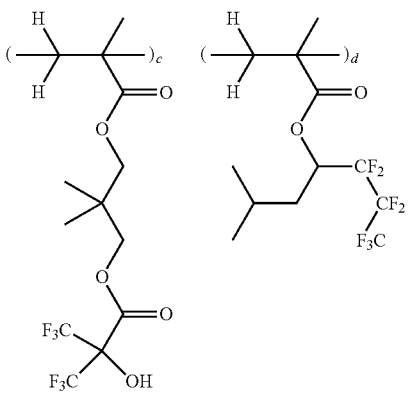
(c = 0.80, d = 0.20, Mw = 10,000)
Polymer 5
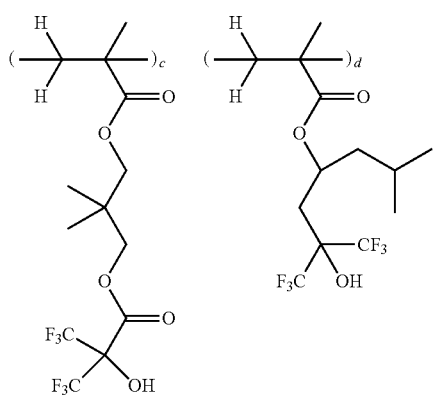
(c = 0.80, d = 0.20, Mw = 10,000)
Polymer 8
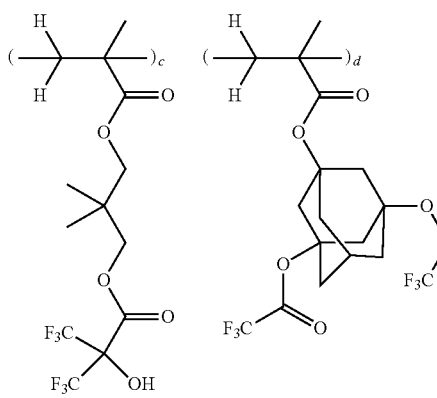
(c = 0.80, d = 0.20, Mw = 10,300)
Polymer 6
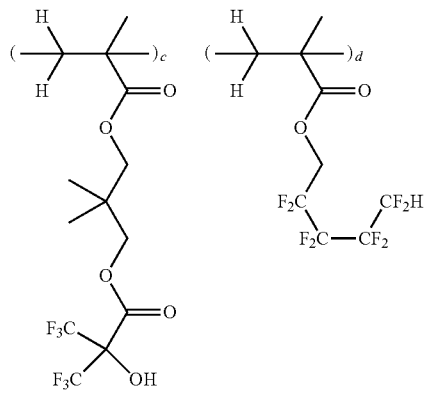
(c = 0.80, d = 0.20, Mw = 9,800)
Polymer 9
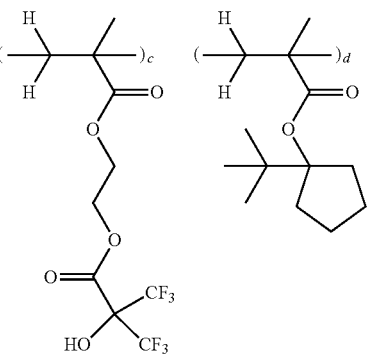
(c = 0.80, d = 0.20, Mw = 9,500)

Polymer 10
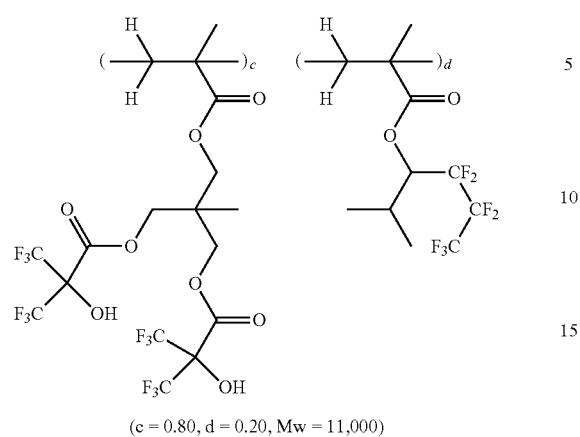
(c = 0.80, d = 0.20, Mw = 11,000)
Polymer 11
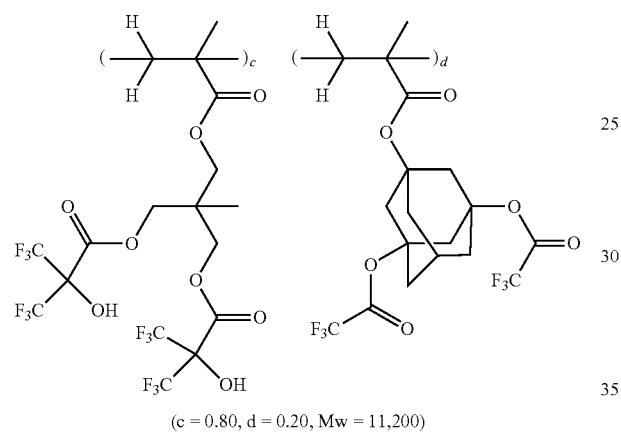
(c = 0.80, d = 0.20, Mw = 11,200)
Polymer 12
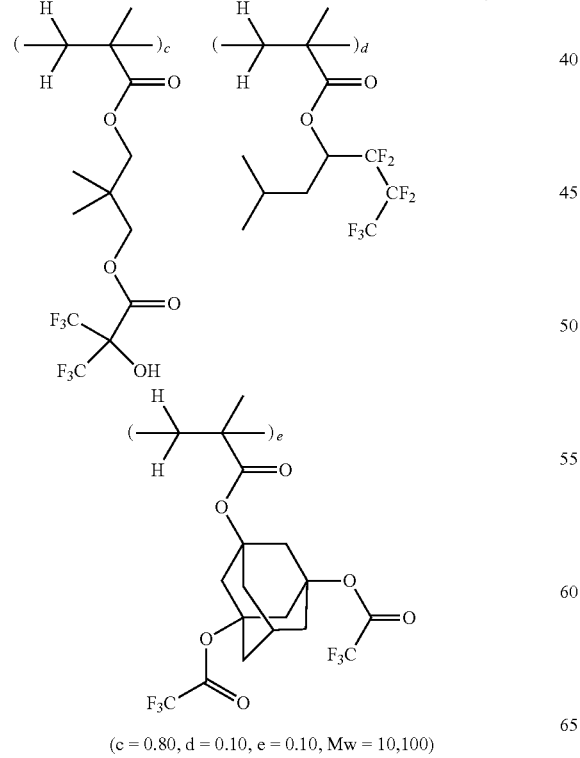
(c = 0.80, d = 0.10, e = 0.10, Mw = 10,100)
Polymer 13
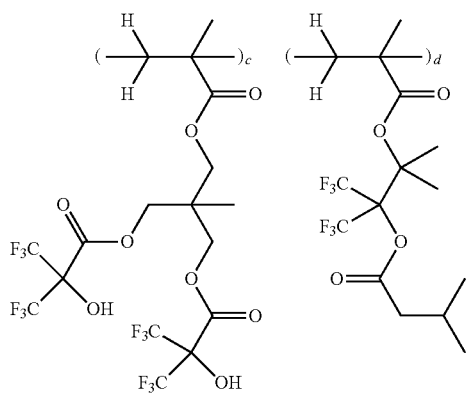
Polymer 14
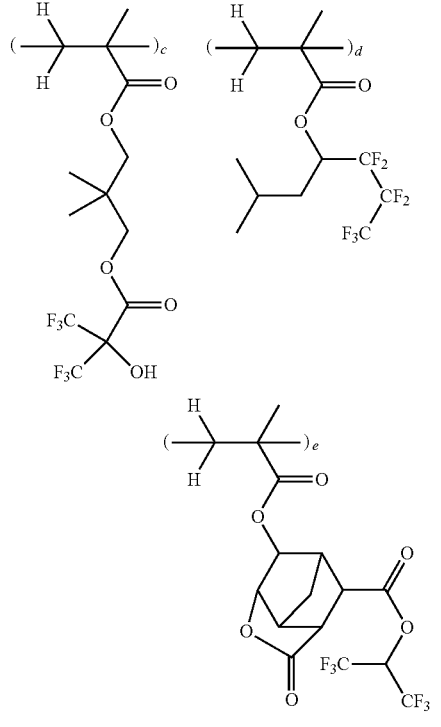
(c = 0.80, d = 0.10, e = 0.10, Mw = 10,000)
(c = 0.80, d = 0.10, e = 0.10, Mw = 9,900)

-continued
Polymer 15
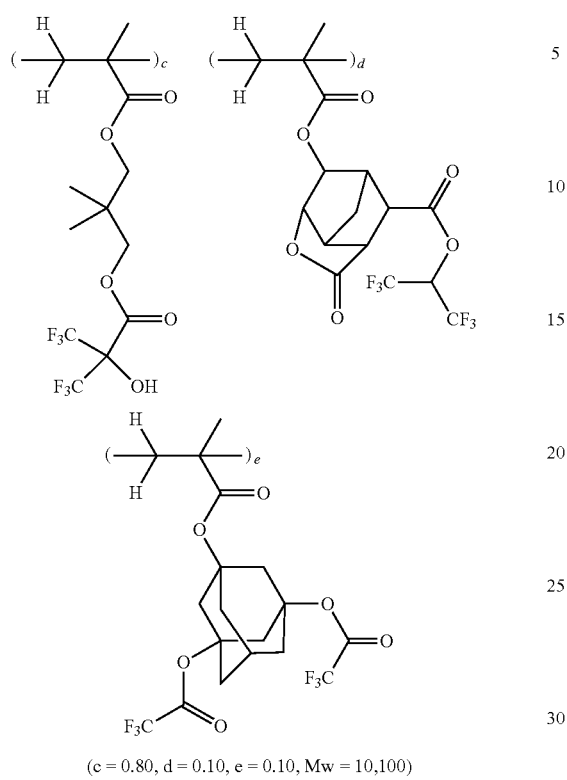
(c = 0.80, d = 0.10, e = 0.10, Mw = 10,100)
Polymer 16
Polymer 17
-continued
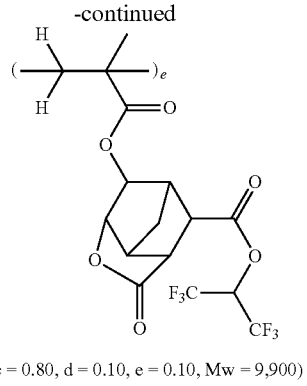
(c = 0.80, d = 0.10, e = 0.10, Mw = 9,900)
Polymer 18
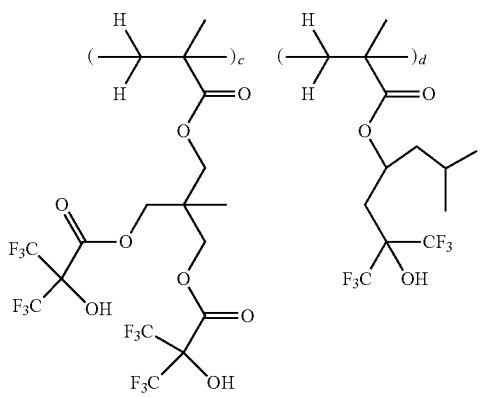
(c = 0.80, d = 0.10, e = 0.10, Mw = 10,900)
Polymer 19
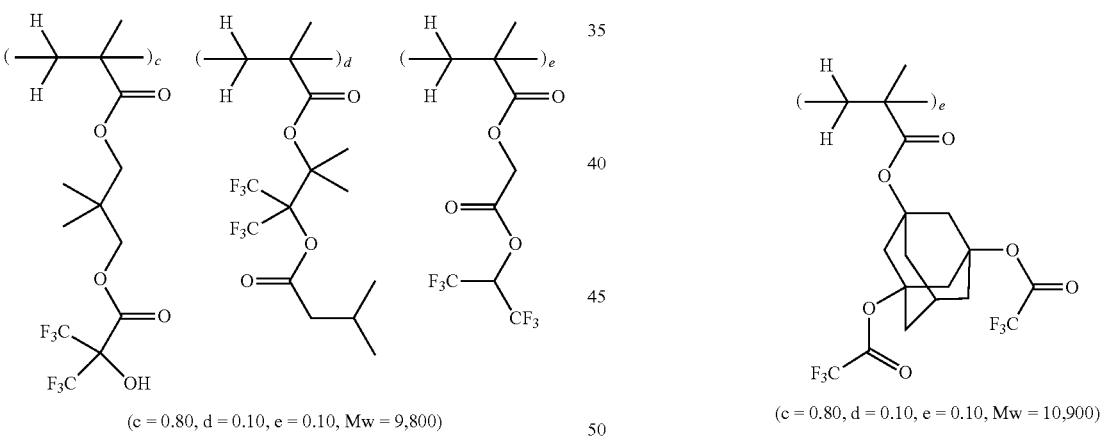
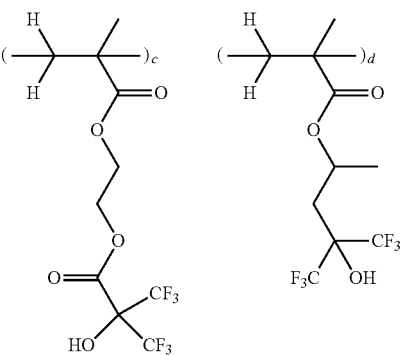

-continued
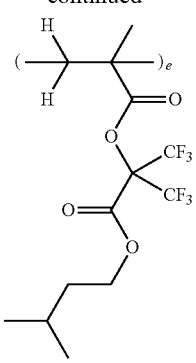
(c = 0.80, d = 0.10, e = 0.10, Mw = 9,700)
Polymer 20
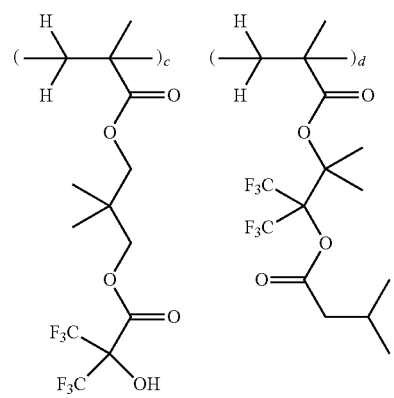
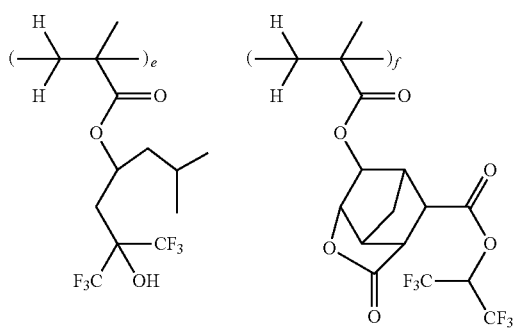
(c = 0.70, d = 0.10, e = 0.10, f = 0.10, Mw = 9,300)
Polymer 21
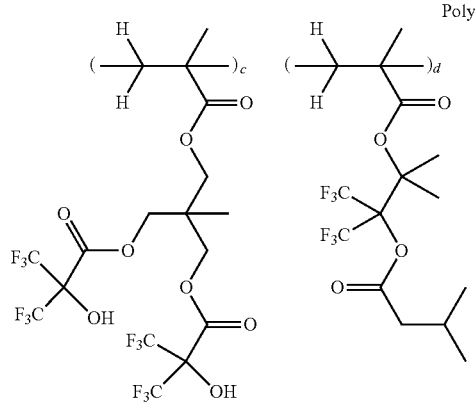
-continued
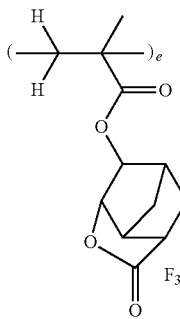
(c = 0.70, d = 0.10, e = 0.10, f = 0.10, Mw = 9,600)
Polymer 22
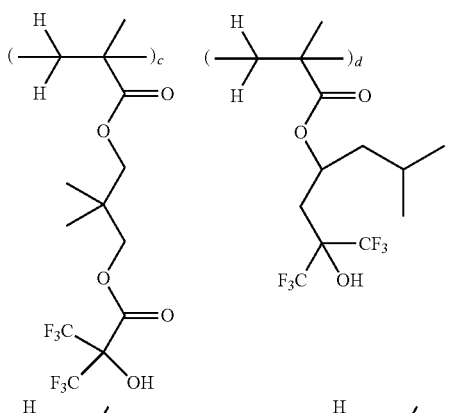
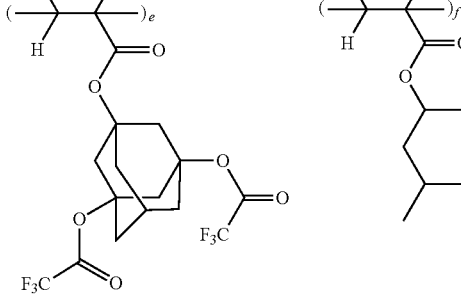
(c = 0.70, d = 0.10, e = 0.10, f = 0.10, Mw = 9,500)
Polymer 23
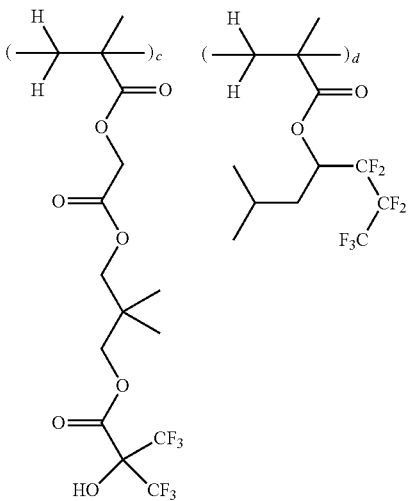
(c = 0.70, d = 0.30, Mw = 9,900)

Polymer 24

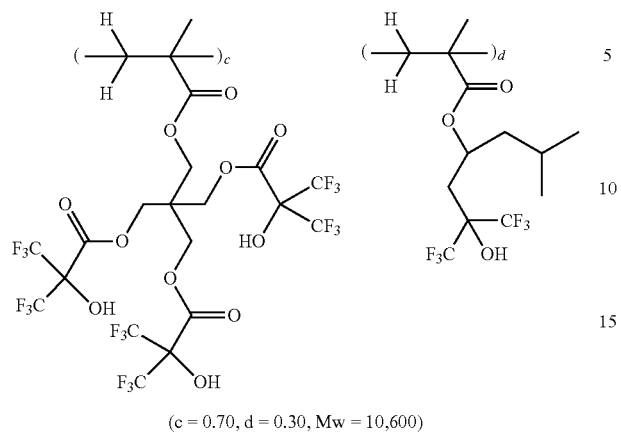

(c = 0.70, d = 0.30, Mw = 10,600)

Polymer 25

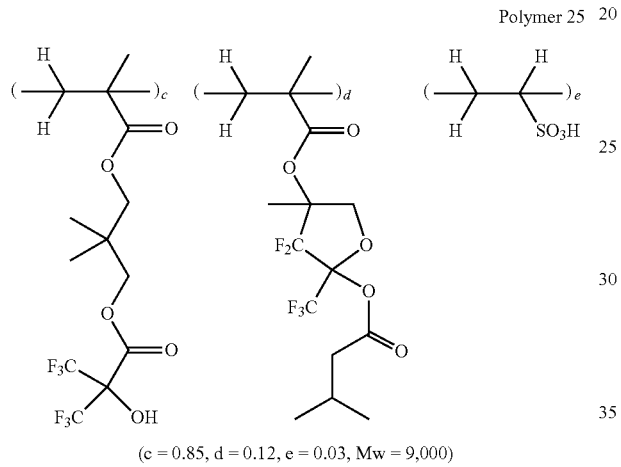

(c = 0.85, d = 0.12, e = 0.03, Mw = 9,000)

Polymer 26

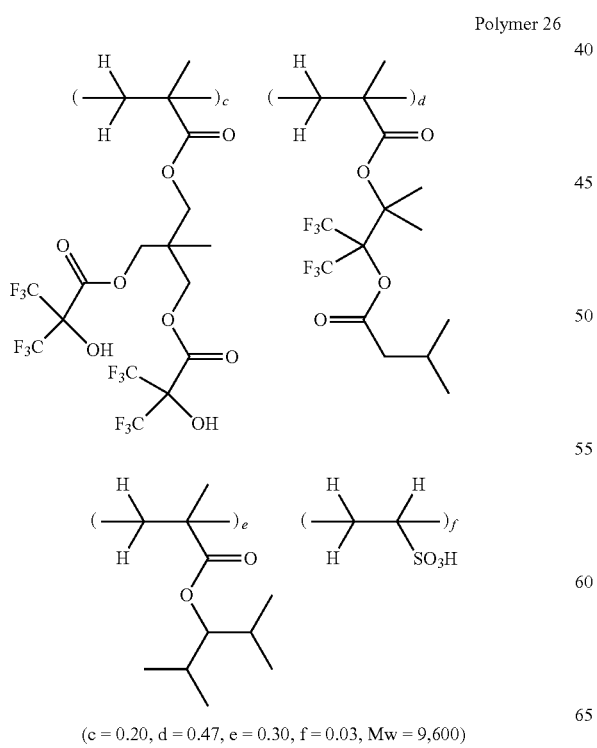

(c = 0.20, d = 0.47, e = 0.30, f = 0.03, Mw = 9,600)

Comparative Polymer 1

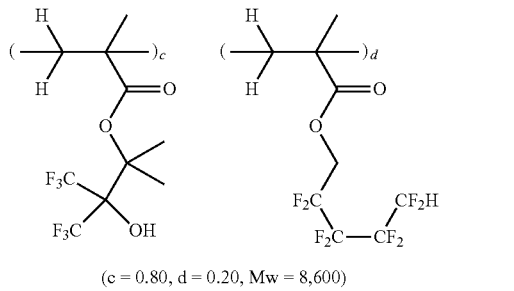

(c = 0.80, d = 0.20, Mw = 8,600)

Comparative Polymer 2

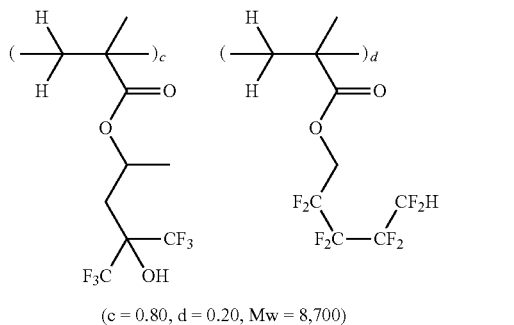

(c = 0.80, d = 0.20, Mw = 8,700)

Comparative Polymer 3

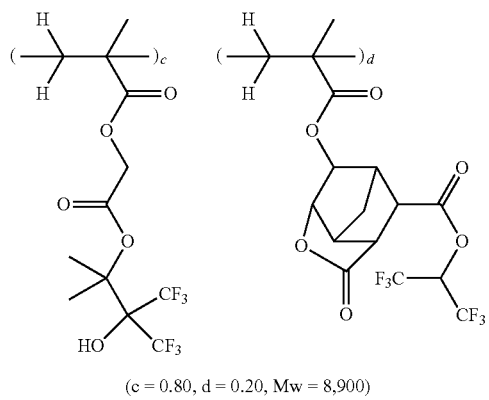

(c = 0.80, d = 0.20, Mw = 8,900)

Examples and Comparative Examples

Evaluation of Basic Functions of Protective Film

A resist protective film-forming solution (TC-1 to 26 and Comparative-TC-1 to 3) was prepared by dissolving 1.0 g (as solids) of a polymer (Polymers 1 to 26 and Comparative Polymers 1 to 3) in 42.0 g of a solvent mixture of diisopentyl ether and 2-methyl-1-butanol (weight ratio 92/8) and filtering through a Teflon® filter with a pore size of 0.1 µm.

The resist protective film-forming solution was spin coated onto a silicon substrate and baked at 90° C. for 60 seconds to form a protective film (TC-1 to 26 and Comparative TC-1 to 3) of 50 nm thick. The wafers coated with protective films were tested for the following properties:
(1) a refractive index at wavelength 193 nm using a spectroscopic ellipsometer of J. A. Woollam Co.,
(2) a film thickness change after rinsing with deionized water for 5 minutes,
(3) a film thickness change after development in 2.38 wt % TMAH aqueous solution, and (4) a sliding angle and a receding contact angle using the inclination contact angle meter Drop Master 500 (Kyowa Interface Science Co., Ltd.). The results are shown in Table 1.

TABLE 1

| Resist protective film-forming composition | Polymer in protective composition | Refractive index @193 nm | Film thickness change after water rinsing (nm) | Film thickness change after development (nm) | Sliding angle (°) | Receding contact angle (°) |
|---|---|---|---|---|---|---|
| TC-1 | Polymer 1 | 1.54 | 0 | 0 | 14 | 71 |
| TC-2 | Polymer 2 | 1.54 | 0 | 0 | 13 | 74 |
| TC-3 | Polymer 3 | 1.54 | 0 | 0 | 15 | 70 |
| TC-4 | Polymer 4 | 1.54 | 0 | 0 | 13 | 74 |
| TC-5 | Polymer 5 | 1.54 | 0 | 0 | 12 | 80 |
| TC-6 | Polymer 6 | 1.54 | 0 | 0 | 12 | 78 |
| TC-7 | Polymer 7 | 1.54 | 0 | 0 | 15 | 79 |
| TC-8 | Polymer 8 | 1.54 | 0 | 0 | 9 | 81 |
| TC-9 | Polymer 9 | 1.54 | 0 | 0 | 12 | 74 |
| TC-10 | Polymer 10 | 1.54 | 0 | 0 | 13 | 76 |
| TC-11 | Polymer 11 | 1.54 | 0 | 0 | 12 | 78 |
| TC-12 | Polymer 12 | 1.54 | 0 | 0 | 12 | 80 |
| TC-13 | Polymer 13 | 1.54 | 0 | 0 | 12 | 74 |
| TC-14 | Polymer 14 | 1.54 | 0 | 0 | 14 | 76 |
| TC-15 | Polymer 15 | 1.54 | 0 | 0 | 10 | 77 |
| TC-16 | Polymer 16 | 1.54 | 0 | 0 | 11 | 77 |
| TC-17 | Polymer 17 | 1.54 | 0 | 0 | 10 | 78 |
| TC-18 | Polymer 18 | 1.54 | 0 | 0 | 12 | 76 |
| TC-19 | Polymer 19 | 1.54 | 0 | 0 | 11 | 78 |
| TC-20 | Polymer 20 | 1.54 | 0 | 0 | 10 | 81 |
| TC-21 | Polymer 21 | 1.54 | 0 | 0 | 10 | 81 |
| TC-22 | Polymer 22 | 1.54 | 0 | 0 | 8 | 83 |
| TC-23 | Polymer 23 | 1.54 | 0 | 0 | 15 | 77 |
| TC-24 | Polymer 24 | 1.54 | 0 | 0 | 17 | 74 |
| TC-25 | Polymer 25 | 1.54 | 0 | 0 | 13 | 76 |
| TC-26 | Polymer 26 | 1.54 | 0 | 0 | 11 | 78 |
| Comparative TC-1 | Comparative Polymer 1 | 1.54 | 0 | 0 | 21 | 62 |
| Comparative TC-2 | Comparative Polymer 2 | 1.54 | 0 | 0 | 19 | 66 |
| Comparative TC-3 | Comparative Polymer 3 | 1.54 | 0 | 0 | 20 | 71 |

As mentioned above, a lower sliding angle indicates an easier flow of water on the protective film; and a higher receding contact angle indicates that fewer liquid droplets are left during high-speed scan exposure. It is seen from Table 1 that the protective films formed of the polymers within the scope of the invention show a lower sliding angle and a higher receding contact angle than those of the comparative polymers. No change of film thickness after water rinsing indicates that water does not penetrate into the protective film and that in the high-speed immersion lithography, the amount of water droplets remaining on the protective film is minimized. The fact that the film thickness after alkaline development is zero implies that the protective film can be removed in the developer after exposure.

Exposure Test

A resist solution was prepared by dissolving 5 g of Resist Polymer, 0.5 g of PAG1, and 0.1 g of Quencher 1, shown below, in 150 g of propylene glycol monoethyl ether acetate (PGMEA) and filtering through a Teflon® filter having a pore size of 0.1 μm.

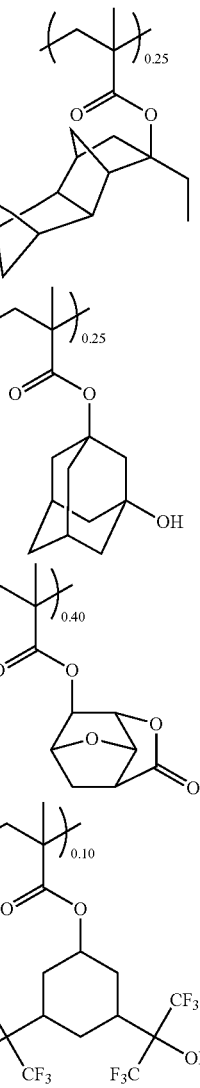

Resist Polymer: Mw = 7,600, Mw/Mn = 1.8

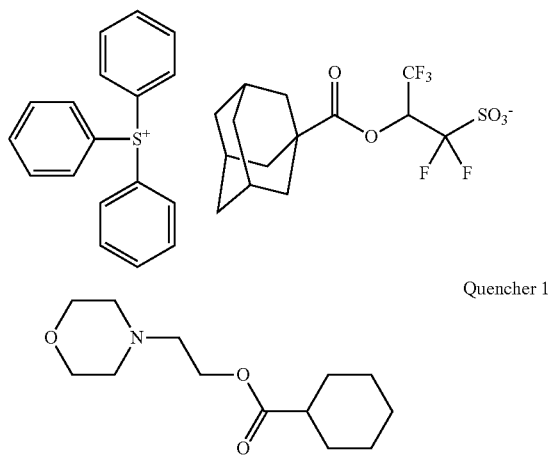

An antireflective coating ARC-29A (Nissan Chemical Industries Ltd.) was formed on a silicon substrate to a thickness of 100 nm. The resist solution was applied onto the ARC and baked at 105° C. for 60 seconds to form a resist film of 90 nm thick. The resist protective film-forming solution was applied onto the resist film and baked at 90° C. for 60 seconds. The resist film was exposed by the immersion lithography using ArF excimer laser scanner NSR-S610C (Nikon Corp., NA 1.30, cross-pole illumination, blade angle 70°, 6% halftone phase shift mask). The resist film was baked (PEB) at 100° C. for 60 seconds and developed in a 2.38 wt % TMAH aqueous solution for 60 seconds. The wafer was sectioned for comparing the profile of 50-nm line-and-space pattern and sensitivity. Further, 5 μl of water droplet was dropped on the resist film after development, and a contact angle at the interface between the resist and water droplet was measured. The results are shown in Table 2.

TABLE 2

| Protective film-forming composition | Sensitivity (mJ/cm²) | 50-nm pattern profile | Contact angle after development (°) |
|---|---|---|---|
| TC-1 (Polymer 1) | 30 | rectangular | 40 |
| TC-2 (Polymer 2) | 29 | rectangular | 41 |
| TC-3 (Polymer 3) | 29 | rectangular | 28 |
| TC-4 (Polymer 4) | 30 | rectangular | 35 |
| TC-5 (Polymer 5) | 30 | rectangular | 42 |
| TC-6 (Polymer 6) | 29 | rectangular | 45 |
| TC-7 (Polymer 7) | 29 | rectangular | 46 |
| TC-8 (Polymer 8) | 29 | rectangular | 32 |
| TC-9 (Polymer 9) | 30 | rectangular | 42 |
| Comparative TC-1 (Comparative Polymer 1) | 29 | rounded top | 41 |
| Comparative TC-2 (Comparative Polymer 2) | 28 | rounded top | 47 |
| Comparative TC-3 (Comparative Polymer 3) | 29 | rounded top | 32 |
| No protective film | 30 | T-top | 62 |

When the immersion lithography was carried out in the absence of a protective film, the pattern assumed a T-top profile. This is presumably because the acid generated was dissolved in water upon the immersion lithography. In the presence of a protective film according to the invention, the resist pattern after development was always of rectangular profile.

Evaluation of Development Defects

The protective film-forming solution used in the lithography test was precision filtered through a high-density polyethylene (HDPE) filter with a pore size of 0.02 μm. An antireflective coating ARC-29A (Nissan Chemical Industries Ltd.) of 100 nm thick was deposited on a 8-inch silicon substrate. The resist solution was applied onto the ARC and baked at 105° C. for 60 seconds to form a resist film of 90 nm thick. The protective film-forming solution was coated thereon and baked at 90° C. for 60 seconds to form a protective film. Using an ArF scanner model S307E (Nikon Corp., NA 0.85, σ 0.93, Cr mask), the entire surface of the wafer was subjected to checkered-flag exposure including alternate exposure of open-frame exposed and unexposed portions having an area of 20 mm square. This was followed by bake (PEB) and development in a 2.38 wt % TMAH aqueous solution for 60 seconds. Using a flaw detector Win-Win 50-1200 (Tokyo Seimitsu Co., Ltd.), the number of defects in the unexposed portion of the checkered-flag was counted at the pixel size of 0.125 μm. Defects on the resist surface in the unexposed portion are satellite spot defects and classified as blob defects. The results are shown in Table 3.

TABLE 3

| Protective film-forming composition | Number of defects |
|---|---|
| TC-1 | 19 |
| TC-2 | 18 |
| TC-3 | 22 |
| TC-4 | 17 |
| TC-5 | 17 |
| TC-6 | 18 |
| TC-7 | 17 |
| TC-8 | 16 |
| TC-9 | 18 |
| Comparative Polymer 1 | 60 |
| Comparative Polymer 2 | 200 |
| Comparative Polymer 3 | 400 |

It is evident from Table 3 that the resist protective film-forming composition using a polymer comprising recurring units of formula (1) is effective in reducing the number of defects as compared with the protective film-forming compositions of Comparative Examples.

EB Lithography

In an EB exposure test, a positive resist composition was prepared by dissolving 90 parts of EB Polymer synthesized by radical polymerization, shown below, 10 parts of PAG2, and 0.4 part of Quencher 2 in 700 parts of propylene glycol monomethyl ether acetate (PGMEA) and 300 parts of ethyl lactate (EL) and filtering through a HDPE filter with a pore size of 0.02 μm.

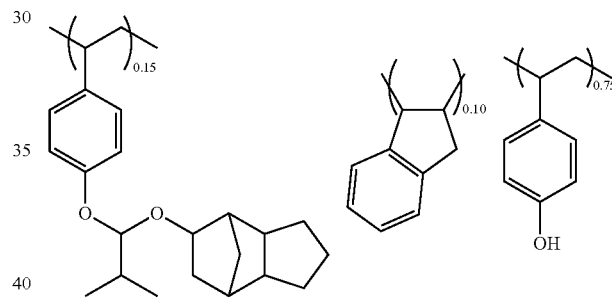

EB Polymer: Mw = 5,300, Mw/Mn = 1.6

PAG 2

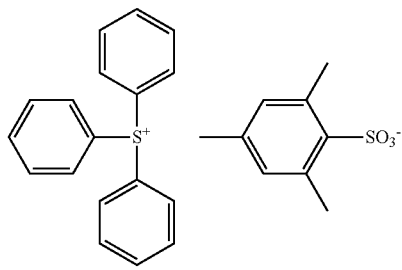

Quencher 2

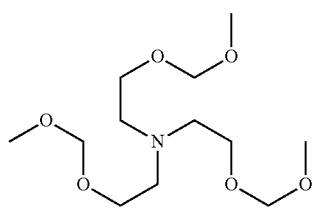

Using Clean Track Mark 5 (Tokyo Electron Ltd.), the positive resist composition was spin coated on a silicon substrate with a diameter of 6 inches (=150 mm) and prebaked on a hot plate at 110° C. for 60 seconds to form a resist film of 200 nm thick. A protective film-forming solution (TC-1 to 9) was coated thereon and baked at 100° C. for 60 seconds. Using HL-800D (Hitachi, Ltd.) at a HV voltage of 50 keV, imagewise exposure was performed on the resist film in a vacuum chamber. The resist film was then allowed to stand in the vacuum chamber for 20 hours, after which additional imagewise exposure was performed at a different area. Using Clean Track Mark 5 (Tokyo Electron Ltd.), immediately after the imagewise exposure, the resist film was baked (PEB) on a hot plate at 90° C. for 60 seconds and puddle developed in a 2.38 wt % TMAH aqueous solution for 30 seconds to form a positive pattern.

Using a measurement SEM S-7280 (Hitachi, Ltd.), a size change during the vacuum holding duration was determined. After an exposure dose which provided a 1:1 resolution at the top and bottom of a 0.12 μm line-and-space pattern was determined, a 0.12 μm line-and-space pattern at that exposure dose was measured for line width in both the initially exposed area and the 20 hour later exposed area. A difference therebetween is the size change. Positive values of size change indicate that the resist sensitivity varies toward a higher level during vacuum holding whereas negative values indicate that the sensitivity varies toward a lower level.

TABLE 4

| Protective film-forming composition | Size change (nm) |
|---|---|
| TC-1 | 0 |
| TC-2 | −1 |
| TC-3 | 0 |
| TC-4 | 0 |
| TC-5 | −1 |
| TC-6 | 0 |
| TC-7 | 0 |
| TC-8 | −1 |
| TC-9 | 0 |
| No protective film | −9 |

In the EB irradiation, the use of a resist protective film (TC-1 to 9) according to the invention improves the stability against dimensional change of a resist film during vacuum holding after irradiation.

Although particular embodiments of the invention have been described in detail for purposes of illustration, various modifications and equivalents may occur to skilled persons without departing from the spirit and scope of the invention. All such modifications and equivalents are believed to be within the spirit and scope of the invention as defined by the following claims.

Japanese Patent Application No. 2011-219950 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A resist protective film-forming composition comprising a polymer comprising recurring units of the general formula (1) and having a weight average molecular weight of 1,000 to 500,000,

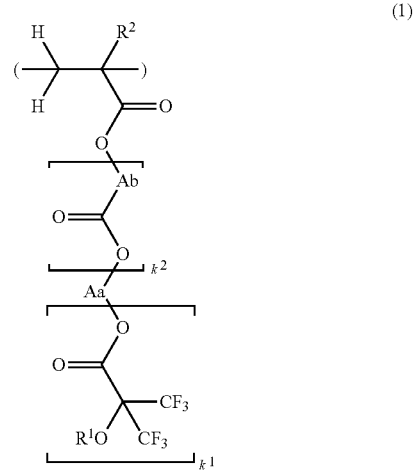

wherein $R^1$ is hydrogen or a straight, branched or cyclic $C_1$-$C_{20}$ monovalent hydrocarbon group in which a constituent moiety —$CH_2$— may be replaced by —O— or —C(=O)—, $R^2$ is hydrogen, fluorine, methyl or trifluoromethyl, Aa is a straight, branched or cyclic $C_1$-$C_{20}$ hydrocarbon or fluorinated hydrocarbon group having a valence of $k^1$+1, Ab is a straight, branched or cyclic $C_1$-$C_6$ divalent hydrocarbon group, $k^1$ is an integer of 1 to 3, and $k^2$ is 1.

2. The composition of claim 1 wherein the polymer comprises recurring units of formula (1) and recurring units of one or more type selected from the general formulae (2a) to (2m):

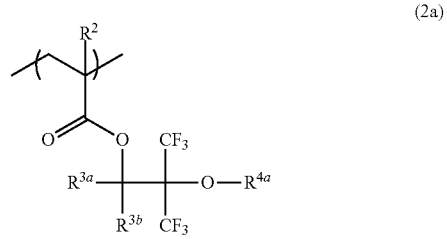

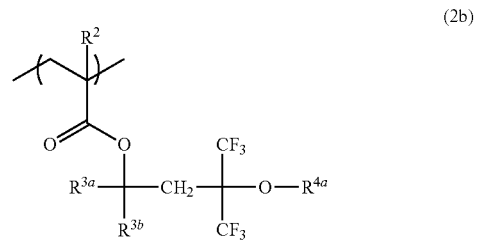

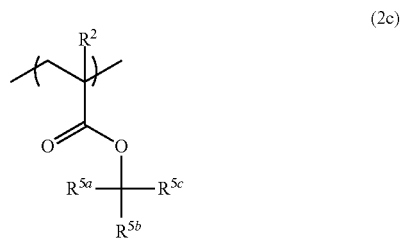

-continued
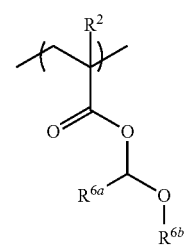
(2d)
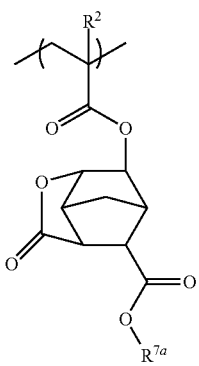
(2e)
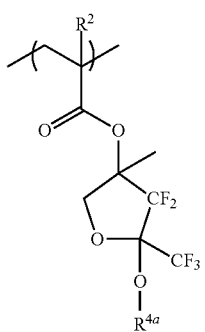
(2f)
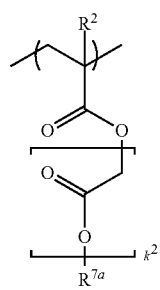
(2g)
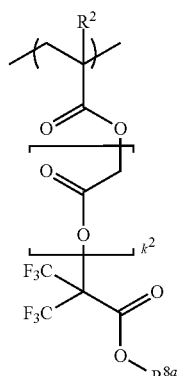
(2h)
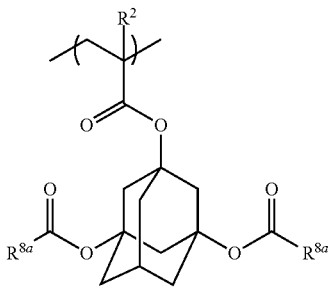
(2i)
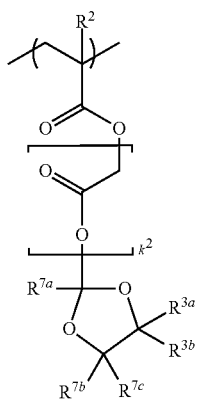
(2j)
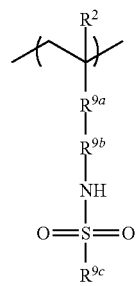
(2k)
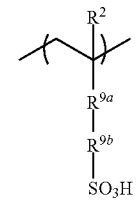
(2l)
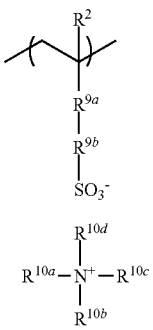
(2m)
wherein $R^2$ is as defined above, $R^{3a}$ and $R^{3b}$ are each independently hydrogen or a straight, branched or cyclic $C_1$-$C_{15}$ monovalent hydrocarbon group, $R^{3a}$ and $R^{3b}$ may bond together to form a non-aromatic ring of 3 to 8 carbon atoms with the carbon atom to which they are attached, $R^{4a}$ is hydrogen, a straight, branched or cyclic $C_1$-$C_{15}$ monovalent hydrocarbon or fluorinated hydrocarbon group, or an acid labile group, in the case of hydrocarbon group, a constituent moiety —$CH_2$— may be replaced by —O— or —C(=O)—, $R^{5a}$, $R^{5b}$ and $R^{5c}$ are each independently hydrogen, or a straight, branched or cyclic $C_1$-$C_{15}$ monovalent hydrocarbon or fluorinated hydrocarbon group, $R^{5a}$ and $R^{5b}$, $R^{5a}$ and $R^{5c}$, or $R^{5b}$ and $R^{5c}$ may bond together to form a non-aromatic ring of 3 to 8 carbon atoms with the carbon atom to which they are attached, $R^{6a}$ is hydrogen, or a straight, branched or cyclic $C_1$-$C_{15}$ monovalent hydrocarbon group, $R^{6b}$ is a straight, branched or cyclic $C_1$-$C_{15}$ monovalent hydrocarbon group, $R^{6a}$ and $R^{6b}$ may bond together to form a non-aromatic ring of 3 to 8 carbon atoms with the carbon atom to which they are attached, $R^{7a}$, $R^{7b}$ and $R^{7c}$ are each independently a straight, branched or cyclic $C_1$-$C_{15}$ monovalent fluorinated hydrocarbon group, $R^{8a}$ is a straight, branched or cyclic $C_1$-$C_{15}$ monovalent hydrocarbon or fluorinated hydrocarbon group, $R^{9a}$ is a single bond, a straight, branched or cyclic $C_1$-$C_{15}$ alkylene group, —C(=O)—O— or —C(=O)—NH—, $R^{9b}$ is a single bond or a straight, branched or cyclic $C_1$-$C_{15}$ alkylene group, $R^{9c}$ is a straight, branched or cyclic $C_1$-$C_{15}$ monovalent fluorinated hydrocarbon group, $R^{10a}$ to $R^{10d}$ are each independently hydrogen, a straight, branched or cyclic $C_1$-$C_{12}$ alkyl, alkenyl, oxoalkyl or oxoalkenyl group, $C_6$-$C_{20}$ aryl group, or $C_7$-$C_{12}$ aralkyl or aryloxoalkyl group, in which groups some or all hydrogen atoms may be substituted by alkoxy radicals, or which group may contain a nitrogen atom, ether, ester, hydroxyl or carboxyl radical, $R^{10a}$ and $R^{10b}$, or $R^{10a}$, $R^{10b}$ and $R^{10c}$ may bond together to form a $C_5$-$C_{10}$ ring with the nitrogen atom to which they are attached, and $R^{10a}$ and $R^{10b}$, or $R^{10a}$, $R^{10b}$ and $R^{10c}$ are an alkylene group when they form a ring with the nitrogen atom, and $k^2$ is 0 or 1.

3. The composition of claim 1, further comprising a solvent.

4. A resist protective film-forming composition comprising a polymer comprising recurring units of the general formula (1) and having a weight average molecular weight of 1,000 to 500,000,

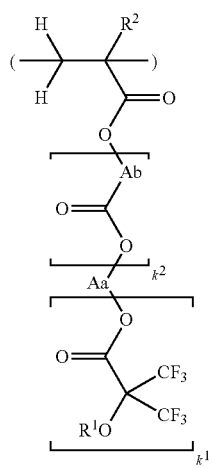

(1)

wherein $R^1$ is hydrogen or a straight, branched or cyclic $C_1$-$C_{20}$ monovalent hydrocarbon group in which a constituent moiety —$CH_2$— may be replaced by —O— or —C(=O)—, $R^2$ is hydrogen, fluorine, methyl or trifluoromethyl, Aa is a straight, branched or cyclic $C_1$-$C_{20}$ hydrocarbon or fluorinated hydrocarbon group having a valence of $k^1$+1, Ab is a straight, branched or cyclic $C_1$-$C_6$ divalent hydrocarbon group, $k^1$ is an integer of 2 or 3, and $k^2$ is 0 or 1.

5. The composition of claim 4 wherein the polymer comprises recurring units of formula (1) and recurring units of one or more type selected from the general formulae (2a) to (2m):

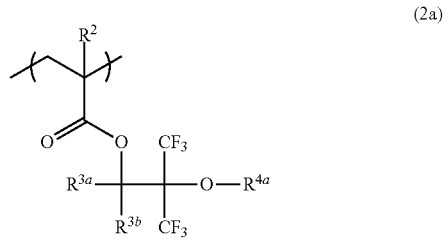

(2a)

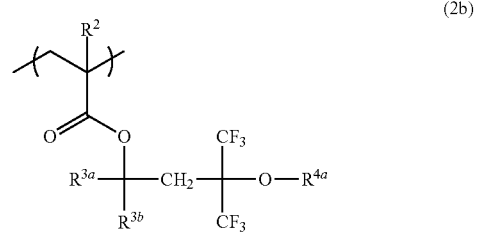

(2b)

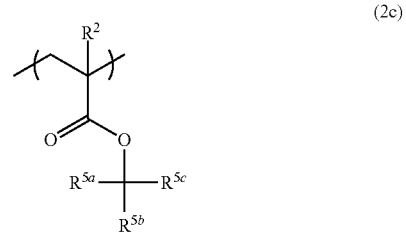

(2c)

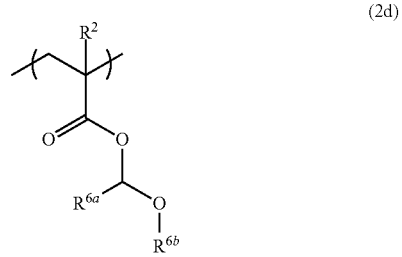

(2d)

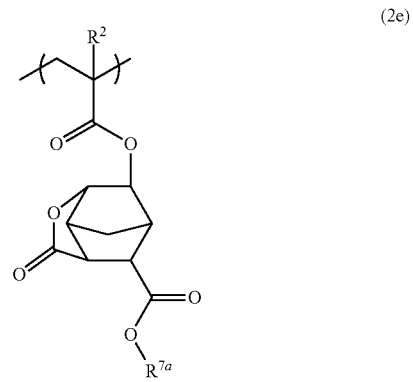

(2e)

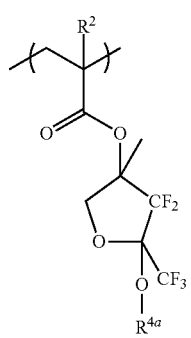
(2f)

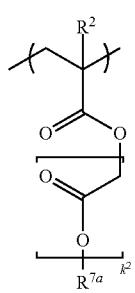
(2g)

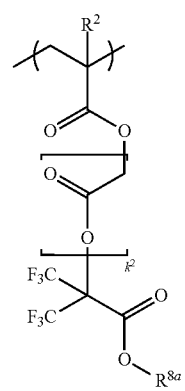
(2h)

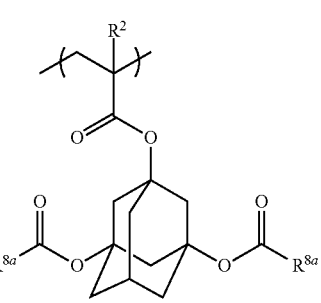
(2i)

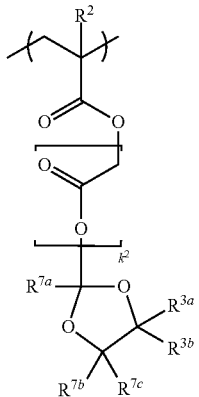
(2j)

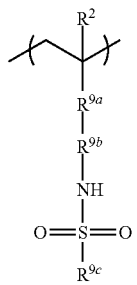
(2k)

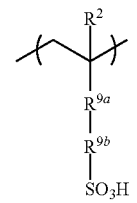
(2l)

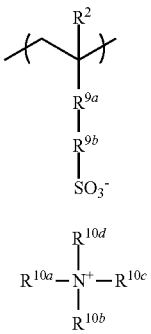
(2m)

wherein $R^2$ is as defined above, $R^{3a}$ and $R^{3b}$ are each independently hydrogen or a straight, branched or cyclic $C_1$-$C_{15}$ monovalent hydrocarbon group $R^{3a}$ and $R^{3b}$ may bond together to form a non-aromatic ring of 3 to 8 carbon atoms with the carbon atom to which they are attached, $R^{4a}$ is hydrogen, a straight, branched or cyclic $C_1$-$C_{15}$ monovalent hydrocarbon or fluorinated hydrocarbon group, or an acid labile group, in the case of hydrocarbon group, a constituent moiety —$CH_2$— may be replaced by —O— or —C(=O)—, $R^{5a}$, $R^{5b}$ and $R^{5c}$ a are each independently hydrogen, or a straight, branched or cyclic $C_1$-$C_{15}$ monovalent hydrocarbon or fluorinated hydrocarbon group, $R^{5a}$ and $R^{5b}$, $R^{5a}$ and $R^{5c}$, or $R^{5b}$ and $R^{5c}$ may bond together to form a non-aromatic ring of 3 to 8 carbon atoms with the carbon atom to which they are attached, $R^{6a}$ is hydrogen, or a straight, branched or cyclic $C_1$-$C_{15}$ monovalent hydrocarbon group, $R^{6b}$ is a straight, branched or cyclic $C_1$-$C_{15}$ monovalent hydrocarbon group, $R^{6a}$ and $R^{6b}$ may bond together to form a non-aromatic ring of 3 to 8 carbon atoms with the carbon atom to which they are attached, $R^{7a}$, $R^{7b}$ and $R^{7c}$ are each independently a straight, branched or cyclic $C_1$-$C_{15}$ monovalent fluorinated hydrocarbon group, $R^{8a}$ is a straight, branched or cyclic $C_1$-$C_{15}$ monovalent hydrocarbon or fluorinated hydrocarbon group, $R^{9a}$ is a single bond, a straight, branched or cyclic $C_1$-$C_{15}$ alkylene group, —C(=O)— or —C(=O)—NH—, $R^{9b}$ is a single bond or a straight, branched or cyclic $C_1$-$C_{15}$ alkylene group, $R^{9c}$ is a straight, branched or cyclic $C_1$-$C_{15}$ monovalent fluorinated hydrocarbon group, $R^{10a}$ to $R^{10d}$ are each independently hydrogen, a straight, branched or cyclic $C_1$-$C_{12}$ alkyl, alkenyl, oxoalkyl or oxoalkenyl group, $C_6$-$C_{20}$ aryl group, or $C_7$-$C_{12}$ aralkyl or aryloxoalkyl group, in which groups some or all hydrogen atoms may be substituted by alkoxy radicals, or which group may contain a nitrogen atom, ether, ester, hydroxyl or carboxyl radical, $R^{10a}$ and $R^{10b}$, $R_{10a}$, or $R^{10b}$ $R^{10c}$ may bond together to form a $C_5$-$C_{10}$ ring with the nitrogen atom to which they are attached, and $R^{10a}$ and $R^{10b}$, or $R^{10a}$, $R^{10b}$ and $R^{10c}$ each are an alkylene group when they form a ring with the nitrogen atom, and $k^2$ is 0 or 1.

6. The composition of claim 4, further comprising a solvent.

7. A resist protective film-forming composition comprising a polymer comprising recurring units of the general formula (1), and recurring units of the general formula ($2c^1$), and having a weight average molecular weight of 1,000 to 500,000,

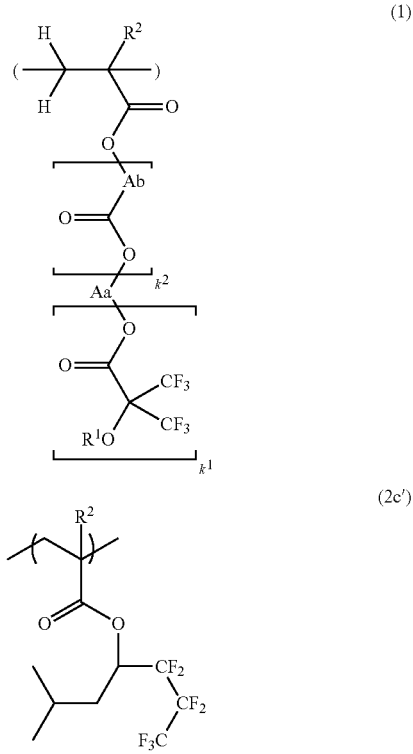

wherein $R^1$ is hydrogen or a straight, branched or cyclic $C_1$-$C_{20}$ monovalent hydrocarbon group in which a constituent moiety —$CH_2$— may be replaced by —O— or —C(=O)—, $R^2$ is hydrogen, fluorine, methyl or trifluoromethyl, Aa is a straight, branched or cyclic $C_1$-$C_{20}$ hydrocarbon or fluorinated hydrocarbon group having a valence of $k^1$+1, Ab is a straight, branched or cyclic $C_1$-$C_6$ divalent hydrocarbon group, $k^1$ is 1, and $k^2$ is 0.

8. The composition of claim 7, further comprising a solvent.

9. The composition of claim 8 wherein the solvent comprises an ether compound of 8 to 12 carbon atoms.

10. The composition of claim 9 wherein the solvent comprises at least one ether compound selected from the group consisting of di-n-butyl ether, di-sec-butyl ether, di-tert-butyl ether, diisobutyl ether, di-n-pentyl ether, di-sec-pentyl ether, diisopentyl ether, and di-n-hexyl ether and mixtures thereof.

11. The composition of claim 10 wherein the solvent is a mixture of the at least one ether compound and at least one alcohol compound, the alcohol compound being selected from the group consisting of 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, and cyclohexanol and mixtures thereof.

12. A lithography process for forming a pattern, comprising the steps of forming a protective film on a photoresist layer disposed on a mask blank, exposing the layer structure in vacuum to electron beam, and developing, the protective film being formed of the protective film-forming composition of claim 7.

13. A pattern forming process comprising the steps of (1) applying a resist composition onto a substrate to form a resist film, (2) forming a protective film on the resist film using the protective film-forming composition of claim 7, (3) heat treating and exposing the coated substrate to high-energy radiation through a photomask, and (4) developing in a developer.

14. The process of claim 13 wherein the high-energy radiation has a wavelength in the range of 180 to 250 nm.

15. The process of claim 13 wherein the developing step (4) includes developing in an alkaline developer to form a resist pattern in the resist film and to remove the protective film on the resist film.

16. A pattern forming process comprising the steps of (1) applying a resist composition onto a substrate to form a resist film, (2) forming a protective film on the resist film using the protective film-forming composition of claim 7, (3) heat treating and exposing the coated substrate to high-energy radiation from a projection lens through a photomask while holding a liquid between the substrate and the projection lens, and (4) developing in a developer.

17. The process of claim 16 wherein the liquid is water.

* * * * *